United States Patent
Utsumi et al.

(10) Patent No.: US 8,252,509 B2
(45) Date of Patent: Aug. 28, 2012

(54) RESIST COMPOSITION AND METHOD OF FORMING RESIST PATTERN

(75) Inventors: Yoshiyuki Utsumi, Kawasaki (JP); Takehiro Seshimo, Kawasaki (JP); Hiroaki Shimizu, Kawasaki (JP); Naoto Motoike, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 177 days.

(21) Appl. No.: 12/861,474

(22) Filed: Aug. 23, 2010

(65) Prior Publication Data
US 2011/0117491 A1    May 19, 2011

(30) Foreign Application Priority Data
Sep. 3, 2009 (JP) .................... 2009-204132

(51) Int. Cl.
G03F 7/004 (2006.01)
G03F 7/028 (2006.01)
G03F 7/039 (2006.01)
G03F 7/26 (2006.01)

(52) U.S. Cl. .................... 430/270.1; 430/326

(58) Field of Classification Search ........... 430/270.1, 430/326, 910
See application file for complete search history.

(56) References Cited

U.S. PATENT DOCUMENTS

| | | | |
|---|---|---|---|
| 5,580,695 A | 12/1996 | Murata et al. | |
| 5,945,517 A | 8/1999 | Nitta et al. | |
| 5,968,712 A | 10/1999 | Thackeray et al. | |
| 6,153,733 A | 11/2000 | Yukawa et al. | |
| 6,444,397 B2 | 9/2002 | Hada et al. | |
| 6,623,907 B2 | 9/2003 | Numata et al. | |
| 6,692,897 B2 * | 2/2004 | Fujimori et al. | 430/282.1 |
| 6,949,325 B2 | 9/2005 | Li et al. | |
| 7,074,543 B2 | 7/2006 | Iwai et al. | |
| 7,132,218 B2 * | 11/2006 | Toishi et al. | 430/270.1 |
| 2010/0075249 A1 | 3/2010 | Utsumi et al. | |

FOREIGN PATENT DOCUMENTS

| | | |
|---|---|---|
| JP | A-H05-232706 | 9/1993 |
| JP | A-H05-249662 | 9/1993 |
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | 2000-206694 | 7/2000 |
| JP | A-2001-166476 | 6/2001 |
| JP | A-2001-215689 | 8/2001 |
| JP | 2003-241385 | 8/2003 |
| JP | 2005-336452 | 12/2005 |
| JP | 2006-259582 | 9/2006 |
| JP | 2006-317803 | 11/2006 |
| JP | A-2008-134607 | 6/2008 |
| WO | WO 2004/074242 | 9/2004 |

* cited by examiner

*Primary Examiner* — Anca Eoff
(74) *Attorney, Agent, or Firm* — Knobbe Martens Olson & Bear LLP

(57) ABSTRACT

A resist composition including a base material component (A) that exhibits changed solubility in an alkali developing solution under the action of acid, an acid generator component (B) that generates acid upon exposure, and an nitrogen-containing organic compound (D), wherein the nitrogen-containing organic compound (D) includes a compound represented by general formula (d1) shown below:

[Chemical Formula 1]

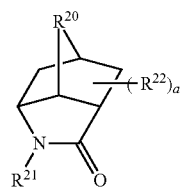

(d1)

wherein $R^{20}$ represents a methylene group, an ethylene group, an oxygen atom or $-C(CH_3)_2-$; $R^{21}$ represents a hydrogen atom or an organic group; and $R^{22}$ represents an alkoxy group, an alkoxycarbonyloxy group, a hydroxyl group, a halogen atom, $-C(=O)-O-R^{23}$, $-C(=O)-NH-R^{23}$ or a carboxyl group, wherein $R^{23}$ represents a linear or branched alkyl group of 1 to 15 carbon atoms, an unsaturated hydrocarbon group, an aliphatic cyclic group, or an aromatic hydrocarbon group, and a represents an integer of 0 to 2.

7 Claims, No Drawings

RESIST COMPOSITION AND METHOD OF FORMING RESIST PATTERN

BACKGROUND OF THE INVENTION

1. Field of the Invention

The present invention relates to a resist composition, and a method of forming a resist pattern that uses the resist composition.

Priority is claimed on Japanese Patent Application No. 2009-204132, filed Sep. 3, 2009, the content of which is incorporated herein by reference.

2. Description of the Related Art

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are now starting to be introduced in mass production. Furthermore, research is also being conducted into lithography techniques that use exposure light source having a wavelength shorter than these excimer lasers, such as $F_2$ excimer lasers, electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources.

As a resist material which satisfies these conditions, a chemically amplified resist composition is used, which includes a base material component that exhibits a changed solubility in an alkali developing solution under the action of acid and an acid generator that generates acid upon exposure.

For example, as a positive chemically amplified resist composition, a composition containing a resin component (a base resin) that exhibits increased solubility in an alkali developing solution under the action of acid and an acid generator component is commonly used. If the resist film formed using the resist composition is selectively exposed during formation of a resist pattern, then within the exposed portions, acid is generated from the acid generator, and the action of this acid causes an increase in the solubility of the resin component in an alkali developing solution, making the exposed portions soluble in the alkali developing solution.

Resins that contain structural units derived from (meth) acrylate esters within the main chain (acrylic resins) are now widely used as base resins for resists that use ArF excimer laser lithography, as they exhibit excellent transparency in the vicinity of 193 nm (for example, refer to Patent Document 1). Here, the term "(meth)acrylic acid" is a generic term that includes either or both of acrylic acid having a hydrogen atom bonded to the α-position and methacrylic acid having a methyl group bonded to the α-position. The term "(meth) acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position.

Further, other than the base resin and acid generator, a nitrogen-containing organic compound such as an alkylamine and an alkylalcoholamine has been currently blended into the chemically amplified resist (for example, refer to Patent Documents 2 and 3). The nitrogen-containing organic compound acts as a quencher which traps the acid generated from the acid generator, thereby contributing to improvement in various lithography properties such as a resist pattern shape.

[Documents of Related Art]
[Patent Documents]
[Patent Document 1] Japanese Unexamined Patent Application, First Publication No. 2003-241385
[Patent Document 2] Japanese Unexamined Patent Application, First Publication No. Hei 5-249662
[Patent Document 3] Japanese Unexamined Patent Application, First Publication No. Hei 5-232706
[Patent Document 4] Japanese Unexamined Patent Application, First Publication No. 2001-166476
[Patent Document 5] Japanese Unexamined Patent Application, First Publication No. 2001-215689

SUMMARY OF THE INVENTION

Problems to be Solved by the Invention

As further progress is made in lithography techniques and the application field for lithography techniques expands, the development of a novel material for use in lithography applications will be desired. For example, as miniaturization of resist patterns progress, improvement with respect to various lithography properties such as line width roughness (LWR) and critical dimension uniformity (CDU), and a favorable pattern shape (for example, a favorable rectangularity in the case of a line pattern and a favorable circularity in the case of a hole pattern) will be demanded for resist materials.

In general, tertiary amines are widely used as the nitrogen-containing organic compounds such as those described above. However, when a conventional tertiary amine is used as a quencher, although the effects such as the control of acid diffusion from the exposed region to the unexposed region and the environmental resistance can be achieved, because the levels of its nucleophilicity and basicity are too high, the tertiary amine reacts with, and causing the degradation of, an ester bond portion within the acid generator or base material component contained in the resist composition. Therefore, the storage stability is impaired and the lithography properties are also deteriorated. Furthermore, although the resist compositions using the nitrogen-containing organic compounds as described in Patent Documents 4 and 5 have been disclosed in recent years, the resist compositions described in these documents were still unsatisfactory in view of the lithography properties.

The present invention takes the above circumstances into consideration, with an object of providing a resist composition that yields superior lithography properties and the shape of the resist pattern formed therefrom is also favorable, and a method of forming a resist pattern that uses the resist composition.

Means for Solving the Problems

As a result of intensive and extensive investigation, the inventors of the present invention discovered that the object described above could be achieved, and they were therefore able to complete the present invention.

In other words, a first aspect of the present invention is a resist composition including a base material component (A) that exhibits changed solubility in an alkali developing solution under the action of acid, an acid generator component (B) that generates acid upon exposure, and an nitrogen-containing organic compound (D), wherein the nitrogen-containing organic compound (D) includes a compound represented by general formula (d1) shown below.

[Chemical Formula 1]

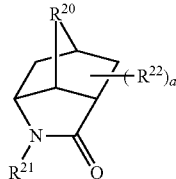

(d1)

[In the formula, $R^{20}$ represents a methylene group, an ethylene group, an oxygen atom or —C(CH$_3$)$_2$—; $R^{21}$ represents a hydrogen atom or an organic group; and $R^{22}$ represents an alkoxy group, an alkoxycarbonyloxy group, a hydroxyl group, a halogen atom, —C(=O)—O—R$^{23}$, —C(=O)—NH—R$^{23}$ or a carboxyl group, wherein $R^{23}$ represents a linear or branched alkyl group of 1 to 15 carbon atoms, an unsaturated hydrocarbon group, an aliphatic cyclic group, or an aromatic hydrocarbon group, and a represents an integer of 0 to 2.]

A second aspect of the present invention is a method of forming a resist pattern, including: applying a resist composition of the first aspect to a substrate to form a resist film on the substrate; subjecting the resist film to exposure; and subjecting the resist film to alkali developing to form a resist pattern.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon groups, unless otherwise specified. The same applies for the alkyl group within an alkoxy group.

The term "alkylene group" includes linear, branched or cyclic divalent saturated hydrocarbon groups, unless otherwise specified. A "halogenated alkyl group" is a group in which a part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (namely, a resin, a polymer or a copolymer).

The term "structural unit derived from an acrylate ester" refers to a structural unit that is formed by the cleavage of the ethylenic double bond of an acrylate ester.

The term "acrylate ester" is a generic term that includes acrylate esters having a hydrogen atom bonded to the carbon atom on the α-position, and acrylate esters having a substituent (an atom other than a hydrogen atom or a group) bonded to the carbon atom on the α-position. Examples of the substituent bonded to the carbon atom on the α-position include an alkyl group of 1 to 5 carbon atoms, a halogenated alkyl group of 1 to 5 carbon atoms and a hydroxyalkyl group. With respect to the expression "a carbon atom on the α-position of an acrylate ester" refers to the carbon atom having the carbonyl group bonded thereto, unless specified otherwise.

With respect to the acrylate ester, specific examples of the alkyl group of 1 to 5 carbon atoms for the substituent at the α-position include linear or branched alkyl groups of 1 to 5 carbon atoms such as a methyl group, an ethyl group, a propyl group, an isopropyl group, an n-butyl group, an isobutyl group, a tert-butyl group, a pentyl group, an isopentyl group, and a neopentyl group.

Further, specific examples of the halogenated alkyl group of 1 to 5 carbon atoms include groups in which some or all of the hydrogen atoms of the aforementioned "alkyl group of 1 to 5 carbon atoms for the substituent at the α-position" have been substituted with halogen atoms. Examples of the halogen atom include a fluorine atom, a chlorine atom, a bromine atom and an iodine atom, and a fluorine atom is particularly desirable.

In the present invention, it is preferable that a hydrogen atom, an alkyl group of 1 to 5 carbon atoms or a halogenated alkyl group of 1 to 5 carbon atoms is bonded to the α-position of the acrylate ester, more preferably a hydrogen atom, an alkyl group of 1 to 5 carbon atoms or a fluorinated alkyl group of 1 to 5 carbon atoms. In terms of industrial availability, a hydrogen atom or a methyl group is particularly desirable.

The term "exposure" is used as a general concept that includes irradiation with any form of radiation.

Effects of the Invention

According to the present invention, there are provided a resist composition that yields superior lithography properties and the shape of the resist pattern formed therefrom is also favorable, and a method of forming a resist pattern that uses the resist composition.

DETAILED DESCRIPTION OF THE INVENTION

<<Resist Composition>>

A resist composition according to the present invention includes a base material component (A) (hereafter, referred to as "component (A)") which exhibits changed solubility in an alkali developing solution under the action of acid, an acid generator component (B) (hereafter, referred to as "component (B)") which generates acid upon exposure, and a nitrogen-containing organic compound component (D) (hereafter referred to as "component (D)").

With respect to a resist film formed using the resist composition, when a selective exposure is conducted during formation of a resist pattern, acid is generated from the component (B), and the generated acid acts on the component (A) to change the solubility of the component (A) in an alkali developing solution. As a result, the solubility of the exposed portions in an alkali developing solution is changed, whereas the solubility of the unexposed portions in an alkali developing solution remains unchanged. Therefore, the exposed portions are dissolved and removed by alkali developing in the case of a positive resist composition, whereas unexposed portions are dissolved and removed in the case of a negative resist composition, and hence, a resist pattern can be formed.

The resist composition of the present invention may be either a negative resist composition or a positive resist composition.

<Component (A)>

As the component (A), an organic compound typically used as a base material component for a chemically amplified resist composition can be used alone, or two or more of such organic compounds can be mixed together.

The term "base material component" refers to an organic compound capable of forming a film.

Generally, as the component (A), an organic compound having a molecular weight of 500 or more is used. When the organic compound has a molecular weight of 500 or more, the film-forming ability is satisfactory, and a resist pattern of nano level can be easily formed.

The "organic compound having a molecular weight of 500 or more" is broadly classified into non-polymers and polymers.

In general, as a non-polymer, any of those which have a molecular weight in the range of 500 to less than 4,000 is used. Hereafter, the term "low molecular weight compound" refers to a non-polymer having a molecular weight in the range of 500 to less than 4,000.

In general, as a polymer, any of those which have a molecular weight of 1,000 or more is used. Hereafter, the term "resin" refers to a polymer having a molecular weight of 1,000 or more. With respect to the aforementioned resin, the "molecular weight" is the polystyrene equivalent weight average molecular weight determined by gel permeation chromatography (GPC).

As the component (A), a resin may be used or a low molecular compound may be used, or these types of compounds may be used in combination.

When the resist composition of the present invention is a negative resist composition, for example, as the component (A), a base material component that is soluble in an alkali developing solution is used, and a cross-linking agent is further blended therein.

In the negative resist composition, when acid is generated from the component (B) upon exposure, the action of the generated acid causes cross-linking between the base material component and the cross-linking agent, and the cross-linked portion becomes insoluble in an alkali developing solution. As a result, in the formation of a resist pattern, by conducting selective exposure of a resist film formed by applying the negative resist composition onto a substrate, the exposed portions become insoluble in an alkali developing solution, whereas the unexposed portions remain soluble in an alkali developing solution, and hence, a resist pattern can be formed by alkali developing.

Generally, as the component (A) for a negative resist composition, a resin that is soluble in an alkali developing solution (hereafter, referred to as an "alkali-soluble resin") is used.

As the alkali-soluble resin, it is preferable to use a resin having a structural unit derived from at least one of α-(hydroxyalkyl)acrylic acid and an alkyl ester (preferably an alkyl ester of 1 to 5 carbon atoms) of α-(hydroxyalkyl)acrylic acid as disclosed in Japanese Unexamined Patent Application, First Publication No. 2000-206694; a (meth)acrylic resin having a sulfone amide group or a polycycloolefin resin as disclosed in U.S. Pat. No. 6,949,325; a (meth)acrylic resin having a fluorinated alcohol as disclosed in U.S. Pat. No. 6,949,325, Japanese Unexamined Patent Application, First Publication No. 2005-336452 or 2006-317803; or a polycycloolefin resin having a fluorinated alcohol as disclosed in Japanese Unexamined Patent Application, First Publication No. 2006-259582, as it enables formation of a satisfactory resist pattern with minimal swelling. Here, the term "α-(hydroxyalkyl)acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (preferably a hydroxyalkyl group of 1 to 5 carbon atoms) is bonded to the carbon atom on the α-position.

As the cross-linking agent, typically, an amino-based cross-linking agent such as a glycoluril having a methylol group or alkoxymethyl group or a melamine-based cross-linking agent is preferable, as it enables formation of a resist pattern with minimal swelling. The amount of the cross-linking agent added is preferably within the range from 1 to 50 parts by weight, relative to 100 parts by weight of the alkali-soluble resin.

When the resist composition of the present invention is a positive resist composition, as the component (A), a base material component that exhibits increased solubility in an alkali developing solution under the action of acid is used. More specifically, the base material component is substantially insoluble in an alkali developing solution prior to exposure, but when acid is generated from the component (B) upon exposure, the action of this acid causes an increase in the solubility of the base material component in an alkali developing solution. Therefore, in the formation of a resist pattern, by conducting selective exposure of a resist film formed by applying the positive resist composition onto a substrate, the exposed portions changes from an insoluble state to a soluble state in an alkali developing solution, whereas the unexposed portions remain insoluble in an alkali developing solution, and hence, a resist pattern can be formed by alkali developing.

In the resist composition of the present invention, the component (A) is preferably a base material component that exhibits increased solubility in an alkali developing solution under the action of acid. That is, the resist composition of the present invention is preferably a positive resist composition.

The component (A) may be a resin component (A1) which exhibits increased solubility in an alkali developing solution under action of acid (hereafter, referred to as "component (A1)"), a low molecular weight compound (A2) which exhibits increased solubility in an alkali developing solution under action of acid (hereafter, referred to as "component (A2)"), or a mixture of the component (A1) and the component (A2). Of the various possibilities, the component (A) preferably includes the component (A1).

[Component (A1)]

As the component (A1), a resin component (base resin) typically used as a base material component for a chemically amplified resist composition can be used alone, or two or more of such resin components can be mixed together.

In the present invention, it is preferable that the component (A1) include a structural unit derived from an acrylate ester.

In the resist composition of the present invention, it is particularly desirable that the component (A1) have a structural unit (a1) derived from an acrylate ester containing an acid dissociable, dissolution inhibiting group.

Further, it is preferable that the component (A1) have a structural unit (a2) derived from an acrylate ester containing a lactone-containing cyclic group, as well as the structural unit (a1).

Additionally, it is preferable that the component (A1) have a structural unit (a3) derived from an acrylate ester containing a polar group-containing aliphatic hydrocarbon group, as well as the structural unit (a1), or the structural unit (a1) and the structural unit (a2).

Moreover, it is preferable that the component (A1) have a structural unit (a5) derived from an acrylate ester containing a sultone structure within the side chain thereof.

Furthermore, the component (A1) may have a structural unit (a6) derived from hydroxystyrene.

In addition, the component (A1) may have a structural unit (a7) derived from styrene.

Further, the component (A1) may include a structural unit (a8) derived from a hydroxystyrene in which at least a portion of the hydroxyl group hydrogen atoms have been protected with substituents.

(Structural Unit (a1))

The structural unit (a1) is a structural unit derived from an acrylate ester containing an acid dissociable, dissolution inhibiting group.

As the acid dissociable, dissolution inhibiting group within the structural unit (a1), any of the groups that have been proposed as acid dissociable, dissolution inhibiting groups for the base resins of chemically amplified resists can be used, provided the group has an alkali dissolution inhibiting effect that renders the entire component (A1) insoluble in an alkali developing solution prior to dissociation, and then following dissociation under action of acid, increases the solubility of the entire component (A1) in the alkali developing solution. Generally, groups that form either a cyclic or chain-like tertiary alkyl ester with the carboxyl group of the (meth)acrylic acid, and acetal-type acid dissociable, dissolution inhibiting groups such as alkoxyalkyl groups are widely known.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

In the present description and claims, the term "aliphatic branched" refers to a branched structure having no aromaticity.

The "aliphatic branched, acid dissociable, dissolution inhibiting group" is not limited to be constituted of only carbon atoms and hydrogen atoms (not limited to hydrocarbon groups), but is preferably a hydrocarbon group.

Further, the "hydrocarbon group" may be either saturated or unsaturated, but is preferably saturated.

Examples of aliphatic branched, acid dissociable, dissolution inhibiting groups include tertiary alkyl groups of 4 to 8 carbon atoms, and specific examples include a tert-butyl group, a tert-pentyl group and a tert-heptyl group.

The term "aliphatic cyclic group" refers to a monocyclic group or polycyclic group that has no aromaticity.

The "aliphatic cyclic group" within the structural unit (a1) may or may not have a sub stituent. Examples of sub stituents include an alkyl group of 1 to 5 carbon atoms, an alkoxy group of 1 to 5 carbon atoms, a fluorine atom, a fluorinated alkyl group of 1 to 5 carbon atoms which is substituted by a fluorine atom, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but is preferably saturated. Furthermore, the "aliphatic cyclic group" is preferably a polycyclic group.

As such aliphatic cyclic groups, for example, groups in which one or more hydrogen atoms have been removed from a monocycloalkane or a polycycloalkane such as a bicycloalkane, tricycloalkane or tetracycloalkane which may or may not be substituted with an alkyl group of 1 to 5 carbon atoms, a fluorine atom or a fluorinated alkyl group, may be used. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom on the ring structure of the cycloalkyl group can be mentioned. Specific examples include a 2-methyl-2-adamantyl group and a 2-ethyl-2-adamantyl group. Alternatively, groups having an aliphatic cyclic group such as an adamantyl group, a cyclohexyl group, a cyclopentyl group, a norbornyl group, a tricyclodecyl group or a tetracyclodecyl group, and a branched alkylene group having a tertiary carbon atom bonded thereto, such as the groups bonded to the oxygen atom of the carbonyloxy group (—C(O)—O—) in the structural units represented by general formulas (a1"-1) to (a1"-6) shown below, may also be used.

[Chemical Formula 2]

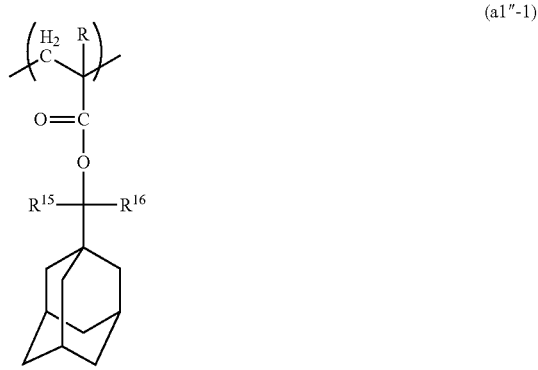

(a1"-1)

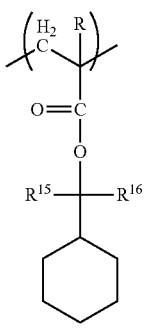

(a1″-2)

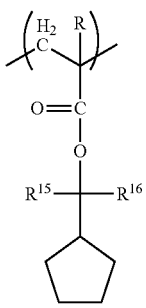

(a1″-3)

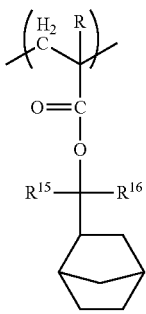

(a1″-4)

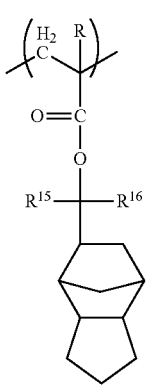

(a1″-5)

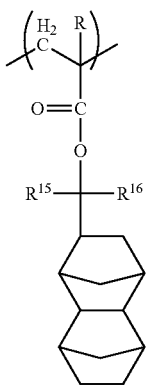

(a1″-6)

[In the formulas, R represents a hydrogen atom, an alkyl group of 1 to 5 carbon atoms or a halogenated alkyl group of 1 to 5 carbon atoms; and $R^{15}$ and $R^{16}$ each represents an alkyl group (which may be linear or branched, and preferably has 1 to 5 carbon atoms).]

In general formulas (a1″-1) to (a1″-6) above, the alkyl group of 1 to 5 carbon atoms or halogenated alkyl group of 1 to 5 carbon atoms for R is the same as defined above for the alkyl group of 1 to 5 carbon atoms or halogenated alkyl group of 1 to 5 carbon atoms which may be bonded to the α-position of the aforementioned acrylate ester.

An "acetal-type acid dissociable, dissolution inhibiting group" generally substitutes a hydrogen atom at the terminal of an alkali-soluble group such as a carboxy group or a hydroxyl group, so as to be bonded with an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 3]

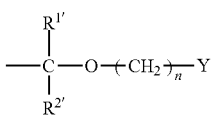

(p1)

[In the formula, $R^{1'}$ and $R^{2'}$ each independently represents a hydrogen atom or an alkyl group of 1 to 5 carbon atoms; n represents an integer of 0 to 3; and Y represents an alkyl group of 1 to 5 carbon atoms or an aliphatic cyclic group.]

In general formula (p1) above, n is preferably an integer of 0 to 2, more preferably 0 or 1, and most preferably 0.

As the alkyl group of 1 to 5 carbon atoms for $R^{1'}$ and $R^{2'}$, the same alkyl groups of 1 to 5 carbon atoms as those described above for R can be used, although a methyl group or an ethyl group is preferable, and a methyl group is particularly desirable.

In the present invention, it is preferable that at least one of $R^{1'}$ and $R^{2'}$ be a hydrogen atom. That is, it is preferable that the acid dissociable, dissolution inhibiting group (p1) is a group represented by general formula (p1-1) shown below.

[Chemical Formula 4]

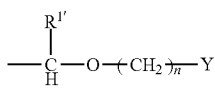

(p1-1)

[In the formula, $R^{1'}$, n and Y are the same as defined above.]

As the alkyl group of 1 to 5 carbon atoms for Y, the same alkyl groups of 1 to 5 carbon atoms as those described above for R can be used.

As the aliphatic cyclic group for Y, any of the aliphatic monocyclic/polycyclic groups which have been proposed for conventional ArF resists and the like can be appropriately selected for use. For example, the same groups described above in connection with the "aliphatic cyclic group" can be used.

Further, as the acetal-type, acid dissociable, dissolution inhibiting group, groups represented by general formula (p2) shown below can also be used.

[Chemical Formula 5]

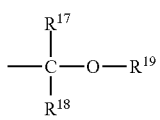

(p2)

[In the formula, $R^{17}$ and $R^{18}$ each independently represents a linear or branched alkyl group or a hydrogen atom; and $R^{19}$ represents a linear, branched or cyclic alkyl group; or each of $R^{17}$ and $R^{19}$ may independently represent a linear or branched alkylene group, wherein $R^{17}$ is bonded to $R^{19}$ to form a ring.]

The alkyl group for $R^{17}$ or $R^{18}$ preferably has 1 to 15 carbon atoms, and may be either linear or branched. As the alkyl group, an ethyl group or a methyl group is preferable, and a methyl group is most preferable. It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or a methyl group, and most preferably an ethyl group.

When $R^{19}$ represents a cyclic alkyl group, it preferably has 4 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, each of $R^{17}$ and $R^{19}$ may independently represent a linear or branched alkylene group (and preferably an alkylene group of 1 to 5 carbon atoms), wherein $R^{19}$ is bonded to $R^{17}$.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include a tetrahydropyranyl group and a tetrahydrofuranyl group.

As the structural unit (a1), it is preferable to use at least one type of structural unit selected from the group consisting of structural units represented by general formula (a1-0-1) shown below and structural units represented by general formula (a1-0-2) shown below.

[Chemical Formula 6]

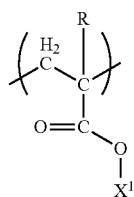

(a1-0-1)

[In the formula, R represents a hydrogen atom, an alkyl group of 1 to 5 carbon atoms or a halogenated alkyl group of 1 to 5 carbon atoms, and $X^1$ represents an acid dissociable, dissolution inhibiting group.]

[Chemical Formula 7]

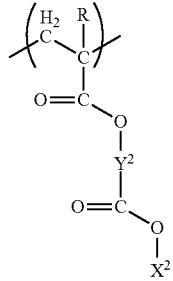

(a1-0-2)

[In the formula, R represents a hydrogen atom, an alkyl group of 1 to 5 carbon atoms or a halogenated alkyl group of 1 to 5 carbon atoms, $X^2$ represents an acid dissociable, dissolution inhibiting group, and $Y^2$ represents a divalent linking group.]

In general formula (a1-0-1) above, the alkyl group of 1 to 5 carbon atoms or halogenated alkyl group of 1 to 5 carbon atoms for R is the same as defined above for the alkyl group of 1 to 5 carbon atoms or halogenated alkyl group of 1 to 5 carbon atoms which may be bonded to the α-position of the aforementioned acrylate ester.

$X^1$ is not particularly limited, as long as it is an acid dissociable, dissolution inhibiting group. Examples thereof include the aforementioned tertiary alkyl ester-type acid dissociable, dissolution inhibiting groups and acetal-type acid dissociable, dissolution inhibiting groups, and of these, tertiary alkyl ester-type acid dissociable, dissolution inhibiting groups are preferable.

In general formula (a1-0-2), R is the same as defined above.

$X^2$ is the same as defined for $X^1$ in general formula (a1-0-1).

Examples of the divalent linking group for $Y^2$ include an alkylene group, a divalent aliphatic cyclic group, or a divalent linking group containing a hetero atom.

Examples of the aliphatic cyclic group include the same groups as those mentioned above within the description of the "aliphatic cyclic group" with the exception that two or more hydrogen atoms have been removed therefrom.

When $Y^2$ represents an alkylene group, the group preferably has 1 to 10 carbon atoms, more preferably 1 to 6 carbon atoms, still more preferably 1 to 4 carbon atoms, and most preferably 1 to 3 carbon atoms.

When $Y^2$ represents a divalent aliphatic cyclic group, it is particularly desirable that the divalent aliphatic cyclic group be a group in which two or more hydrogen atoms have been removed from cyclopentane, cyclohexane, norbornane, isobornane, adamantane, tricyclodecane or tetracyclododecane.

When $Y^2$ represents a divalent linking group containing a hetero atom, examples of the divalent linking group containing a hetero atom include —O—, —C(=O)—O—, —C(=O)—, —O—C(=O)—O—, —C(=O)—NH—, —NH— (wherein H may be replaced with a substituent such as an alkyl group, an acyl group or the like), —S—, —S(=O)$_2$—, —S(=O)$_2$—O—, [-A-O (oxygen atom)-B- (wherein each of A and B independently represents a divalent hydrocarbon group which may have a substituent)], or a combination of an alkylene group and a divalent linking group containing a hetero atom.

In those cases where $Y^2$ is —NH— and the H has been replaced with a substituent such as an alkyl group or acyl group or the like, the number of carbon atoms within the substituent is preferably from 1 to 10 carbon atoms, more preferably from 1 to 8 carbon atoms, and most preferably from 1 to 5 carbon atoms.

When $Y^2$ represents "-A-O-B-", each of A and B independently represents a divalent hydrocarbon group that may have a substituent.

The description that the hydrocarbon group "may have a substituent" means that some or all of the hydrogen atoms within the hydrocarbon group may be substituted with an atom other than a hydrogen atom or with a group.

The hydrocarbon group for A may be either an aliphatic hydrocarbon group or an aromatic hydrocarbon group. An aliphatic hydrocarbon group refers to a hydrocarbon group that has no aromaticity.

The aliphatic hydrocarbon group for A may be saturated or unsaturated. In general, the aliphatic hydrocarbon group is preferably saturated.

More specific examples of the aliphatic hydrocarbon group for A include a linear or branched aliphatic hydrocarbon group, and an aliphatic hydrocarbon group containing a ring in the structure thereof.

The linear or branched aliphatic hydrocarbon group preferably has 1 to 10 carbon atoms, more preferably 1 to 8 carbon atoms, still more preferably 2 to 5 carbon atoms, and most preferably 2 carbon atoms.

As the linear aliphatic hydrocarbon group, a linear alkylene group is preferable. Specific examples thereof include a methylene group, an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, a branched alkylene group is preferable, and specific examples include various alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated alkyl group of 1 to 5 carbon atoms which is substituted by a fluorine atom, and an oxygen atom (=O).

Examples of the aliphatic hydrocarbon group having a ring in the structure thereof include cyclic aliphatic hydrocarbon groups (groups in which two hydrogen atoms have been removed from an aliphatic hydrocarbon ring), and groups in which this type of cyclic aliphatic hydrocarbon group is either bonded to the terminal of an aforementioned chain-like aliphatic hydrocarbon group, or interposed within the chain of an aforementioned chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Specific examples of the monocycloalkane include cyclopentane and cyclohexane. As the polycyclic group, a group in which two hydrogen atoms have been removed from a polycycloalkane of 7 to 12 carbon atoms is preferable. Specific examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms which is substituted by a fluorine atom, and an oxygen atom (=O).

As the group A, a linear aliphatic hydrocarbon group is preferred, a linear alkylene group is more preferred, a linear alkylene group of 2 to 5 carbon atoms is still more preferred, and an ethylene group is the most desirable.

Examples of the hydrocarbon group for B include the same divalent hydrocarbon groups as those listed above for A.

As the group B, a linear or branched aliphatic hydrocarbon group is preferred, and a methylene group or an alkylmethylene group is particularly desirable.

The alkyl group within the alkylmethylene group is preferably a linear alkyl group of 1 to 5 carbon atoms, more preferably a linear alkyl group of 1 to 3 carbon atoms, and is most preferably a methyl group.

Specific examples of the structural unit (a1) include structural units represented by general formulas (a1-1) to (a1-4) shown below.

[Chemical Formula 8]

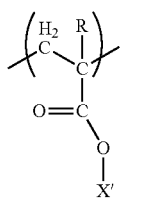
(a1-1)

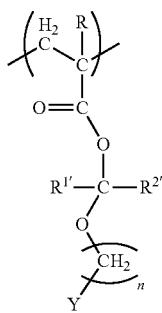
(a1-2)

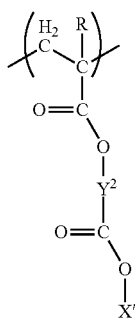
(a1-3)

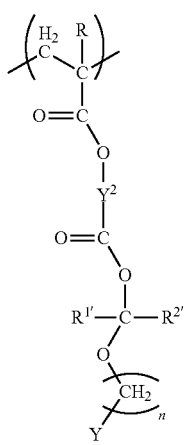
(a1-4)

[In the formulas, X' represents a tertiary alkyl ester-type acid dissociable, dissolution inhibiting group; Y represents an alkyl group of 1 to 5 carbon atoms or an aliphatic cyclic group; n represents an integer of 0 to 3; $Y^2$ represents a divalent linking group; R is the same as defined above; and each of $R^{1\prime}$ and $R^{2\prime}$ independently represents a hydrogen atom or an alkyl group of 1 to 5 carbon atoms.]

In the formulas, examples of X' include the same groups as the tertiary alkyl ester-type acid dissociable, dissolution inhibiting groups described above.

Examples of $R^{1\prime}$, $R^{2\prime}$, n and Y include the same groups and numbers as those listed above for $R^{1\prime}$, $R^{2\prime}$, n and Y in general formula (p1) described above in connection with the "acetal-type acid dissociable, dissolution inhibiting groups".

Examples of $Y^2$ include the same groups as those listed above for $Y^2$ in general formula (a1-0-2).

Specific examples of structural units represented by the above general formulas (a1-1) to (a1-4) are shown below.

In each of the formulas shown below, $R^\alpha$ represents a hydrogen atom, a methyl group or a trifluoromethyl group.

[Chemical Formula 9]

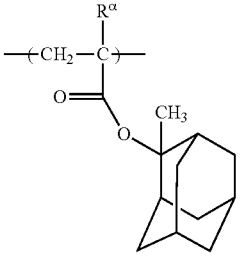
(a1-1-1)

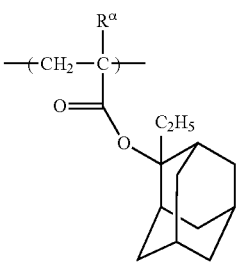
(a1-1-2)

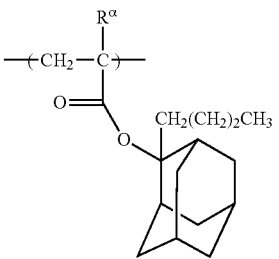
(a1-1-3)

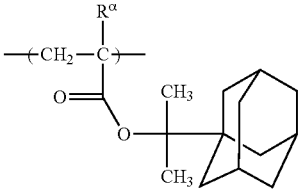
(a1-1-4)

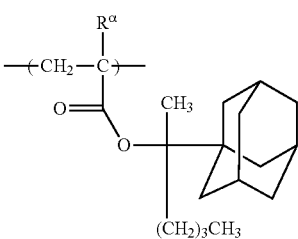
(a1-1-5)

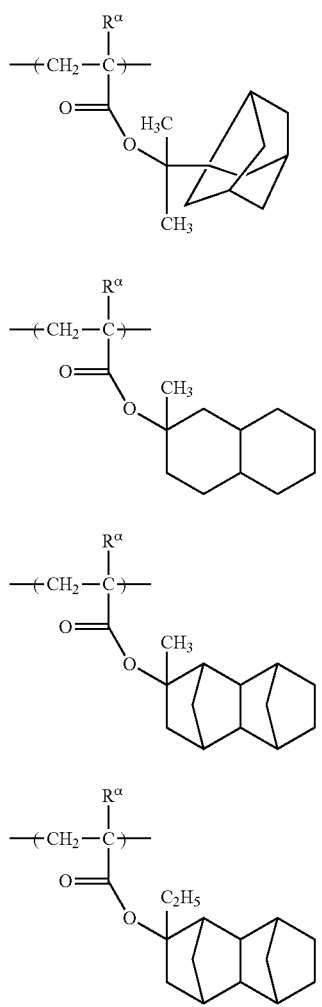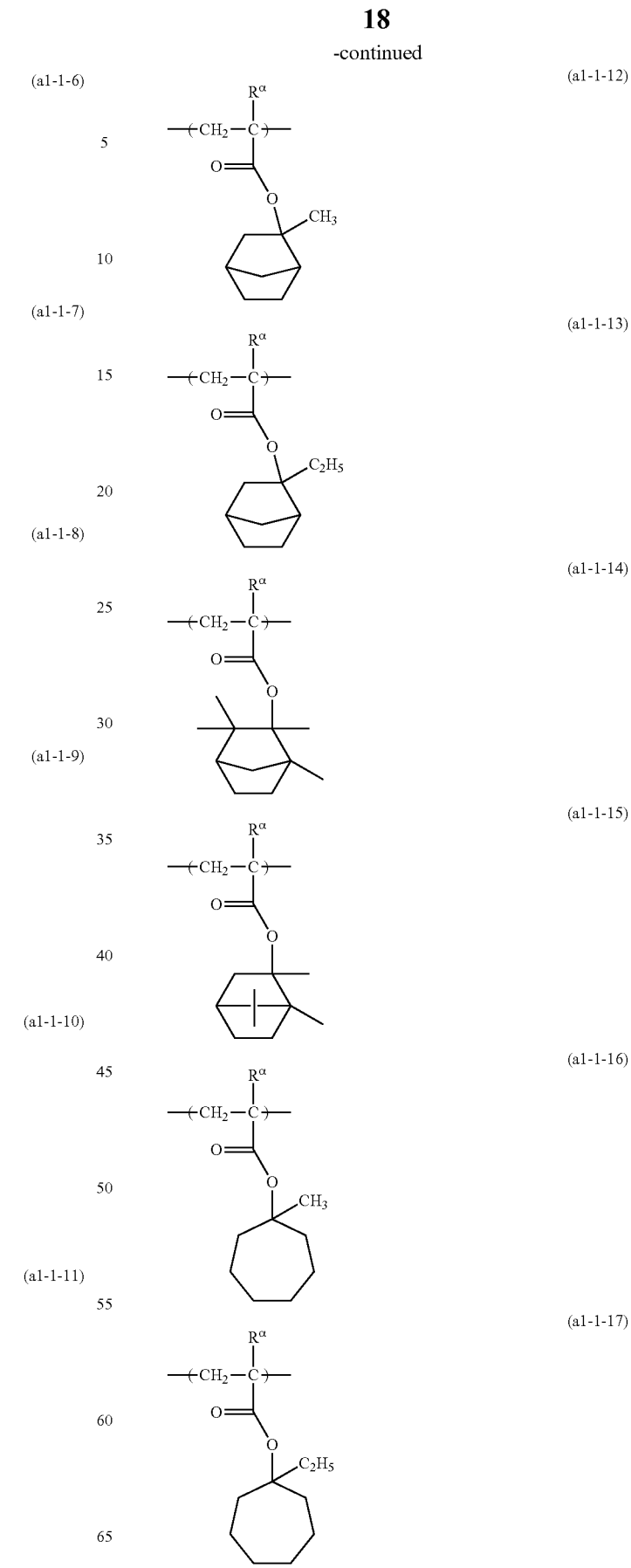

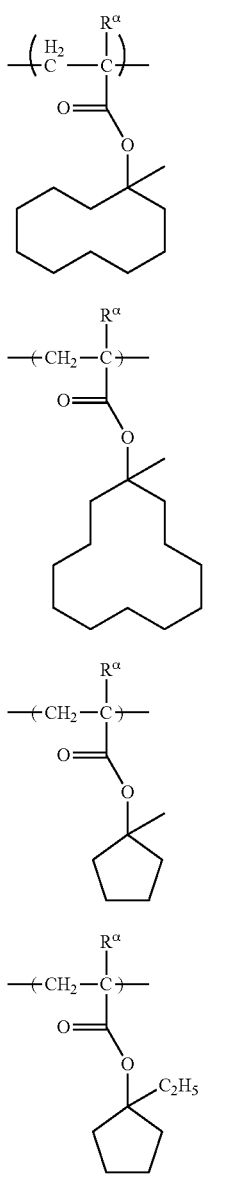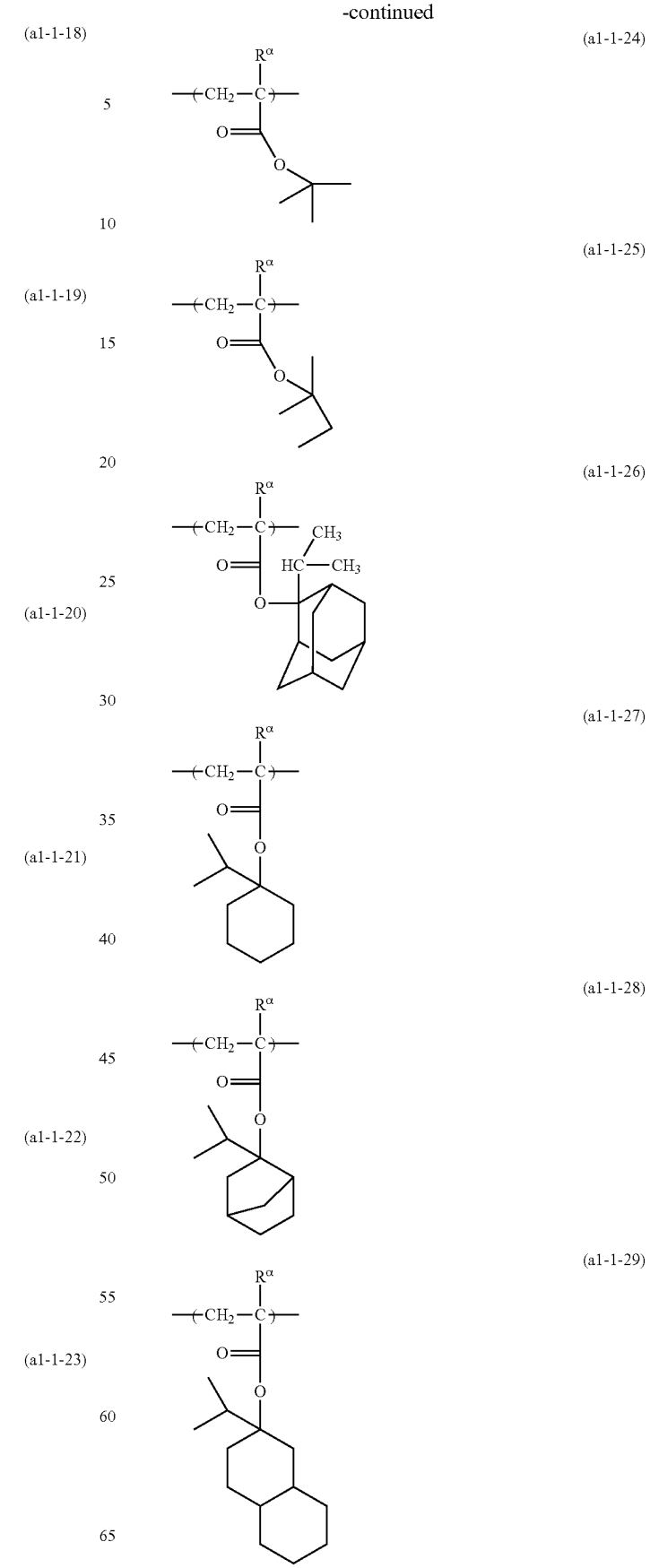

(a1-1-30)
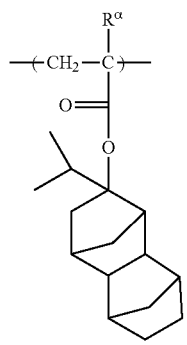
(a1-1-31)
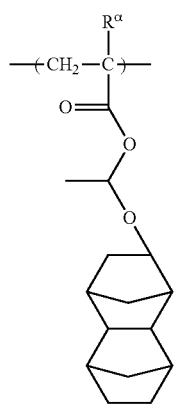
[Chemical Formula 12]
(a1-2-1)
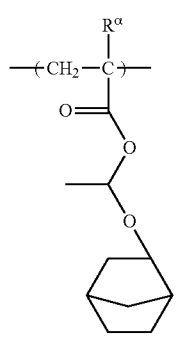
(a1-2-2)
(a1-2-3)
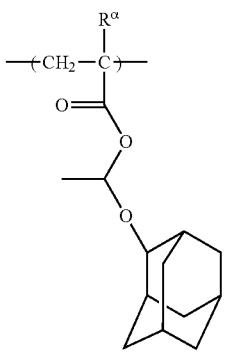
(a1-2-4)
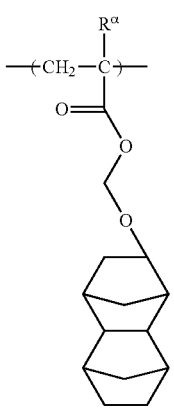
(a1-2-5)
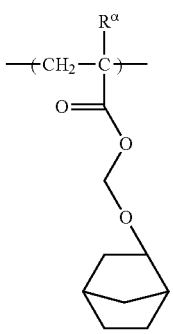
(a1-2-6)
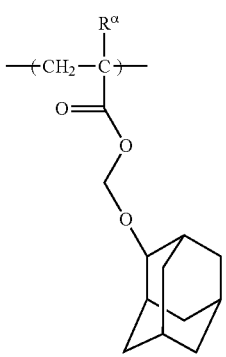

(a1-2-7)
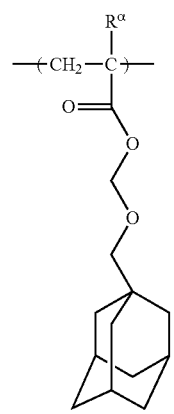
(a1-2-8)
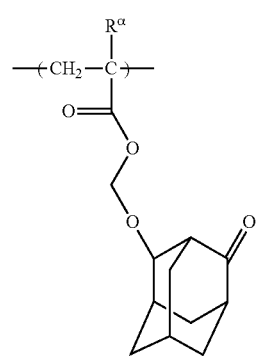
(a1-2-9)
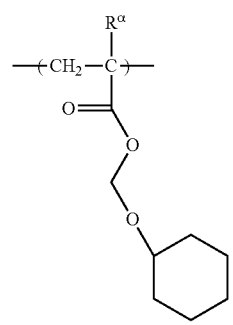
(a1-2-10)
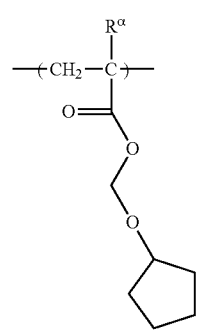
(a1-2-11)
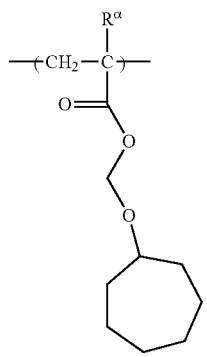
(a1-2-12)
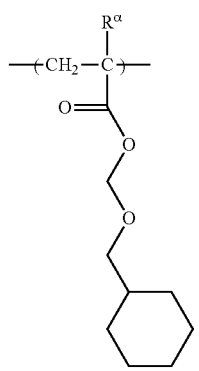
(a1-2-13)
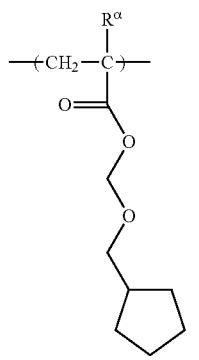
(a1-2-14)
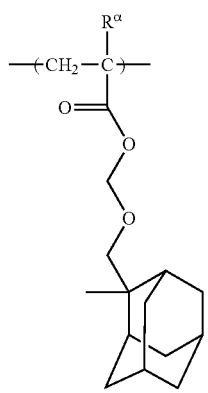

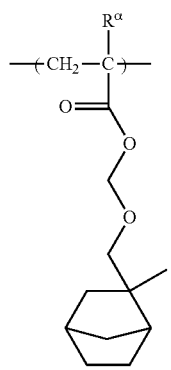 (a1-2-15)
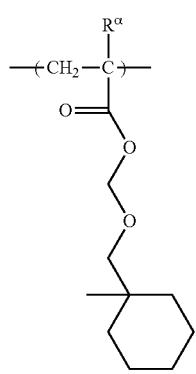 (a1-2-16)
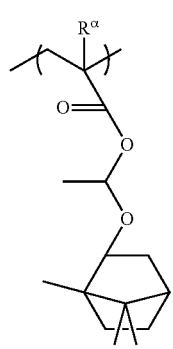 (a1-2-17)
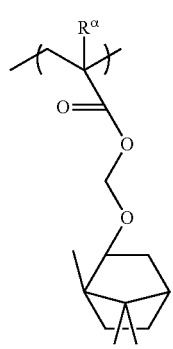 (a1-2-18)
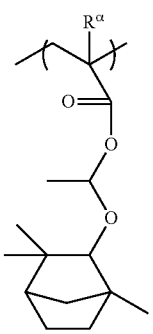 (a1-2-19)
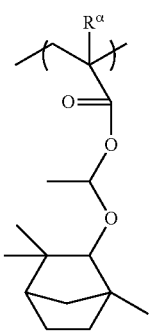 (a1-2-20)
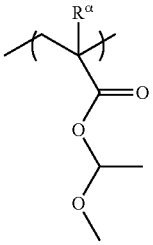 (a1-2-21)
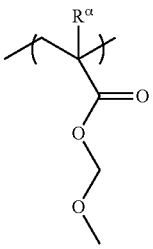 (a1-2-22)
(a1-2-23)

(a1-2-24)
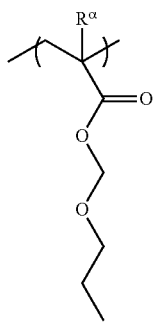
[Chemical Formula 13]
(a1-3-1)
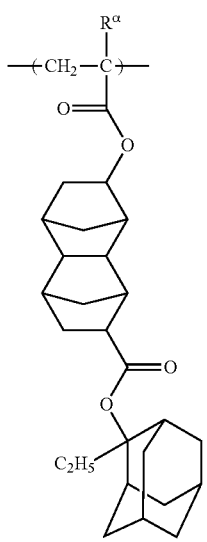
(a1-3-2)
(a1-3-3)
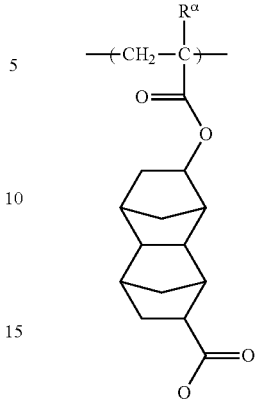
(a1-3-4)
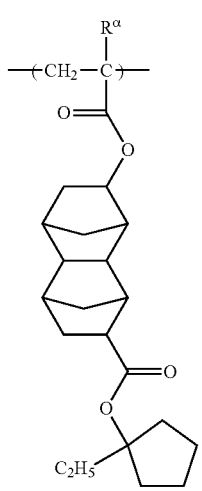
(a1-3-5)
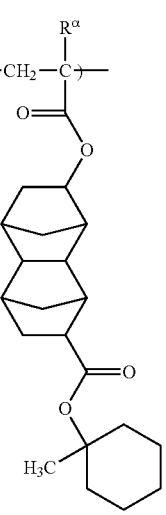

(a1-3-6)
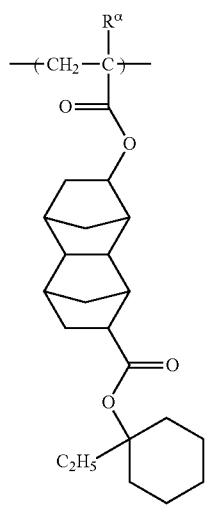
(a1-3-9)
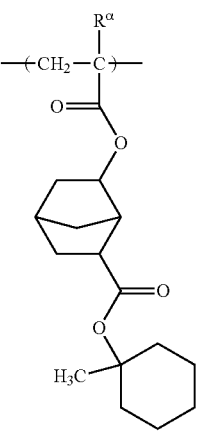
(a1-3-7)
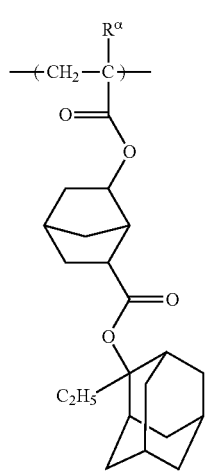
(a1-3-10)
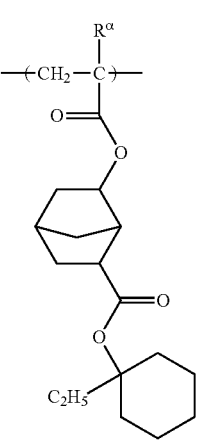
(a1-3-8)
(a1-3-11)
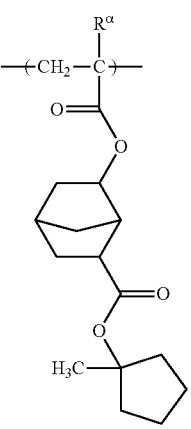

(a1-3-12)
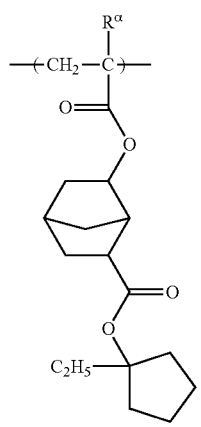
(a1-3-13)
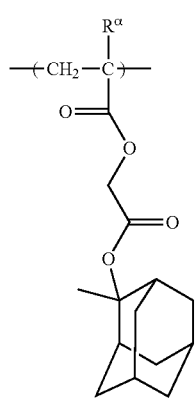
(a1-3-14)
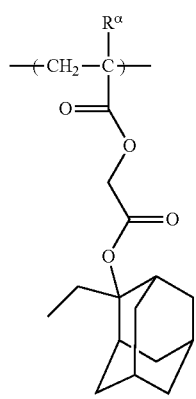
(a1-3-15)
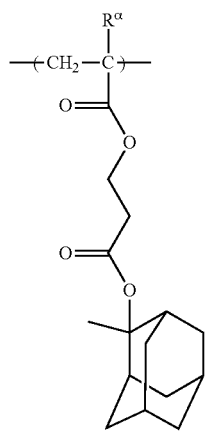
(a1-3-16)
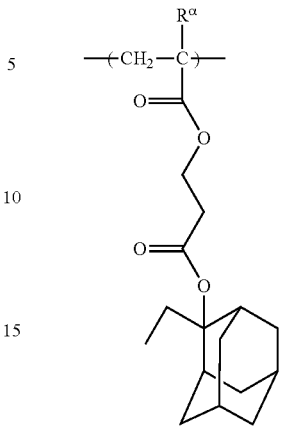
(a1-3-17)
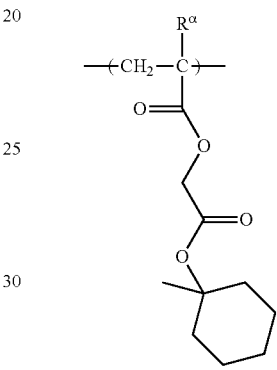
[Chemical Formula 14]
(a1-3-18)
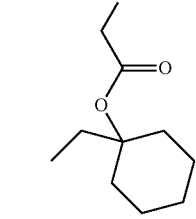
(a1-3-19)
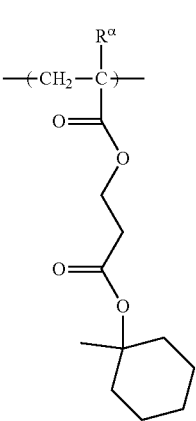

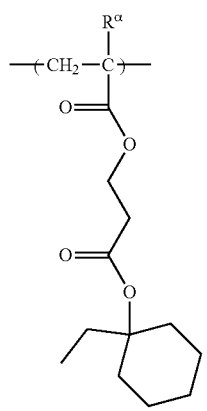
(a1-3-20)
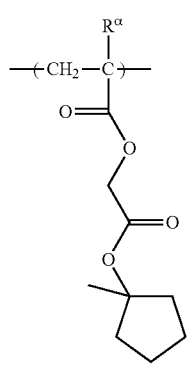
(a1-3-21)
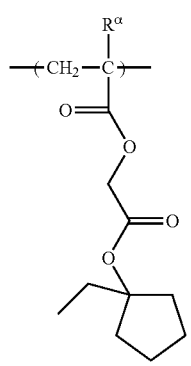
(a1-3-22)
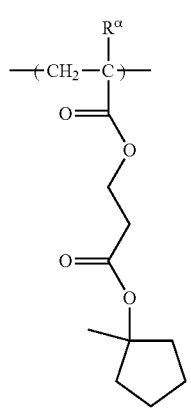
(a1-3-23)
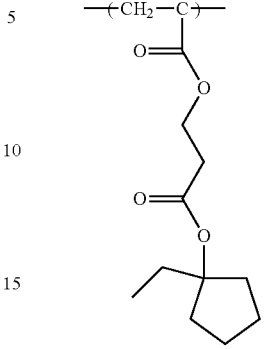
(a1-3-24)
[Chemical Formula 15]
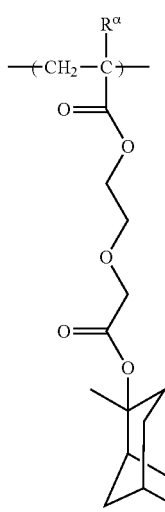
(a1-3-25)
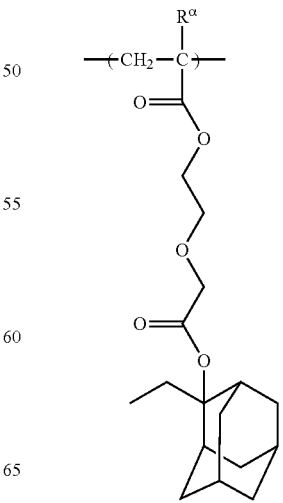
(a1-3-26)

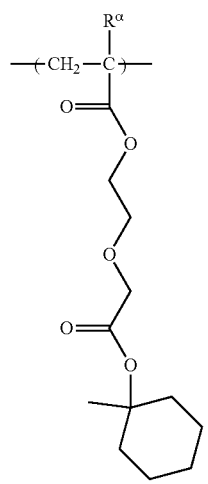
(a1-3-27)
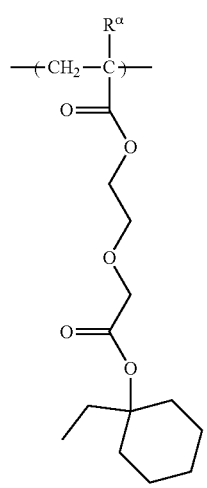
(a1-3-28)
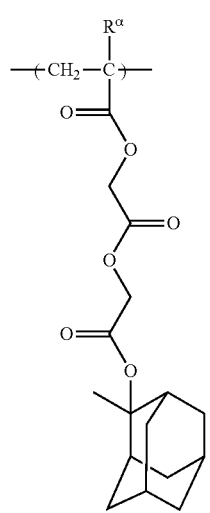
(a1-3-29)
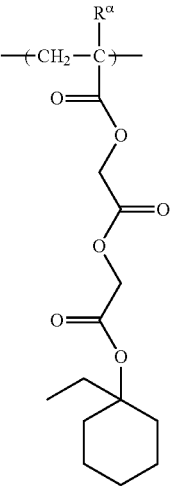
(a1-3-30)
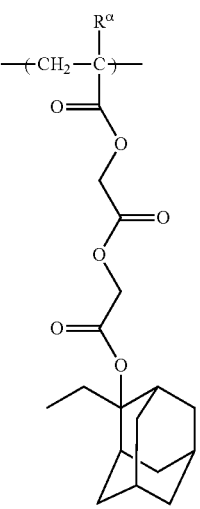
(31-3-31)
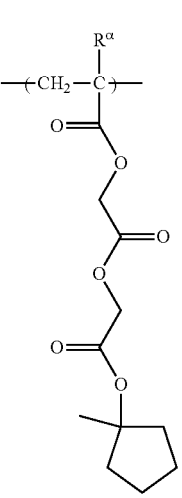
(a1-3-32)

[Chemical Formula 16]
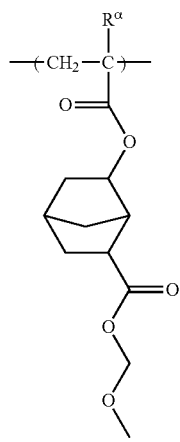 (a1-4-1)
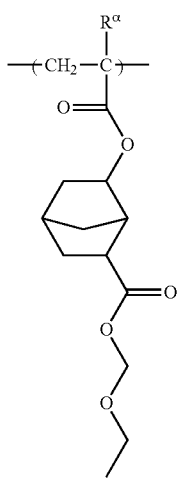 (a1-4-2)
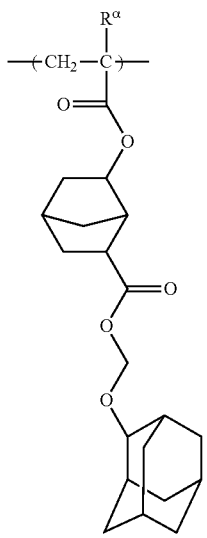 (a1-4-3)
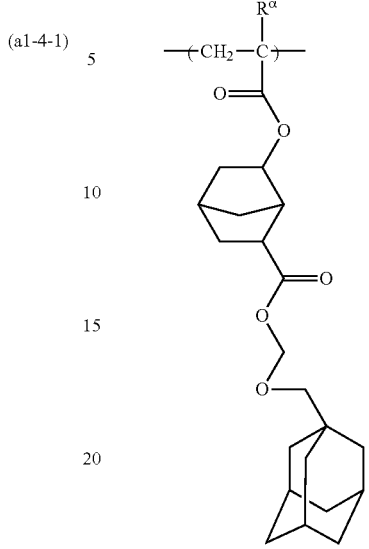 (a1-4-4)
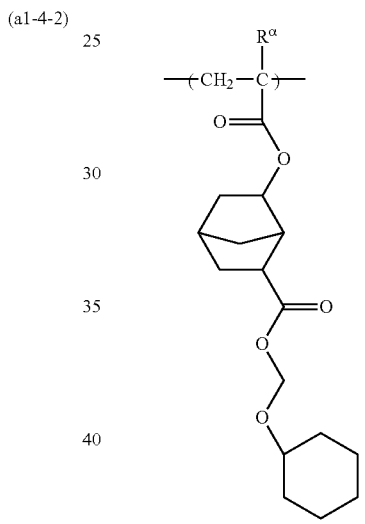 (a1-4-5)
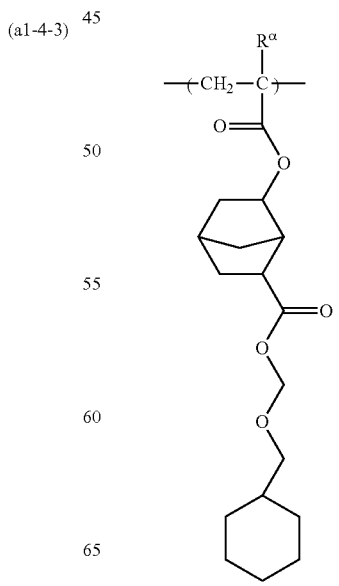 (a1-4-6)

(a1-4-7)
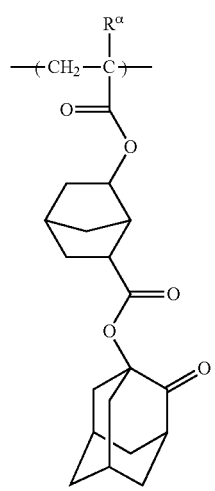
(a1-4-8)
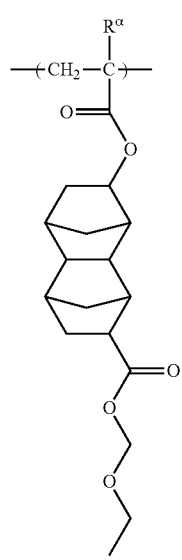
(a1-4-9)
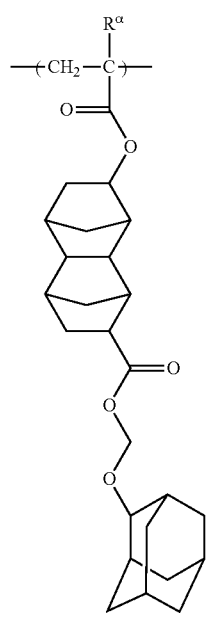
(a1-4-10)
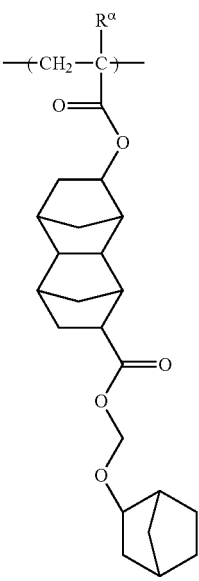
(a1-4-11)
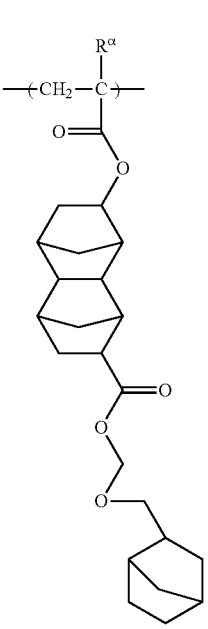

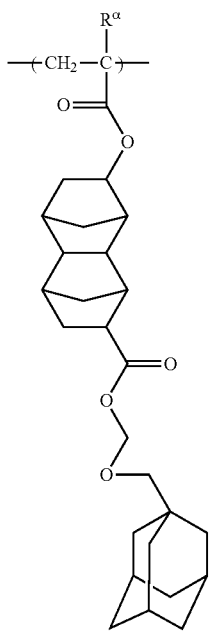

(a1-4-12)

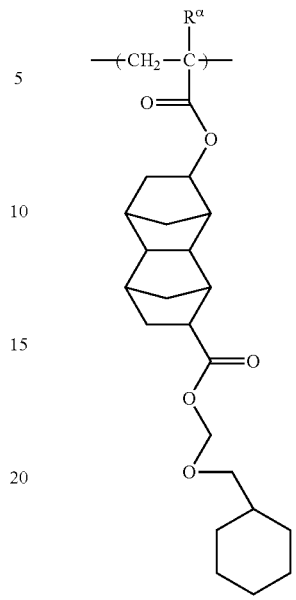

(a1-4-14)

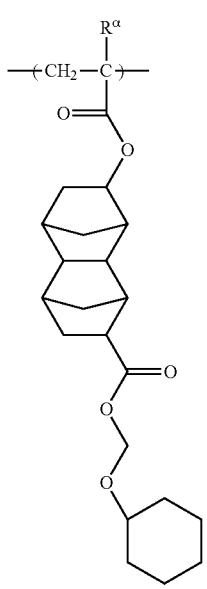

(a1-4-13)

(a1-4-15)

As the structural unit (a1), one type of structural unit may be used alone, or two or more types of structural units may be used in combination.

Among these, structural units represented by general formula (a1-1), (a1-2) or (a1-3) are preferable, and more specifically, the use of at least one structural unit selected from the group consisting of structural units represented by formulas (a1-1-1) to (a1-1-4), (a1-1-20) to (a1-1-23), (a1-2-1) to (a1-2-24), and (a1-3-25) to (a1-3-28) is more preferable.

Moreover, as the structural unit (a1), structural units represented by general formula (a1-1-01) shown below, which includes the structural units represented by formulas (a1-1-1) to (a1-1-3) and formula (a1-1-26), structural units represented by general formula (a1-1-02) shown below, which includes the structural units represented by formulas (a1-1-16) and (a1-1-17) and formulas (a1-1-20) to (a1-1-23), structural units represented by general formula (a1-3-01) shown below, which includes the structural units represented by formulas (a1-3-25) and (a1-3-26), structural units represented by general formula (a1-3-02) shown below, which includes the structural units represented by formulas (a1-3-27) and (a1-3-28), and structural units represented by general formula (a1-3-03) shown below, which includes the structural units represented by formulas (a1-3-29) to (a1-3-32) are also preferred.

[Chemical Formula 17]

(a1-1-01)

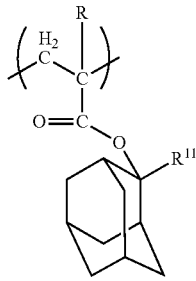

(a1-1-02)

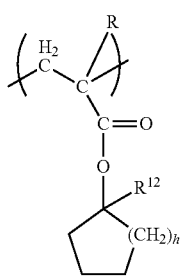

[In the formulas, each R independently represents a hydrogen atom, an alkyl group of 1 to 5 carbon atoms or a halogenated alkyl group of 1 to 5 carbon atoms; $R^{11}$ represents an alkyl group of 1 to 5 carbon atoms; $R^{12}$ represents an alkyl group of 1 to 7 carbon atoms; and h represents an integer of 1 to 6.]

In general formula (a1-1-01), R is the same as defined above. The alkyl group of 1 to 5 carbon atoms for $R^{11}$ is the same as defined above for the alkyl group of 1 to 5 carbon atoms for R, and is preferably a methyl group, an ethyl group or an isopropyl group.

In general formula (a1-1-02), R is the same as defined above. The alkyl group of 1 to 5 carbon atoms for $R^{12}$ is the same as defined above for the alkyl group of 1 to 5 carbon atoms for R, and is preferably a methyl group, an ethyl group or an isopropyl group. h is preferably 1 or 2, and is most preferably 2.

[Chemical Formula 18]

(a1-3-01)

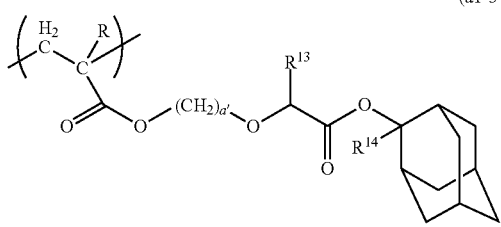

[In the formula, R represents a hydrogen atom, an alkyl group of 1 to 5 carbon atoms or a halogenated alkyl group of 1 to 5 carbon atoms; $R^{14}$ represents an alkyl group of 1 to 5 carbon atoms; $R^{13}$ represents a hydrogen atom or a methyl group; and a' represents an integer of 1 to 10.]

[Chemical Formula 19]

(a1-3-02)

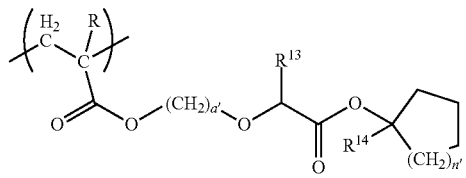

[In the formula, R represents a hydrogen atom, an alkyl group of 1 to 5 carbon atoms or a halogenated alkyl group of 1 to 5 carbon atoms; $R^{14}$ represents an alkyl group of 1 to 5 carbon atoms; $R^{13}$ represents a hydrogen atom or a methyl group; a' represents an integer of 1 to 10; and n' represents an integer of 1 to 6.]

[Chemical Formula 20]

(a1-3-03)

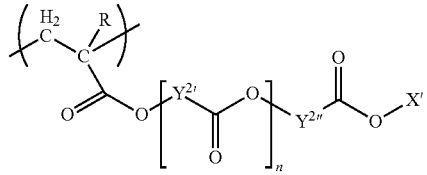

[In the formula, R is the same as defined above; each of $Y^{2'}$ and $Y^{2''}$ independently represents a divalent linking group; X' represents a tertiary alkyl ester-type acid dissociable, dissolution inhibiting group; and n represents an integer of 0 to 3.]

In the above general formulas (a1-3-01) to (a1-3-03), R is the same as defined above.

$R^{13}$ is preferably a hydrogen atom.

The alkyl group of 1 to 5 carbon atoms for $R^{14}$ is the same as the alkyl group of 1 to 5 carbon atoms defined above for R, and is preferably a methyl group or an ethyl group.

n' is preferably 1 or 2, and most preferably 2.

a' is preferably an integer of 1 to 8, more preferably an integer of 2 to 5, and most preferably 2.

As the divalent linking group for $Y^{2'}$ and $Y^{2''}$, the same groups as those described above for $Y^2$ in general formula (a1-3) can be used.

As $Y^{2'}$, a divalent hydrocarbon group which may have a substituent is preferable, a linear aliphatic hydrocarbon group is more preferable, and a linear alkylene group is still more preferable. Among these, a linear alkylene group of 1 to 5 carbon atoms is preferable, and a methylene group or an ethylene group is particularly desirable.

As $Y^{2''}$, a divalent hydrocarbon group which may have a substituent is preferable, a linear aliphatic hydrocarbon group is more preferable, and a linear alkylene group is still more preferable. Among these, a linear alkylene group of 1 to 5 carbon atoms is preferable, and a methylene group or an ethylene group is particularly desirable.

As the tertiary alkyl ester-type acid dissociable, dissolution inhibiting group for X', the same groups as those described above can be used. X' is more preferably the aforementioned group which has a tertiary carbon atom on the ring structure of an aliphatic cyclic group. Among these, an acid dissociable, dissolution inhibiting group within the structural units represented by the aforementioned general formulas (a1-3-29) to (a1-3-32) is preferable.

n represents an integer of 0 to 3, preferably an integer of 0 to 2, more preferably 0 or 1, and most preferably 1.

In the component (A1), the amount of the structural unit (a1), based on the combined total of all the structural units that constitute the component (A1), is preferably within a range from 5 to 80 mol %, more preferably from 10 to 80 mol %, and still more preferably from 15 to 75 mol %. By ensuring that the amount of the structural unit (a1) is at least as large as the lower limit of the above-mentioned range, a pattern can be easily formed using a resist composition prepared from the component (A1). On the other hand, by ensuring that the amount of the structural unit (a1) is no more than the upper limit of the above-mentioned range, a good balance can be achieved with the other structural units.

(Structural Unit (a2))

The structural unit (a2) is a structural unit derived from an acrylate ester containing a lactone-containing cyclic group.

The term "lactone-containing cyclic group" refers to a cyclic group including one ring containing a —O—C(O)— structure (the lactone ring). This "lactone ring" is counted as the first ring, so that a lactone-containing cyclic group in which the only ring structure is the lactone ring is referred to as a monocyclic group, and groups that also contain other ring structures are described as polycyclic groups regardless of the structure of the other rings.

When the component (A1) is used for forming a resist film, the lactone-containing cyclic group of the structural unit (a2) is effective in improving the adhesion between the resist film and the substrate, and increasing the compatibility with the developing solution containing water.

There are no particular limitations on the structural unit (a2), and an arbitrary structural unit may be used.

Specific examples of lactone-containing monocyclic groups include groups in which one hydrogen atom has been removed from a 4- to 6-membered lactone ring, such as a group in which one hydrogen atom has been removed from β-propiolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

More specifically, examples of the structural unit (a2) include structural units represented by general formulas (a2-1) to (a2-5) shown below.

[Chemical Formula 21]

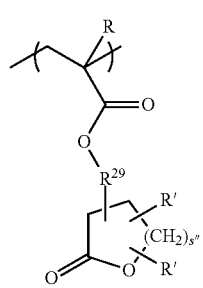
(a2-1)

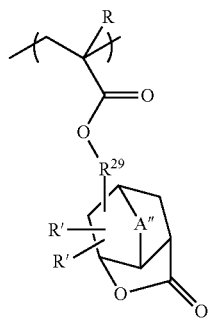
(a2-2)

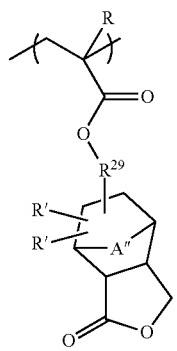
(a2-3)

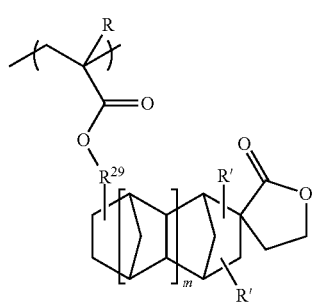
(a2-4)

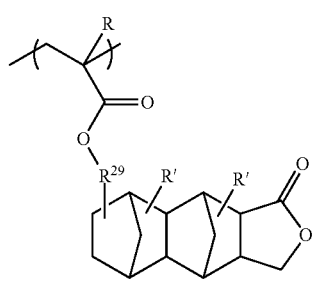
(a2-5)

[In the formulas, R represents a hydrogen atom, an alkyl group of 1 to 5 carbon atoms or a halogenated alkyl group of 1 to 5 carbon atoms; each R' independently represents a hydrogen atom, an alkyl group of 1 to 5 carbon atoms, an alkoxy group of 1 to 5 carbon atoms or —COOR", wherein R" represents a hydrogen atom or an alkyl group; $R^{29}$ represents a single bond or a divalent linking group; s" represents an integer of 0 to 2; A" represents an oxygen atom, a sulfur atom or an alkylene group of 1 to 5 carbon atoms which may contain an oxygen atom or a sulfur atom; and m represents 0 or 1.]

In general formulas (a2-1) to (a2-5), R is the same as defined above for R in the structural unit (a1).

Examples of the alkyl group of 1 to 5 carbon atoms for R' include a methyl group, an ethyl group, a propyl group, an n-butyl group and a tert-butyl group.

Examples of the alkoxy group of 1 to 5 carbon atoms for R' include a methoxy group, an ethoxy group, an n-propoxy group, an iso-propoxy group, an n-butoxy group and a tert-butoxy group.

In terms of industrial availability, R' is preferably a hydrogen atom.

The alkyl group for R" may be any of linear, branched or cyclic.

When R" is a linear or branched alkyl group, it preferably has 1 to 10 carbon atoms, more preferably 1 to 5 carbon atoms.

When R" is a cyclic alkyl group, it preferably has 3 to 15 carbon atoms, more preferably 4 to 12 carbon atoms, and most preferably 5 to 10 carbon atoms. As examples of the cyclic alkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be used. Specific examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

A" is preferably an alkylene group of 1 to 5 carbon atoms, an oxygen atom (—O—) or a sulfur atom (—S—), and is more preferably an alkylene group of 1 to 5 carbon atoms or —O—. As the alkylene group of 1 to 5 carbon atoms, a methylene group or a dimethylmethylene group is more preferable, and a methylene group is particularly desirable.

$R^{29}$ represents a single bond or a divalent linking group. As examples of the divalent linking group for $R^{29}$, the same divalent linking groups as those described above for $Y^2$ in general formula (a1-0-2) can be given. Among these, an alkylene group, an ester bond (—C(=O)—O—) or a combination thereof is preferable. The alkylene group as a divalent linking group for $R^{29}$ is preferably a linear or branched alkylene group. Specific examples thereof include the same linear alkylene groups and branched alkylene groups as those listed above for the aliphatic hydrocarbon group within the description for $Y^2$.

As $R^{29}$, a single bond or —$R^{29'}$—C(=O)—O— [wherein $R^{29'}$ represents a linear or branched alkylene group] is particularly desirable.

The linear or branched alkylene group for $R^{29'}$ preferably has 1 to 10 carbon atoms, more preferably 1 to 8 carbon atoms, still more preferably 1 to 5 carbon atoms, still more preferably 1 to 3 carbon atoms, and most preferably 1 to 2 carbon atoms.

As the linear alkylene group for $R^{29'}$, a methylene group or an ethylene group is preferable, and a methylene group is particularly desirable. As the branched alkylene group for $R^{29'}$, an alkylmethylene group or an alkylethylene group is preferable, and —CH(CH$_3$)—, —C(CH$_3$)$_2$— or —C(CH$_3$)$_2$CH$_2$— is particularly desirable.

In general formula (a2-1), s" is preferably 1 or 2.

Specific examples of structural units represented by the aforementioned general formulas (a2-1) to (a2-5) are shown below. In each of the formulas shown below, $R^\alpha$ represents a hydrogen atom, a methyl group or a trifluoromethyl group.

[Chemical Formula 22]

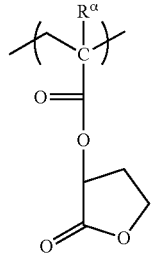

(a2-1-1)

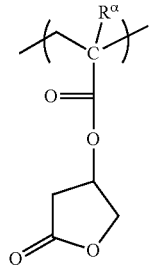

(a2-1-2)

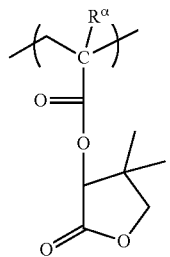

(a2-1-3)

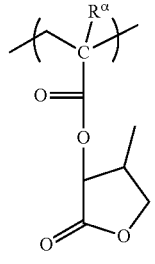

(a2-1-4)

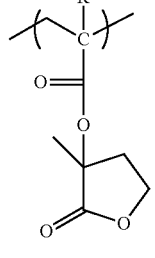

(a2-1-5)

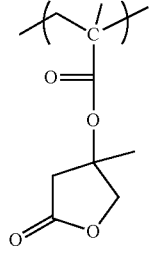

(a2-1-6)

(a2-1-7) 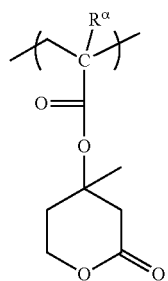
(a2-1-8) 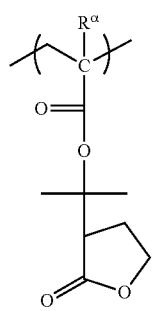
(a2-1-9) 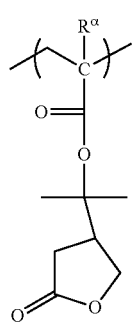
(a2-1-10) 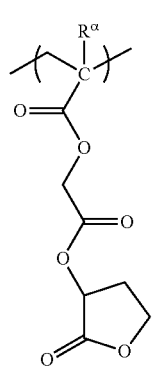
(a2-1-11) 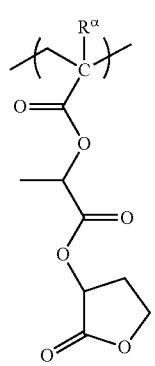
(a2-1-12) 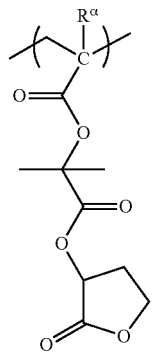
(a2-1-13) 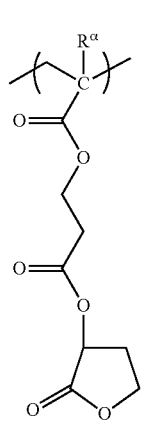
[Chemical Formula 23]
(a2-2-1) 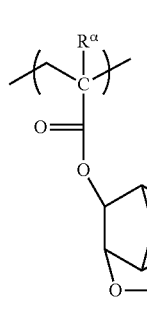
(a2-2-2) 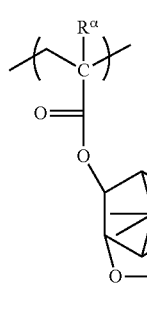

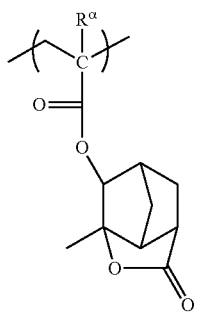 (a2-2-3)
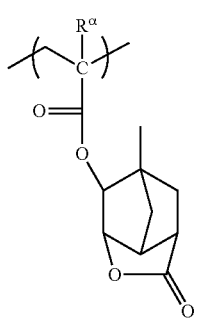 (a2-2-4)
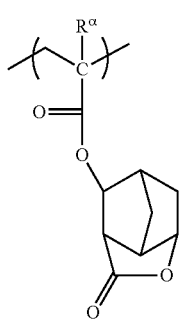 (a2-2-5)
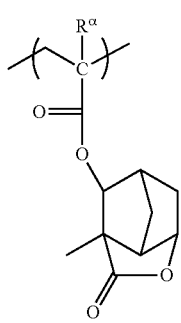 (a2-2-6)
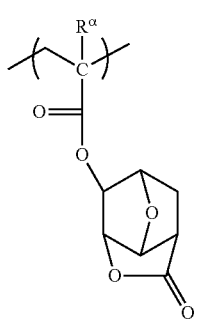 (a2-2-7)
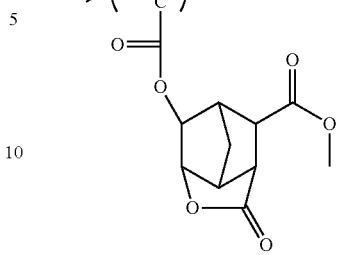 (a2-2-8)
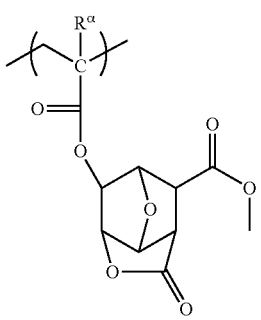 (a2-2-9)
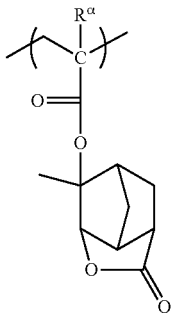 (a2-2-10)
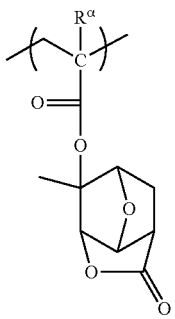 (a2-2-11)

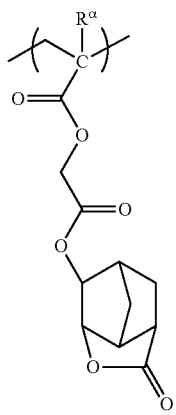
(a2-2-12)
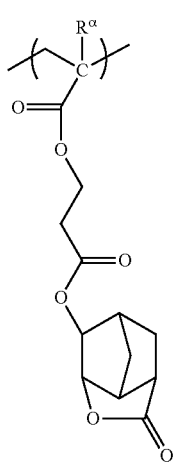
(a2-2-13)
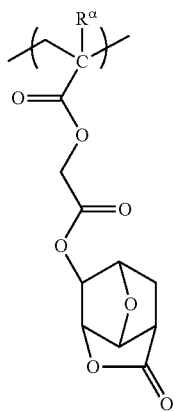
(a2-2-14)
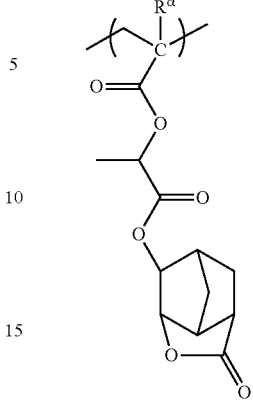
(a2-2-15)
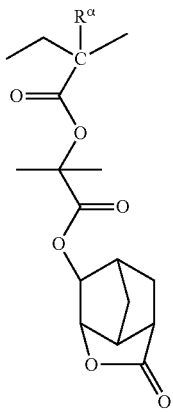
(a2-2-16)
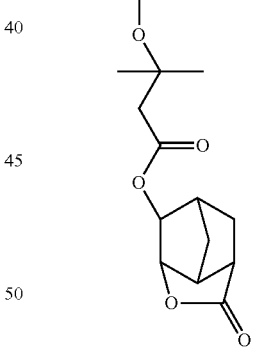
(a2-2-17)
[Chemical Formula 24]
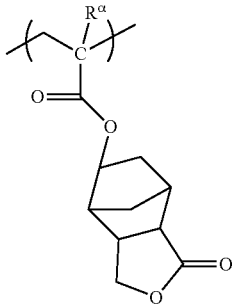
(a2-3-1)

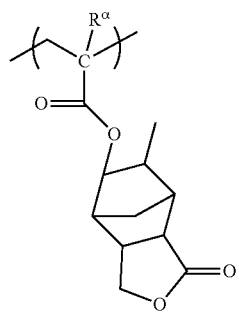 (a2-3-2)
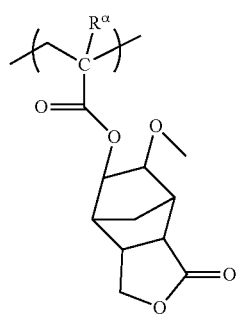 (a2-3-3)
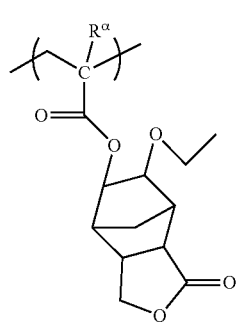 (a2-3-4)
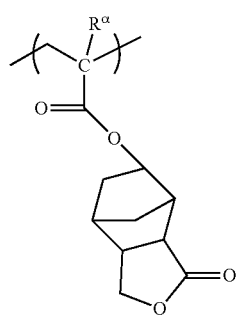 (a2-3-5)
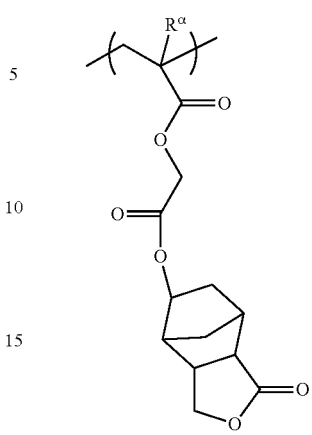 (a2-3-6)
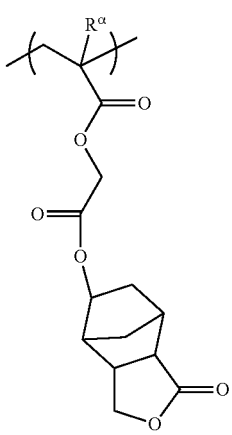 (a2-3-7)
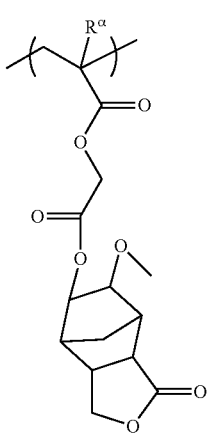 (a2-3-8)

(a2-3-9) 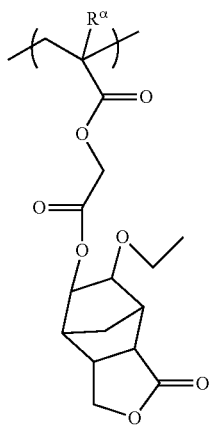
(a2-3-10) 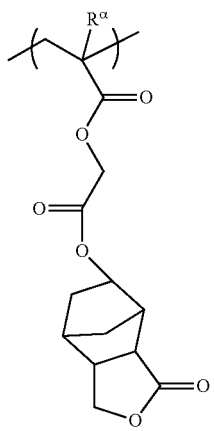
[Chemical Formula 25]
(a2-4-1) 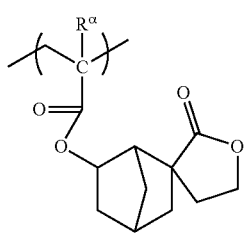
(a2-4-2) 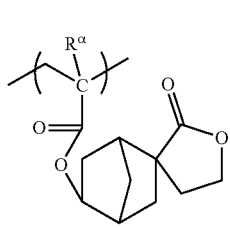
(a2-4-3) 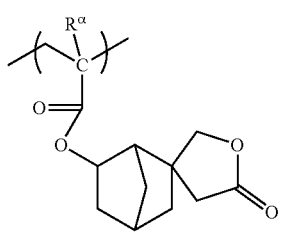
(a2-4-4) 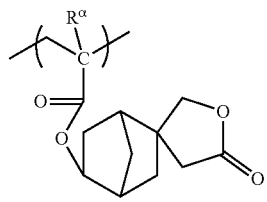
(a2-4-5) 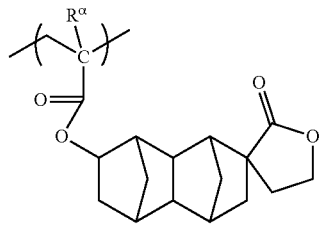
(a2-4-6) 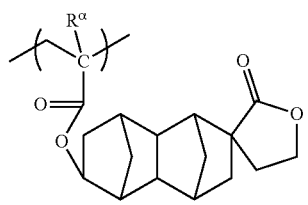
(a2-4-7) 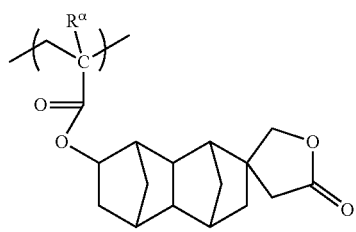
(a2-4-8) 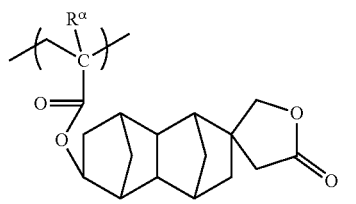
(a2-4-9) 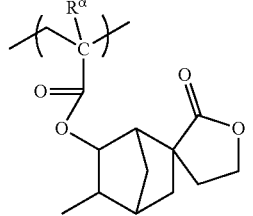
(a2-4-10) 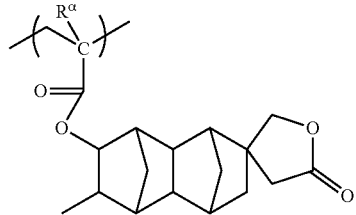

-continued
(a2-4-11)
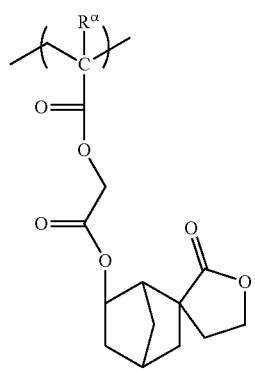
(a2-4-12)
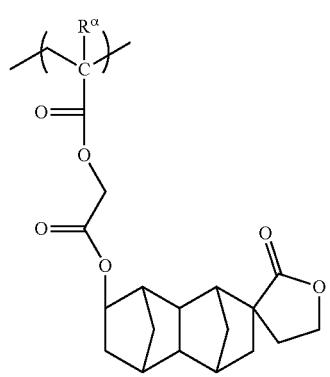
[Chemical formula 26]
(a2-5-1)
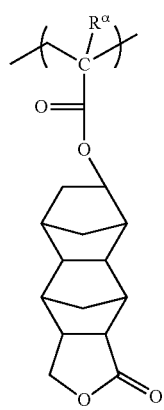
(a2-5-2)
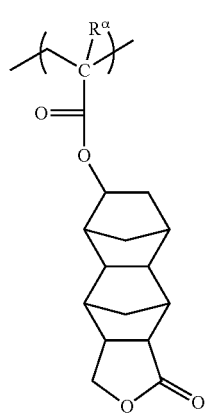
-continued
(a2-5-3)
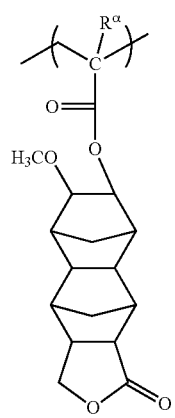
(a2-5-4)
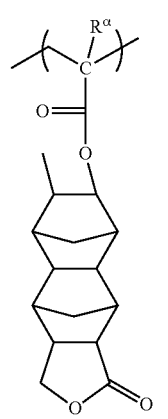
(a2-5-5)
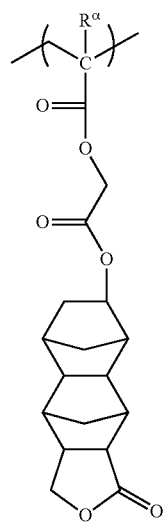

-continued

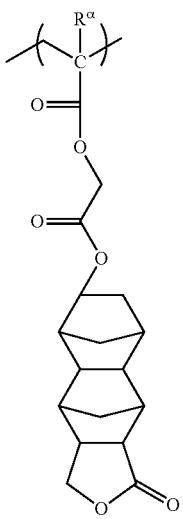

(a2-5-6)

In the component (A1), as the structural unit (a2), one type of structural unit may be used alone, or two or more types of structural units may be used in combination.

In the present invention, the component (A1) preferably contains, as the structural unit (a2), at least one structural unit selected from the group consisting of structural units represented by general formulas (a2-1) to (a2-5), more preferably at least one structural unit selected from the group consisting of structural units represented by general formulas (a2-1) to (a2-3), and most preferably at least one structural unit selected from the group consisting of structural units represented by general formulas (a2-1) and (a2-2).

In terms of improving the adhesion between a substrate and a resist film formed using a positive resist composition containing the component (A1) and increasing the compatibility with a developing solution, the amount of the structural unit (a2) within the component (A1), based on the combined total of all the structural units that constitute the component (A1), is preferably within a range from 5 to 70 mol %, more preferably from 10 to 65 mol %, still more preferably from 15 to 65 mol %, and most preferably from 20 to 60 mol %. By ensuring that the amount is within the above-mentioned range, MEF, CDU and the pattern shape can be further improved.

(Structural Unit (a3))

The structural unit (a3) is a structural unit derived from an acrylate ester containing a polar group-containing aliphatic hydrocarbon group.

When the component (A1) includes the structural unit (a3), the hydrophilicity of the component (A) is improved, and hence, the compatibility of the component (A) with the developing solution is improved. As a result, the alkali solubility of the exposed portions improves, which contributes to favorable improvements in the resolution.

Examples of the polar group include a hydroxyl group, a cyano group, a carboxyl group, or a hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups).

These polycyclic groups can be selected appropriately from the multitude of groups that have been proposed for the resins of resist compositions designed for use with ArF excimer lasers. The polycyclic group preferably has 7 to 30 carbon atoms.

Of the various possibilities, structural units derived from an acrylate ester that includes an aliphatic polycyclic group containing a hydroxyl group, a cyano group, a carboxyl group or a hydroxyalkyl group in which some of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, groups in which two or more hydrogen atoms have been removed from norbornane, or groups in which two or more hydrogen atoms have been removed from tetracyclododecane are preferred industrially.

When the hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 27]

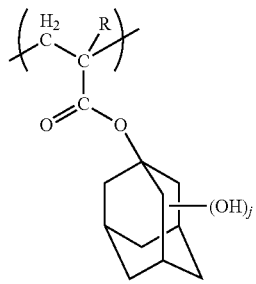

(a3-1)

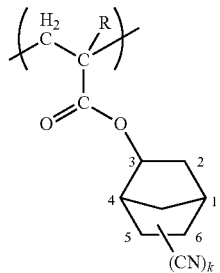

(a3-2)

[Chemical Formula 28]

(a3-3)

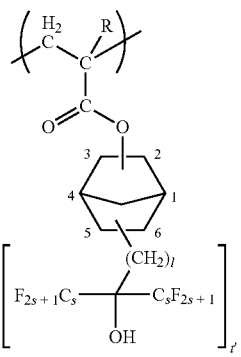

(a5-1)

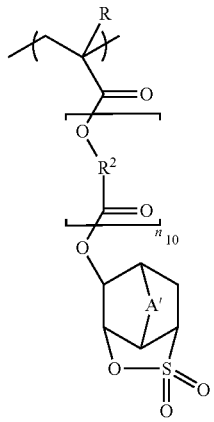

[In the formulas, R is the same as defined above; j is an integer of 1 to 3; k is an integer of 1 to 3; t' is an integer of 1 to 3; l is an integer of 1 to 5; and s is an integer of 1 to 3.]

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxyl group of the acrylic acid. The fluorinated alkyl alcohol is preferably bonded to the 5th or 6th position of the norbornyl group.

As the structural unit (a3), one type of structural unit may be used alone, or two or more types of structural units may be used in combination.

The amount of the structural unit (a3) within the component (A1), based on the combined total of all the structural units that constitute the component (A1), is preferably within a range from 1 to 50 mol %, more preferably from 3 to 45 mol %, and still more preferably from 5 to 40 mol %. By ensuring that the amount of the structural unit (a3) is at least as large as the lower limit of the above-mentioned range, the effects achieved by including the structural unit (a3) are able to manifest satisfactorily. On the other hand, by ensuring that the amount is not more than the upper limit of the above-mentioned range, a good balance can be achieved with the other structural units.

(Structural Unit (a5))

Examples of the structural unit (a5) include a structural unit derived from an acrylate ester that contains a sultone structure within the side chain thereof. By including the structural unit (a5), lithographic properties such as the resolution and resist pattern shape are improved. Specific examples of the structural unit (a5) include structural units represented by general formula (a5-1) shown below.

[In the formula, R is the same as defined above; $R^2$ represents a linear or branched alkylene group; A' represents an oxygen atom, a sulfur atom or an alkylene group of 1 to 5 carbon atoms which may contain an oxygen atom or a sulfur atom; and $n_{10}$ is 0 to 2.]

The linear or branched alkylene group for $R^2$ preferably has 1 to 10 carbon atoms, more preferably 1 to 8 carbon atoms, still more preferably 1 to 5 carbon atoms, still more preferably 1 to 3 carbon atoms, and most preferably 1 to 2 carbon atoms.

A' is preferably a methylene group, an oxygen atom (—O—) or a sulfur atom (—S—).

$n_{10}$ is preferably 0 or 1.

As the structural unit (a5), one type of structural unit may be used alone, or two or more types of structural units may be used in combination.

When the structural unit (a5) is included in the component (A1), the amount of the structural unit (a5), based on the combined total of all the structural units that constitute the component (A1), is preferably within the range from 1 to 60 mol %, more preferably from 5 to 55 mol %, and most preferably from 10 to 50 mol %.

(Structural Unit (a6))

The structural unit (a6) is a structural unit derived from hydroxystyrene.

Including the structural unit (a6) within the component (A1) improves the dry etching resistance in addition to the other effects of the present invention. Moreover, the structural unit (a6) also offers other advantages such as the ready availability and low cost of the hydroxystyrene that serves as the raw material for the structural unit.

Examples of preferred structures for the structural unit (a6) include the structural units represented by general formula (a6-1) shown below.

[Chemical Formula 29]

(a6-1)

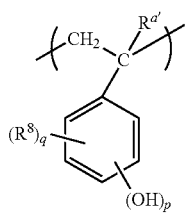

[In formula (a6-1), $R^{a'}$ represents a hydrogen atom or an alkyl group of 1 to 5 carbon atoms; $R^8$ represents an alkyl group of 1 to 5 carbon atoms; p represents an integer of 1 to 3; and q represents an integer of 0 to 2.]

In general formula (a6-1) above, specific examples of the alkyl group of 1 to 5 carbon atoms for $R^{a'}$ include a linear or branched alkyl group such as a methyl group, an ethyl group, a propyl group, an isopropyl group, an n-butyl group, an isobutyl group, a tert-butyl group, a pentyl group, an isopentyl group and a neopentyl group, and of these, a methyl group is preferable.

As $R^{a'}$, a hydrogen atom or an alkyl group of 1 to 5 carbon atoms is preferable, and a hydrogen atom or a methyl group is particularly desirable.

p represents an integer of 1 to 3, and is preferably 1.

The bonding position of the hydroxyl group may be any of the o-position, m-position and p-position of the phenyl group. When p is 1, the p-position is preferable in terms of availability and low cost. When p is 2 or 3, a desired combination of the substitution positions can be used.

q represents an integer of 0 to 2, preferably 0 or 1, and most preferably 0 from an industrial viewpoint.

As the alkyl group of 1 to 5 carbon atoms for $R^8$, the same alkyl groups of 1 to 5 carbon atoms as those described above for $R^{a'}$ can be used.

When q is 1, the substitution position of $R^8$ may be any of the o-position, the m-position and the p-position. When q is 2, a desired combination of the substitution positions can be used. The plurality of $R^8$ groups may be the same, or may be different from each other.

As the structural unit (a6), one type of structural unit may be used alone, or two or more types of structural units may be used in combination.

When the structural unit (a6) is included in the component (A1), the amount of the structural unit (a6) within the component (A1), based on the combined total of all the structural units that constitute the component (A1), is preferably within the range from 50 to 90 mol %, more preferably from 55 to 85 mol %, and still more preferably from 60 to 80 mol %. By ensuring that this amount is at least as large as the lower limit of the above range, an appropriate level of alkali solubility can be obtained. Further, the effects achieved by including the structural unit (a6) are able to manifest satisfactorily. On the other hand, by ensuring that the amount is not more than the upper limit of the above range, a good balance can be achieved with the other structural units.

(Structural Unit (a7))

The structural unit (a7) is a structural unit derived from a styrene.

Including the structural unit (a7) enables the solubility in alkali developing solutions to be adjusted. Further, the structural unit (a7) also yields improved dry etching resistance, which is desirable.

In the present description, the term "styrene" includes both styrene and compounds in which the α-position hydrogen atom of styrene has been substituted with another substituent such as an alkyl group.

The term "structural unit derived from a styrene" refers to a structural unit that is formed by the cleavage of the ethylenic double bond of the styrene. One or more hydrogen atoms bonded to the phenyl group of the styrene may be substituted with substituents such as an alkyl group of 1 to 5 carbon atoms.

Examples of preferred structures for the structural unit (a7) include the structural units represented by general formula (a7-1) shown below.

[Chemical Formula 30]

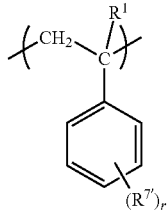

(a7-1)

[In formula (a7-1), $R^1$ is the same as defined above; $R^{7'}$ represents a halogen atom, an alkyl group of 1 to 5 carbon atoms or a halogenated alkyl group of 1 to 5 carbon atoms; and r represents an integer of 0 to 3.]

In general formula (a7-1) above, $R^1$ is the same as defined above for R' in the aforementioned general formula (a6-1).

Examples of the alkyl group of 1 to 5 carbon atoms for $R^{7'}$ include the same groups as those listed above for $R^8$ in the aforementioned formula (a6-1). Examples of the halogenated alkyl group of 1 to 5 carbon atoms for $R^{7'}$ include groups in which some or all of the hydrogen atoms of a linear, branched or cyclic alkyl group described above for $R^{a'}$ have been substituted with halogen atoms. Examples of the halogen atom include a fluorine atom, a chlorine atom, a bromine atom and an iodine atom, and a fluorine atom is particularly desirable.

r represents an integer of 0 to 3, preferably 0 or 1, and most preferably 0 from an industrial viewpoint.

When r is 1, the substitution position of $R^{7'}$ may be any of the o-position, the m-position and the p-position of the phenyl group.

When r is 2 or 3, a desired combination of the substitution positions can be used. The plurality of $R^{7'}$ groups may be the same, or may be different from each other.

As the structural unit (a7), one type of structural unit may be used alone, or two or more types of structural units may be used in combination.

When the structural unit (a7) is included in the component (A1), the amount of the structural unit (a7) within the component (A1), based on the combined total of all the structural units that constitute the component (A1), is preferably within the range from 1 to 20 mol %, more preferably from 3 to 15 mol %, and still more preferably from 5 to 15 mol %. By ensuring that this amount is at least as large as the lower limit of the above range, the effects achieved by including the structural unit (a7) manifest more readily. On the other hand, by ensuring that the amount is not more than the upper limit of the above range, a good balance can be achieved with the other structural units.

(Structural Unit (a8))

The structural unit (a8) is a structural unit derived from a hydroxystyrene in which at least a portion of the hydroxyl group hydrogen atoms have been protected with substituents.

In the structural unit (a8), examples of the substituent include tertiary alkyl group-containing groups, alkoxyalkyl groups, acid dissociable, dissolution inhibiting groups, and organic groups that contain an acid dissociable, dissolution inhibiting group.

Tertiary Alkyl Group-Containing Group

In the present description, the term "tertiary alkyl group" describes an alkyl group containing a tertiary carbon atom. As mentioned above, the term "alkyl group" describes monovalent saturated hydrocarbon groups, and includes chain-like (linear or branched) alkyl groups as well as alkyl groups having a cyclic structure.

The "tertiary alkyl group-containing group" describes a group containing a tertiary alkyl group within its structure. The tertiary alkyl group-containing group may be composed solely of the tertiary alkyl group, or may be composed of the tertiary alkyl group and other atom(s) or group(s) besides the tertiary alkyl group.

Examples of these "other atom(s) or group(s) besides the tertiary alkyl group" that may constitute the tertiary alkyl group-containing group together with the tertiary alkyl group include a carbonyloxy group, a carbonyl group, an alkylene group and an oxygen atom.

In the structural unit (a8), examples of the tertiary alkyl group-containing group include tertiary alkyl group-containing groups which do not contain a cyclic structure, and tertiary alkyl group-containing groups which contain a cyclic structure.

A tertiary alkyl group-containing group which does not contain a cyclic structure contains a branched tertiary alkyl group as the tertiary alkyl group, and includes no cyclic structure within the structure thereof.

Examples of branched tertiary alkyl groups include the groups represented by general formula (I) shown below.

[Chemical Formula 31]

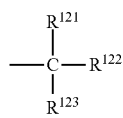

(I)

In formula (I), each of $R^{121}$ to $R^{123}$ independently represents a linear or branched alkyl group. These alkyl groups preferably contain 1 to 5 carbon atoms, and more preferably 1 to 3 carbon atoms.

Further, the total number of carbon atoms within the group represented by general formula (I) is preferably from 4 to 7 carbon atoms, more preferably from 4 to 6 carbon atoms, and most preferably 4 or 5 carbon atoms.

Preferred examples of the group represented by general formula (I) include a tert-butyl group and a tert-pentyl group, and a tert-butyl group is particularly desirable.

Examples of the tertiary alkyl group-containing groups which do not contain a cyclic structure include the branched tertiary alkyl groups described above; tertiary alkyl group-containing chain-like alkyl groups in which an aforementioned branched tertiary alkyl group is bonded to a linear or branched alkylene group; tertiary alkyloxycarbonyl groups containing an aforementioned branched tertiary alkyl group as the tertiary alkyl group; and tertiary alkyloxycarbonylalkyl groups containing an aforementioned branched tertiary alkyl group as the tertiary alkyl group.

The alkylene group in the tertiary alkyl group-containing chain-like alkyl group is preferably an alkylene group of 1 to 5 carbon atoms, more preferably an alkylene group of 1 to 4 carbon atoms, and still more preferably an alkylene group of 1 or 2 carbon atoms.

Examples of the chain-like tertiary alkyloxycarbonyl groups include groups represented by general formula (II) shown below. In formula (II), $R^{121}$ to $R^{123}$ are the same as defined above for $R^{121}$ to $R^{123}$ in the aforementioned formula (I). As the chain-like tertiary alkyloxycarbonyl group, a tert-butyloxycarbonyl group (t-boc) or a tert-pentyloxycarbonyl group is preferred.

[Chemical Formula 32]

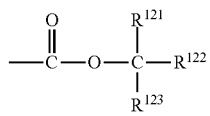

(II)

Examples of the chain-like tertiary alkyloxycarbonylalkyl groups include groups represented by general formula (III) shown below. In formula (III), $R^{121}$ to $R^{123}$ are the same as defined above for $R^{121}$ to $R^{123}$ in formula (I). f represents an integer of 1 to 3, and is preferably 1 or 2. As the chain-like tertiary alkyloxycarbonylalkyl group, a tert-butyloxycarbonylmethyl group or a tert-butyloxycarbonylethyl group is preferred.

Of the above groups, the tertiary alkyl group-containing group which does not contain a cyclic structure is preferably a tertiary alkyloxycarbonyl group or a tertiary alkyloxycarbonylalkyl group, is more preferably a tertiary alkyloxycarbonyl group, and is most preferably a tert-butyloxycarbonyl group (t-boc).

[Chemical Formula 33]

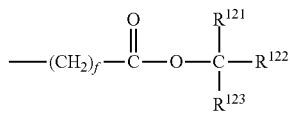

(III)

A tertiary alkyl group-containing group which contains a cyclic structure describes a group that includes a tertiary carbon atom and a cyclic structure within the structure thereof.

In the tertiary alkyl group-containing group which contains a cyclic structure, the cyclic structure preferably contains 4 to 12 carbon atoms, more preferably 5 to 10 carbon atoms, and most preferably 6 to 10 carbon atoms within the ring. Examples of the cyclic structure include groups in which one or more hydrogen atoms have been removed from a monocycloalkane or a polycycloalkane such as a bicycloalkane, tricycloalkane or tetracycloalkane. Preferable examples include groups in which one or more hydrogen atoms have been removed from a monocycloalkane such as cyclopentane or cyclohexane, or a polycycloalkane such as adamantane, norbornane, isobornane, tricyclodecane or tetracyclododecane.

Examples of the tertiary alkyl group-containing group which contains a cyclic structure include groups having the following group (1) or (2) as the tertiary alkyl group:

(1) A group in which a linear or branched alkyl group is bonded to a carbon atom which constitutes part of the ring of a cyclic alkyl group (cycloalkyl group), so that the carbon atom becomes a tertiary carbon atom; and (2) A group in which an alkylene group (branched alkylene group) having a tertiary carbon atom is bonded to a carbon atom which constitutes part of the ring of a cycloalkyl group.

In the above group (1), the linear or branched alkyl group preferably has 1 to 5 carbon atoms, more preferably 1 to 4 carbon atoms, and most preferably 1 to 3 carbon atoms.

Examples of the group (1) include a 1-methyl-1-cycloalkyl group or a 1-ethyl-1-cycloalkyl group, specifically, a 2-methyl-2-adamantyl group, a 2-ethyl-2-adamantyl group.

In other words, when represented by a general formula, as the tertiary alkyl group-containing group which contains a cyclic structure according to the aforementioned group (1), those represented by formula (p0) shown below are preferable, those represented by formula (p0-1) shown below are more preferable, and those represented by formula (p0-1-1) shown below are still more preferable.

[Chemical Formula 34]

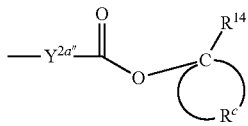

(p0)

[In the formula, $Y^{2a''}$ represents either a single bond or the same divalent linking group as those defined above for $Y^2$ in the aforementioned formula (a1-0-2); $R^{14}$ represents an alkyl group of 1 to 5 carbon atoms; and $R^c$ represents a group which forms an aliphatic cyclic group with the carbon atoms to which this $R^c$ group is bonded.]

Examples of $R^c$ include the same aliphatic cyclic groups as those described above, and a polycyclic aliphatic cyclic group is preferable.

[Chemical Formula 35]

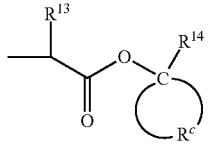

(p0-1)

[In the formula, $R^{13}$ represents a hydrogen atom or a methyl group; $R^{14}$ represents an alkyl group of 1 to 5 carbon atoms; and $R^c$ represents a group which forms an aliphatic cyclic group with the carbon atoms to which this $R^c$ group is bonded.]

[Chemical Formula 36]

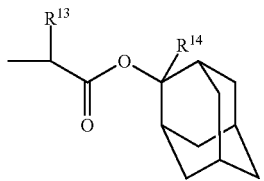

(p0-1-1)

[In the formula, $R^{13}$ represents a hydrogen atom or a methyl group; and $R^{14}$ represents an alkyl group of 1 to 5 carbon atoms.]

In the above group (2), the cycloalkyl group having a branched alkylene group bonded thereto may have a substituent. Examples of the substituent include a fluorine atom, a fluorinated alkyl group of 1 to 5 carbon atoms which is substituted by a fluorine atom, and an oxygen atom (=O).

Examples of the group (2) include groups represented by chemical formula (IV) shown below.

[Chemical Formula 37]

(IV)

In formula (IV), $R^{124}$ represents a cycloalkyl group which may or may not have a substituent. Examples of the substituent which the cycloalkyl group may have include a fluorine atom, a fluorinated alkyl group of 1 to 5 carbon atoms which is substituted by a fluorine atom, and an oxygen atom (=O). As the cycloalkyl group for $R^{124}$, the same cyclic structure as those described above for the tertiary alkyl group-containing group which contains a cyclic structure can be used.

Each of $R^{125}$ and $R^{126}$ independently represents a linear or branched alkyl group.

Examples of the alkyl group include the same alkyl groups as those listed above for $R^{121}$ to $R^{123}$ in the aforementioned formula (I).

Alkoxyalkyl Group

In the structural unit (a8), examples of the alkoxyalkyl group include groups represented by general formula (V) shown below.

[Chemical Formula 38]

(v)

In formula (V), $R^{51}$ represents a linear, branched or cyclic alkyl group.

When $R^{51}$ represents a linear or branched alkyl group, it is preferably an alkyl group of 1 to 5 carbon atoms, more preferably an ethyl group or a methyl group, and is most preferably an ethyl group.

When $R^{51}$ represents a cyclic alkyl group, it preferably has 4 to 15 carbon atoms, more preferably 4 to 12 carbon atoms, and most preferably 5 to 10 carbon atoms. Examples of the cyclic alkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane, or a polycycloalkane such as adamantane, norbornane, isobornane, tricyclodecane or tetracyclododecane. Of these, a group in which one or more hydrogen atoms have been removed from adamantane is preferable.

$R^{52}$ represents a linear or branched alkylene group. The alkylene group preferably has 1 to 5 carbon atoms, more preferably 1 to 3 carbon atoms, and most preferably 1 or 2 carbon atoms.

Of the above possibilities, the alkoxyalkyl group is preferably a group represented by general formula (VI) shown below.

[Chemical Formula 39]

(VI)

In formula (VI), $R^{51}$ is the same as defined above, and each of $R^{53}$ and $R^{54}$ independently represents a linear or branched alkyl group, or a hydrogen atom.

For $R^{53}$ and $R^{54}$, the alkyl group preferably has 1 to 15 carbon atoms, and may be either linear or branched. The alkyl group for $R^{53}$ and $R^{54}$ is preferably an ethyl group or a methyl group, and is most preferably a methyl group.

It is particularly desirable either one of $R^{53}$ and $R^{54}$ be a hydrogen atom, and the other be a methyl group.

Acid Dissociable, Dissolution Inhibiting Group

In the structural unit (a8), there are no particular limitations on the above acid dissociable, dissolution inhibiting group, and any of the multitude of acid dissociable, dissolution inhibiting groups proposed for use within resins for resist compositions designed for use with a KrF excimer laser or ArF excimer laser can be used. Specific examples include the acid dissociable, dissolution inhibiting group (VII) described below.

Examples of the acid dissociable, dissolution inhibiting group (VII) include the same groups as those described above for the acid dissociable, dissolution inhibiting group in the structural unit (a1). Representative examples thereof include groups represented by general formula (VII-b) shown below.

[Chemical Formula 40]

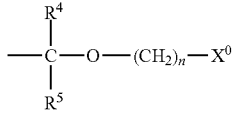

(VII-b)

[In formula (VII-b), $X^0$ represents an aliphatic cyclic group, an aromatic cyclic hydrocarbon group or an alkyl group of 1 to 5 carbon atoms; $R^4$ represents a hydrogen atom or an alkyl group of 1 to 5 carbon atoms, or alternatively, each of $X^0$ and $R^4$ may independently represent an alkylene group of 1 to 5 carbon atoms, wherein $X^0$ and $R^4$ are bonded together; $R^5$ represents a hydrogen atom or an alkyl group of 1 to 5 carbon atoms; and n represents an integer of 0 to 3.]

In general formula (VII-b) above, n represents an integer of 0 to 3, and is preferably an integer of 0 to 2, more preferably 0 or 1, and most preferably 0.

In general formula (VII-b) above, $X^0$ represents an aliphatic cyclic group, an aromatic cyclic hydrocarbon group or an alkyl group of 1 to 5 carbon atoms.

The aliphatic cyclic group for $X^0$ is a monovalent aliphatic cyclic group. The aliphatic cyclic group can use any of the multitude of aliphatic cyclic groups proposed for use within conventional ArF resists. Specific examples of the aliphatic cyclic groups include aliphatic monocyclic groups of 5 to 7 carbon atoms and aliphatic polycyclic groups of 10 to 16 carbon atoms.

The aliphatic cyclic group may or may not have a substituent. Examples of sub stituents include an alkyl group of 1 to 5 carbon atoms, an alkoxy group of 1 to 5 carbon atoms, a fluorine atom, a fluorinated alkyl group of 1 to 5 carbon atoms which is substituted by a fluorine atom, and an oxygen atom (=O).

The basic ring of the aliphatic cyclic group exclusive of substituents is not limited to be constituted from only carbon and hydrogen (not limited to hydrocarbon groups), and may include an oxygen atom or the like in the ring structure.

Examples of the aliphatic monocyclic groups of 5 to 7 carbon atoms include groups in which one hydrogen atom has been removed from a monocycloalkane, and specific examples include groups in which one hydrogen atom has been removed from cyclopentane, cyclohexane or the like.

Examples of the aliphatic polycyclic group of 10 to 16 carbon atoms include groups in which one hydrogen atom has been removed from a bicycloalkane, tricycloalkane, tetracycloalkane or the like. Specific examples include groups in which one hydrogen atom has been removed from a polycycloalkane such as adamantane, norbornane, isobornane, tricyclodecane or tetracyclododecane. Of these, an adamantyl group, a norbornyl group and a tetracyclododecyl group is preferred industrially, and an adamantyl group is particularly desirable.

Examples of the aromatic cyclic hydrocarbon group for $X^0$ include aromatic polycyclic groups of 10 to 16 carbon atoms. Specific examples include groups in which one hydrogen atom has been removed from naphthalene, anthracene, phenanthrene, pyrene or the like. Specific examples include a 1-naphthyl group, a 2-naphthyl group, a 1-anthryl group, a 2-anthryl group, a 1-phenanthryl group, a 2-phenanthryl group, a 3-phenanthryl group and a 1-pyrenyl group, and of these, a 2-naphthyl group is particularly preferred industrially.

Examples of the alkyl group of 1 to 5 carbon atoms for $X^0$ include the same groups as those described above as the alkyl groups of 1 to 5 carbon atoms for $R^{a1}$ in the aforementioned formula (a6-1), and a methyl group or an ethyl group is more preferable, and an ethyl group is most preferable.

In formula (VII-b) above, examples of the alkyl group of 1 to 5 carbon atoms for $R^4$ includes the same groups as those described for the alkyl groups of 1 to 5 carbon atoms for $X^0$. From an industrial perspective, a methyl group or an ethyl group is preferable, and a methyl group is particularly desirable.

$R^5$ represents an alkyl group of 1 to 5 carbon atoms or a hydrogen atom. Examples of the alkyl group of 1 to 5 carbon atoms for $R^5$ include the same groups as those described above for the alkyl group of 1 to 5 carbon atoms for $R^4$. From an industrial perspective, $R^5$ is most preferably a hydrogen atom.

It is particularly desirable that either one of $R^4$ and $R^5$ be a hydrogen atom, and the other be a methyl group.

Further, in the above general formula (VII-b), each of $X^0$ and $R^4$ may independently represent an alkylene group of 1 to 5 carbon atoms, wherein $X^0$ and $R^4$ are bonded together.

In such a case, within the general formula (VII-b), $R^4$, $X^0$, the oxygen atom to which $X^0$ is bonded, and the carbon atom to which the oxygen atom and $R^4$ are bonded form a cyclic group. This cyclic group is preferably a 4- to 7-membered ring, and more preferably a 4- to 6-membered ring. Specific examples of the cyclic group include a tetrahydropyranyl group and a tetrahydrofuranyl group.

In terms of achieving superior resist pattern shape and the like, as the acid dissociable, dissolution inhibiting group (VII), it is preferable that $R^5$ be a hydrogen atom, and $R^4$ be a hydrogen atom or an alkyl group of 1 to 5 carbon atoms.

Specific examples of the acid dissociable, dissolution inhibiting group (VII) include groups in which $X^0$ represents an alkyl group of 1 to 5 carbon atoms, i.e., 1-alkoxyalkyl groups such as a 1-methoxyethyl group, a 1-ethoxyethyl group, a 1-isopropoxyethyl group, a 1-n-butoxyethyl group, a 1-tert-butoxyethyl group, a methoxymethyl group, an ethoxymethyl group, an isopropoxymethyl group, an n-butoxymethyl group and a tert-butoxymethyl group.

—Organic Group that Contains an Acid Dissociable, Dissolution Inhibiting Group

In the present description, an "organic group that contains an acid-dissociable, dissolution inhibiting group" refers to a group composed of an acid dissociable, dissolution inhibiting group, and a group or atom that does not dissociate under the action of acid (namely a group or atom that does not dissociate under the action of acid, but rather remains bonded to the component (A1) following dissociation of the acid dissociable, dissolution inhibiting group).

There are no particular limitations on the organic group that contains an acid dissociable, dissolution inhibiting group, which may be selected appropriately from the multitude of groups that have been proposed for the resins of resist compositions designed for use with a KrF excimer laser or ArF excimer laser or the like. Specific examples include organic groups that contain an acid dissociable, dissolution inhibiting group described above. For example, an example of an organic group that contains the acid dissociable, dissolution inhibiting group (VII) is an organic group (VIII) containing an acid dissociable, dissolution inhibiting group shown below.

Examples of the organic group containing acid dissociable, dissolution inhibiting group (VIII) include groups represented by general formula (VIII) shown below.

In the organic group (VIII) having such a structure, when acid is generated from the component (B) upon exposure, the action of the acid causes a cleavage of the bond between the oxygen atom bonded to Q, and the carbon atom to which $R^4$ and $R^5$ are bonded, causing dissociation of the group —$C(R^4)(R^5)$—$OX^0$.

[Chemical Formula 41]

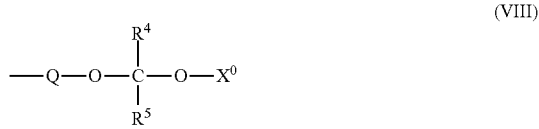

(VIII)

[In formula (VIII), $X^0$ represents an aliphatic cyclic group, an aromatic cyclic hydrocarbon group or an alkyl group of 1 to 5 carbon atoms; $R^4$ represents a hydrogen atom or an alkyl group of 1 to 5 carbon atoms; or alternatively, each of $X^0$ and $R^4$ may independently represent an alkylene group of 1 to 5 carbon atoms, wherein $X^0$ and $R^4$ are bonded together; $R^5$ represents an alkyl group of 1 to 5 carbon atoms or a hydrogen atom; and Q represents a divalent aliphatic cyclic group.]

In general formula (VIII) above, X0, $R^4$ and $R^5$ are the same as defined above for $X^0$, $R^4$ and $R^5$ in the above general formula (VII-b), respectively.

Examples of the divalent aliphatic cyclic group for Q include groups in which an additional one hydrogen atom has been removed from the aliphatic cyclic group described above for $X^0$.

Of the above possibilities, the hydrogen atom of hydroxyl group within the structural unit (a8) is preferably protected by substitution with a tertiary alkyl group-containing group, and is more preferably protected by substitution with a group represented by general formula (II) or (p0) above.

As the structural unit (a8), one type of structural unit may be used alone, or two or more types of structural units may be used in combination.

When the structural unit (a8) is included in the component (A1), the amount of the structural unit (a8) within the component (A1), based on the combined total of all the structural units that constitute the component (A1), is preferably within the range from 1 to 40 mol %, more preferably from 5 to 40 mol %, still more preferably from 15 to 40 mol %, and most preferably from 20 to 40 mol %. By ensuring that the amount is at least as large as the lower limit of the above range, the solubility of the component (A1) in organic solvents can be improved. On the other hand, by ensuring that the amount is not more than the upper limit of the above range, a good balance can be achieved with the other structural units.

(Other Structural Units)

The component (A1) may also have a structural unit (hereafter, referred to as a structural unit (a4)) which is other than the above-mentioned structural units (a1) to (a3) and (a5) to (a8), as long as the effects of the present invention are not impaired.

As the structural unit (a4), any other structural unit which cannot be classified as one of the above structural units (a1) to (a3) and (a5) to (a8) can be used without any particular limitations, and any of the multitude of conventional structural units used within resist resins for ArF excimer lasers or KrF excimer lasers (and particularly for ArF excimer lasers) can be used.

As the structural unit (a4), for example, a structural unit derived from an acrylate ester containing a non-acid-dissociable aliphatic polycyclic group is preferable. Examples of this polycyclic group include the same groups as those described above in connection with the aforementioned structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecanyl group, adamantyl group, tetracyclododecanyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a4-5) shown below.

[Chemical Formula 42]

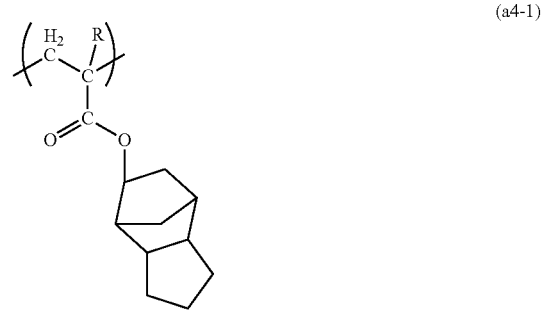

(a4-1)

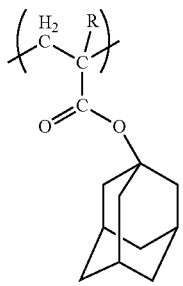
(a4-2)

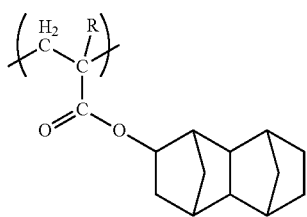
(a4-3)

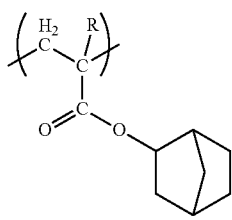
(a4-4)

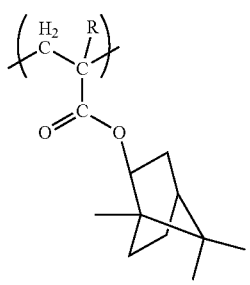
(a4-5)

[In the formulas, R is the same as defined above.]

As the structural unit (a4), one type of structural unit may be used alone, or two or more types of structural units may be used in combination.

When the structural unit (a4) is included in the component (A1), the amount of the structural unit (a4), based on the combined total of all the structural units that constitute the component (A1), is preferably within the range from 1 to 20 mol %, more preferably from 1 to 15 mol %, and still more preferably from 1 to 10 mol %.

The component (A1) is preferably a copolymer containing the structural unit (a1).

Examples of such copolymers include a copolymer consisting of the structural units (a1) and (a3); a copolymer consisting of the structural units (a1), (a3) and (a5); a copolymer consisting of the structural units (a1), (a2) and (a3); a copolymer consisting of the structural units (a1), (a2), (a3) and (a5); a copolymer consisting of the structural units (a6) and (a8); and a copolymer consisting of the structural units (a6), (a7) and (a8).

Among the above examples, the component (A1) is preferably a copolymer containing the structural units (a1), (a3) and (a4), and most preferably a copolymer containing the structural units (a1), (a3) and (a5) or a copolymer containing the structural units (a1), (a2), (a3) and (a5).

In the present invention, it is particularly desirable that the component (A1) include a combination of structural units shown in general formulas (A1-11) and (A-12) shown below.

[Chemical Formula 43]

(A1-11)

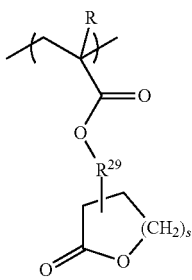 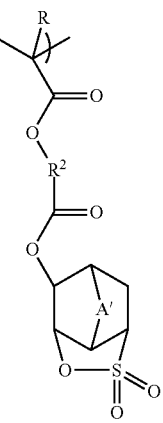

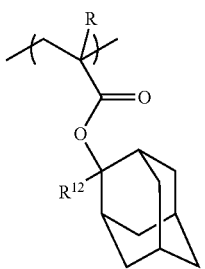 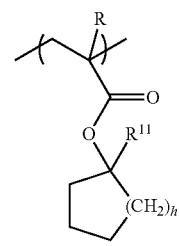

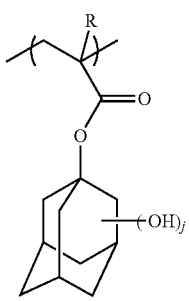

[In the formulas, R, $R^{29}$, s", $R^2$, A', $R^{12}$, $R^{11}$, h and j are the same as defined above; and the plurality of R groups in the formula may be the same, or may be different from each other.]

[Chemical Formula 44]

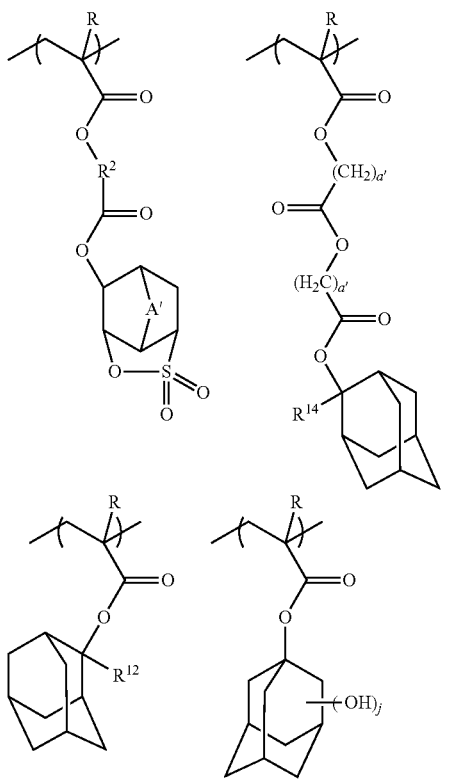

(A1-12)

[In the formulas, R, $R^2$, A', $R^{14}$, a', $R^{12}$ and j are the same as defined above; and the plurality of R groups and a' groups in the formula may be the same, or may be different from each other.]

The weight average molecular weight (Mw) (the polystyrene equivalent value determined by gel permeation chromatography) of the component (A1) is not particularly limited, but is preferably within a range from 1,000 to 50,000, more preferably from 1,500 to 30,000, and most preferably from 2,500 to 20,000. By ensuring that the weight average molecular weight is not more than the upper limit of the above-mentioned range, the component (A1) exhibits satisfactory solubility in a resist solvent when used as a resist. On the other hand, ensuring that the weight average molecular weight is at least as large as the lower limit of the above-mentioned range yields more favorable dry etching resistance and cross-sectional shape for the resist pattern.

Further, the dispersity (Mw/Mn) of the component (A1) is not particularly limited, and is preferably within a range from 1.0 to 5.0, more preferably from 1.0 to 3.0, and most preferably from 1.2 to 2.5. Here, Mn represents the number average molecular weight.

In the component (A), as the component (A1), one type may be used alone, or two or more types of compounds may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, various lithography properties are improved.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—$CH_2$—$CH_2$—$CH_2$—$C(CF_3)_2$—OH, a —$C(CF_3)_2$—OH group can be introduced at the terminals of the component (A1). Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

As the monomers for deriving the corresponding structural units, commercially available monomers may be used, or the monomers may be synthesized by a conventional method.

For example, as a monomer for deriving the structural unit (a5), a compound represented by general formula (a5-1-0) shown below (hereafter, referred to as "compound (a5-1-0)") can be used.

[Chemical Formula 45]

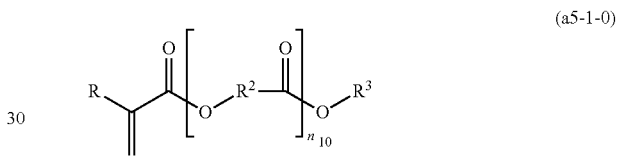

(a5-1-0)

[In the formula, R and $R^2$ are the same as defined above; and $R^3$ represents a group having a sultone structure.]

A sultone structure refers to a cyclic group that contains —O—$SO_2$— within the ring skeleton thereof, that is, a ring structure in which —O—S— within —O—$SO_2$— forms a portion of the ring skeleton.

The method for producing the compound (a5-1-0) is not particularly limited, and the compound (I) can be produced by a conventional method.

For example, in the presence of a condensing agent and a base, a compound (X-2) represented by general formula (X-2) shown below is added to a solution obtained by dissolving a compound (X-1) represented by general formula (X-1) shown below in a reaction solvent, and a reaction is effected to thereby obtain the above compound (a5-1-0).

Examples of the base include inorganic bases such as sodium hydride, $K_2CO_3$ and $Cs_2CO_3$; and organic bases such as triethylamine, 4-dimethylaminopyridine (DMAP) and pyridine. Examples of the condensing agents include carbodiimide reagents such as ethyldiisopropylaminocarbodiimide hydrochloride (EDCI), dicyclohexylcarboxyimide (DCC), diisopropylcarbodiimide and carbodiimidazole; tetraethyl pyrophosphate; and benzotriazole-N-hydroxytrisdimethylaminophosphonium hexafluorophosphide (Bop reagent).

If desired, an acid may be used. As the acid, any acid generally used for dehydration/condensation reactions and the like may be used. Specific examples include inorganic acids such as hydrochloric acid, sulfuric acid and phosphoric acid; and organic acids such as methanesulfonic acid, trifluoromethanesulfonic acid, benzenesulfonic acid and p-toluenesulfonic acid. These acids may be used alone, or in combinations containing two or more different acids.

[Chemical Formula 46]

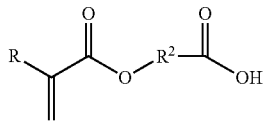
(X-1)

(X-2)

[In the formulas, R, $R^2$ and $R^3$ are the same as defined above.]

[Component (A2)]

As the component (A2), a low molecular weight compound that has a molecular weight of at least 500 but less than 2,500, contains a hydrophilic group, and also contains an acid dissociable, dissolution inhibiting group such as the groups mentioned above in the description of the component (A1) is preferred. Specific examples of the component (A2) include compounds containing a plurality of phenol structures, in which a portion of the hydroxyl group hydrogen atoms have been substituted with an aforementioned acid dissociable, dissolution inhibiting groups.

Preferred examples of the component (A2) include low molecular weight phenolic compounds in which a portion of the hydroxyl group hydrogen atoms have been substituted with an aforementioned acid dissociable, dissolution inhibiting group. These types of compounds are known, for example, as sensitizers or heat resistance improvers for use in non-chemically amplified g-line or i-line resists.

Specific examples of the low molecular weight phenolic compounds include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers to hexamers of formalin condensation products of phenols such as phenol, m-cresol, p-cresol and xylenol. It goes without saying that the low molecular weight phenolic compound is not limited to these examples. Among these examples, in terms of achieving excellent resolution and line width roughness (LWR), a phenolic compound having 2 to 6 triphenylmethane skeletons is particularly desirable.

Also, there are no particular limitations on the acid dissociable, dissolution inhibiting group, and suitable examples include the groups described above.

As the component (A2), one type of compound may be used alone, or two or more types of compounds may be used in combination.

In the resist composition of the present invention, as the component (A), one type of component may be used alone, or two or more types of components may be used in combination.

Of the various possibilities described above, the component (A) preferably includes the component (A1).

In the resist composition of the present invention, the amount of the component (A) can be appropriately adjusted depending on factors such as the thickness of the resist film that is to be formed.

<Component (B)>

As the component (B), there is no particular limitation, and any of the known acid generators used in conventional chemically amplified resist compositions can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators.

As an onium salt-based acid generator, for example, a compound represented by general formula (b-1) or (b-2) shown below can be used.

[Chemical Formula 47]

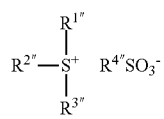
(b-1)

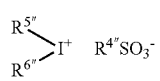
(b-2)

[In the formulas, $R^{1''}$ to $R^{3''}$, $R^{5''}$ and $R^{6''}$ each independently represents an aryl group or alkyl group, wherein two of $R^{1''}$ to $R^{3''}$ in formula (b-1) may be bonded to each other to form a ring with the sulfur atom in the formula; and $R^{4''}$ represents an alkyl group, a halogenated alkyl group, an aryl group or an alkenyl group which may have a substituent, with the proviso that at least one of $R^{1''}$ to $R^{3''}$ represents an aryl group, and at least one of $R^{5''}$ and $R^{6''}$ represents an aryl group.]

In formula (b-1), $R^{1''}$ to $R^{3''}$ each independently represents an aryl group or an alkyl group. In formula (b-1), two of $R^{1''}$ to $R^{3''}$ may be bonded to each other to form a ring with the sulfur atom in the formula.

Further, among $R^{1''}$ to $R^{3''}$, at least one group represents an aryl group. Among $R^{1''}$ to $R^{3''}$, two or more groups are preferably aryl groups, and it is particularly desirable that all of $R^{1''}$ to $R^{3''}$ are aryl groups.

The aryl group for $R^{1''}$ to $R^{3''}$ is not particularly limited. For example, an aryl group having 6 to 20 carbon atoms may be used, in which part or all of the hydrogen atoms of the aryl group may or may not be substituted with alkyl groups, alkoxy groups, halogen atoms or hydroxyl groups.

The aryl group is preferably an aryl group having 6 to 10 carbon atoms because it can be synthesized at a low cost. Specific examples thereof include a phenyl group and a naphthyl group.

The alkyl group with which hydrogen atoms of the aryl group may be substituted is preferably an alkyl group having 1 to 5 carbon atoms, and most preferably a methyl group, an ethyl group, a propyl group, an n-butyl group, or a tert-butyl group.

The alkoxy group with which hydrogen atoms of the aryl group may be substituted is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The halogen atom with which hydrogen atoms of the aryl group may be substituted is preferably a fluorine atom.

The alkyl group for $R^{1\prime\prime}$ to $R^{3\prime\prime}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decyl group, and a methyl group is particularly preferable because it yields excellent resolution and enables synthesis to be performed at low cost.

When two of $R^{1\prime\prime}$ to $R^{3\prime\prime}$ in formula (b-1) are bonded to each other to form a ring with the sulfur atom in the formula, it is preferable that the two of $R^{1\prime\prime}$ to $R^{3\prime\prime}$ form a 3- to 10-membered ring including the sulfur atom, and it is particularly desirable that the two of $R^{1\prime\prime}$ to $R^{3\prime\prime}$ form a 5- to 7-membered ring including the sulfur atom.

When two of $R^{1\prime\prime}$ to $R^{3\prime\prime}$ in formula (b-1) are bonded to each other to form a ring with the sulfur atom in the formula, the remaining one of $R^{1\prime\prime}$ to $R^{3\prime\prime}$ is preferably an aryl group. Examples of the aryl group include the same groups as the aryl groups mentioned above for $R^{1\prime\prime}$ to $R^{3\prime\prime}$.

Preferred examples of the cation moiety for the compound represented by general formula (b-1) include cation moieties represented by formulas (I-1-1) to (I-1-10) shown below. Among these, a cation moiety having a triphenylmethane skeleton, such as a cation moiety represented by any one of formulas (I-1-1) to (I-1-8) shown below is particularly desirable.

In formulas (I-1-9) and (I-1-10), each of $R^9$ and $R^{10}$ independently represents a phenyl group or naphthyl group which may have a substituent, an alkyl group of 1 to 5 carbon atoms, an alkoxy group or a hydroxyl group.

u is an integer of 1 to 3, and most preferably 1 or 2.

[Chemical Formula 48]

(I-1-1)

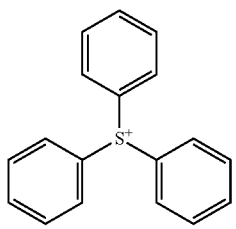

(I-1-2)

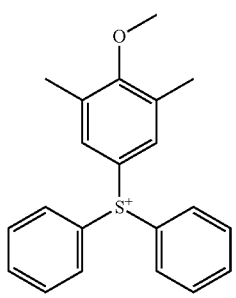

(I-1-3)

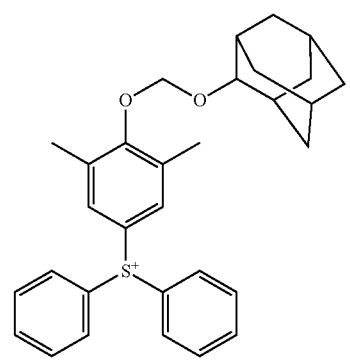

(I-1-4)

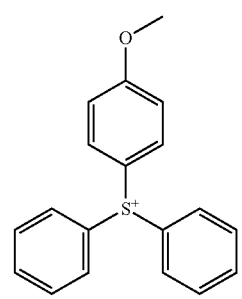

(I-1-5)

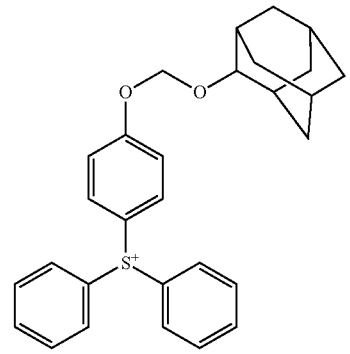

(I-1-6)

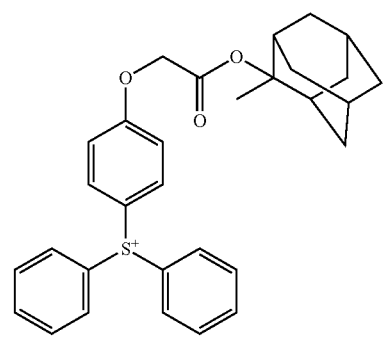

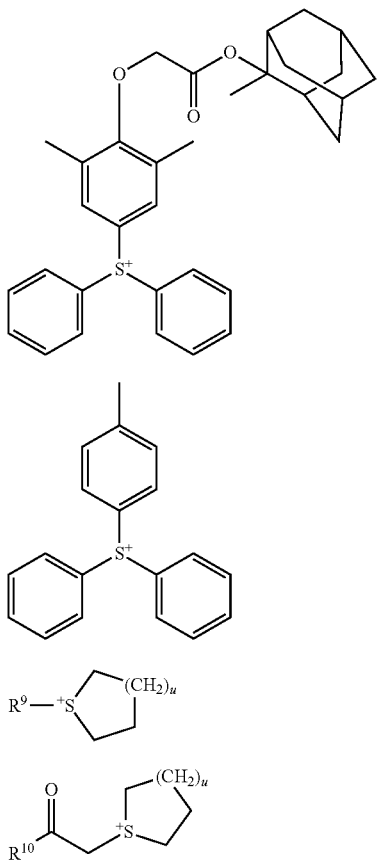

(I-1-7)

(I-1-8)

(I-1-9)

(I-1-10)

$R^{4'''}$ represents an alkyl group, a halogenated alkyl group, an aryl group or an alkenyl group which may have a substituent.

The alkyl group for $R^{4'''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

Examples of the halogenated alkyl group for $R^{4'''}$ include groups in which part or all of the hydrogen atoms of an aforementioned linear, branched or cyclic alkyl group have been substituted with halogen atoms. Examples of the halogen atom include a fluorine atom, a chlorine atom, a bromine atom and an iodine atom, and a fluorine atom is preferable.

In the halogenated alkyl group, the percentage of the number of halogen atoms based on the total number of halogen atoms and hydrogen atoms within the halogenated alkyl group (namely, the halogenation ratio (%)) is preferably within a range from 10 to 100%, more preferably from 50 to 100%, and most preferably 100%. A higher halogenation ratio is preferable because the acid strength increases.

The aryl group for $R^{4'''}$ is preferably an aryl group of 6 to 20 carbon atoms.

The alkenyl group for $R^{4'''}$ is preferably an alkenyl group of 2 to 10 carbon atoms.

With respect to $R^{4'''}$, the expression "may have a substituent" means that part or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4'''}$ may have one substituent, or two or more substituents.

Examples of the substituent include a halogen atom, a hetero atom, an alkyl group, and a group represented by the formula $X-Q^1-$ (in the formula, $Q^1$ represents a divalent linking group containing an oxygen atom; and X represents a hydrocarbon group of 3 to 30 carbon atoms which may have a substituent).

Examples of the halogen atoms and alkyl groups as substituents for $R^{4'''}$ include the same halogen atoms and alkyl groups as those described above with respect to the halogenated alkyl group for $R^{4'''}$.

Examples of the hetero atoms include an oxygen atom, a nitrogen atom, and a sulfur atom.

In the group represented by formula $X-Q^1-$, $Q^1$ represents a divalent linking group containing an oxygen atom.

$Q^1$ may contain an atom other than the oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an amide bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group.

Specific examples of the combinations of the aforementioned non-hydrocarbon, hetero atom-containing linking groups and an alkylene group include —$R^{91}$—O—, —$R^{92}$—O—C(=O)— and —C(=O)—O—$R^{93}$—O—C(=O)— (in the formulas, each of $R^{91}$ to $R^{93}$ independently represents an alkylene group).

The alkylene group for $R^{91}$ to $R^{93}$ is preferably a linear or branched alkylene group, and the alkylene group preferably has 1 to 12 carbon atoms, more preferably 1 to 5 carbon atoms, and most preferably 1 to 3 carbon atoms.

Specific examples of alkylene groups include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—].

$Q^1$ is preferably a divalent linking group containing an ester bond or ether bond, and more preferably a group represented by —$R^{91}$—O—, —$R^{92}$—O—C(=O)— or —C(=O)—O—$R^{93}$—O—C(=O)—.

In the group represented by the formula $X-Q^1-$, the hydrocarbon group for X may be either an aromatic hydrocarbon group or an aliphatic hydrocarbon group.

The aromatic hydrocarbon group is a hydrocarbon group having an aromatic ring. The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of carbon atoms within a substituent(s) is not included in the number of carbon atoms of the aromatic hydrocarbon group.

Specific examples of the aromatic hydrocarbon groups include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atoms, more preferably 1 or 2 carbon atoms, and most preferably 1 carbon atom.

The aromatic hydrocarbon group may have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which a part of the carbon atoms constituting the ring within the aforementioned aryl group has been substituted with a hetero atom such as an oxygen atom, a sulfur atom or a nitrogen atom, and a heteroarylalkyl group in which a part of the carbon atoms constituting the aromatic hydrocarbon ring within the aforementioned arylalkyl group has been substituted with the aforementioned hetero atom can be used.

In the latter example, as the sub stituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the sub stituent for the aromatic hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Examples of the halogenated alkyl group as the substituent for the aromatic hydrocarbon group includes a group in which part or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be any of linear, branched or cyclic.

In the aliphatic hydrocarbon group for X, a part of the carbon atoms constituting the aliphatic hydrocarbon group may be substituted with a substituent group containing a hetero atom, or a part or all of the hydrogen atoms constituting the aliphatic hydrocarbon group may be substituted with a sub stituent group containing a hetero atom.

As the "hetero atom" for X, there is no particular limitation as long as it is an atom other than a carbon atom and a hydrogen atom. Examples of the hetero atoms include a halogen atom, an oxygen atom, a sulfur atom and a nitrogen atom. Examples of the halogen atom include a fluorine atom, a chlorine atom, an iodine atom and a bromine atom.

The substituent group containing a hetero atom may consist solely of the hetero atom, or may be a group containing a group or atom other than the hetero atom.

Specific examples of the substituent group for substituting a part of the carbon atoms include —O—, —C(=O)—O—, —C(=O)—, —O—C(=O)—O—, —C(=O)—NH—, —NH— (wherein H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups within the ring structure.

Examples of the substituent group for substituting a part or all of the hydrogen atoms include an alkoxy group, a halogen atom, a halogenated alkyl group, a hydroxyl group, an oxygen atom (=O) and a cyano group.

The alkoxy group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom include a fluorine atom, a chlorine atom, a bromine atom and an iodine atom, and a fluorine atom is preferable.

Examples of the halogenated alkyl group include a group in which a part or all of the hydrogen atoms within an alkyl group of 1 to 5 carbon atoms (such as a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15 carbon atoms, and most preferably 1 to 10 carbon atoms. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15 carbon atoms, and most preferably 3 to 10 carbon atoms. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

Examples of the aliphatic cyclic group include groups in which one or more hydrogen atoms have been removed from a monocycloalkane or a polycycloalkane such as a bicycloalkane, tricycloalkane or tetracycloalkane. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing sub stituent group in the ring structure thereof, the aliphatic cyclic group is preferably a polycyclic group, more preferably a group in which one or more hydrogen atoms have been removed from a polycycloalkane, and most preferably a group in which one or more hydrogen atoms have been removed from adamantane.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic include the aliphatic cyclic groups represented by formulas (L1) to (L5) and (S1) to (S4) shown below.

[Chemical Formula 49]

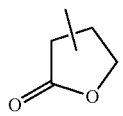
(L1)

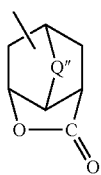
(L2)

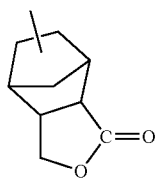
(L3)

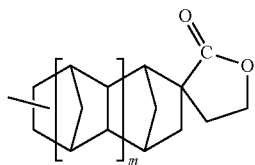
(L4)

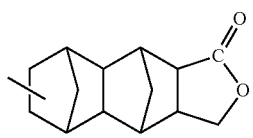
(L5)

-continued

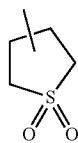
(S1)

(S2)

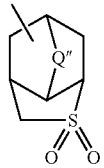
(S3)

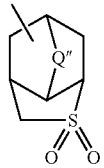
(S4)

[In the formulas, Q″ represents an alkylene group of 1 to 5 carbon atoms, —O—, —S—, —O—R$^{94}$— or —S—R$^{95}$— (wherein each of R$^{94}$ and R$^{95}$ independently represents an alkylene group of 1 to 5 carbon atoms); and m represents an integer of 0 or 1.]

In the formula, examples of the alkylene groups for Q″, R$^{94}$ and R$^{95}$ include the same alkylene groups as those described above for R$^{91}$ to R$^{93}$.

In these aliphatic cyclic groups, part of the hydrogen atoms bonded to the carbon atoms that constitute the ring structure may be substituted with a sub stituent. Examples of the sub stituent include an alkyl group, an alkoxy group, a halogen atom, a halogenated alkyl group, a hydroxyl group and an oxygen atom (=O).

As the alkyl group, an alkyl group of 1 to 5 carbon atoms is preferable, and a methyl group, an ethyl group, a propyl group, an n-butyl group or a tert-butyl group is particularly desirable.

Examples of the alkoxy group and the halogen atom include the same groups as those described above for the substituent group used for substituting part or all of the hydrogen atoms.

In the present invention, X is preferably a cyclic group which may have a substituent. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent or a phenyl group which may have a substituent is preferable.

As the aliphatic cyclic group which may have a substituent, an aliphatic polycyclic group which may have a substituent is preferable. As this aliphatic polycyclic group, groups in which one or more hydrogen atoms have been removed from an aforementioned polycycloalkane, and groups represented by formulas (L2) to (L5), and (S3) and (S4) above, and the like are preferable.

In the present invention, $R^{4'''}$ preferably has X-$Q^1$- as a substituent. In such a case, $R^{4'''}$ is preferably a group represented by the formula X-$Q^1$-$Y^1$— (in the formula, $Q^1$ and X are the same as defined above; and $Y^1$ represents an alkylene group of 1 to 4 carbon atoms which may have a substituent, or a fluorinated alkylene group of 1 to 4 carbon atoms which may have a sub stituent).

In the group represented by the formula X-$Q^1$-$Y^1$—, examples of the alkylene group for $Y^1$ include the same alkylene group as those described above for $Q^1$ in which the number of carbon atoms is from 1 to 4.

Examples of the fluorinated alkylene group for $Y^1$ include groups in which part or all of the hydrogen atoms of an aforementioned alkylene group have been substituted with fluorine atoms.

Specific examples of $Y^1$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)CF_2CF_3)$—; —CHF—, —$CH_2CF_2$—, —$CH_2CH_2CF_2$—, —$CH2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—, —$CH_2$—, —$CH_2CH_2$—, —$CH_2CH_2CH_2$—, —$CH(CH_3)CH_2$—; —$CH(CH_2CH_3)$—, —$C(CH_3)_2$—, —$CH_2CH_2CH_2CH_2$—, —$CH(CH_3)CH_2CH_2$—, —$CH_2CH(CH_3)CH_2$—, —$CH(CH_3)CH(CH_3)$—, —$C(CH_3)_2CH_2$—, —$CH(CH_2CH_3)CH_2$—, —$CH(CH_2CH_2CH_3)$—, and —$C(CH_3)(CH_2CH_3)$—.

$Y^1$ is preferably a fluorinated alkylene group, and particularly preferably a fluorinated alkylene group in which the carbon atom bonded to the adjacent sulfur atom is fluorinated. Examples of such fluorinated alkylene groups include —$CF_2$—, —$CF_2CF_2$—, —$CF_2CF_2CF_2$—, —$CF(CF_3)CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—; —$CH_2CF_2$—, —$CH_2CH_2CF_2$—, —$CH_2CF_2CF_2$—; —$CH_2CH_2CH_2CF_2$—, —$CH_2CH_2CF_2CF_2$— and —$CF_2CF_2CF_2$—.

Of these, —$CF_2$—, —$CF_2CF_2$—, —$CF_2CF_2CF_2$— or $CH_2CF_2CF_2$— is preferable, —$CF_2$—, —$CF_2CF_2$—or —$CF_2CF_2CF_2$— is more preferable, and —$CF_2$— is particularly desirable.

The alkylene group or fluorinated alkylene group may have a substituent. The expression that the alkylene group or fluorinated alkylene group "may have a substituent" means that part or all of the hydrogen atoms or fluorine atoms in the alkylene group or fluorinated alkylene group may be substituted, either with atoms other than hydrogen atoms and fluorine atoms, or with groups.

Examples of substituents which the alkylene group or fluorinated alkylene group may have include an alkyl group of 1 to 4 carbon atoms, an alkoxy group of 1 to 4 carbon atoms, and a hydroxyl group.

In formula (b-2), $R^{5'''}$ and $R^{6'''}$ each independently represents an aryl group or an alkyl group. At least one of $R^{5'''}$ and $R^{6'''}$ represents an aryl group. It is preferable that both of $R^{5'''}$ and $R^{6'''}$ represent aryl groups.

Examples of the aryl group for $R^{5'''}$ and $R^{6'''}$ include the same aryl groups as those listed above for $R^{1'''}$ to $R^{3'''}$.

Examples of the alkyl group for $R^{5'''}$ and $R^{6'''}$ include the same alkyl groups as those listed above for $R^{1'''}$ to $R^{3'''}$.

It is particularly desirable that both of $R^{5'''}$ and $R^{6'''}$ represent phenyl groups.

As $R^{4'''}$ in formula (b-2), the same groups as those mentioned above for $R^{4'''}$ in formula (b-1) can be used.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts has been replaced by an alkylsulfonate, such as methanesulfonate, n-propanesulfonate, n-butanesulfonate, n-octanesulfonate, 1-adamantanesulfonate, 2-norbornanesulfonate, d-camphor-10-sulfonate, benzenesulfonate, perfluorobenzenesulfonate, or p-toluenesulfonate.

Furthermore, onium salts in which the anion moiety of these onium salts has been replaced by an anion moiety represented by any one of formulas (b1) to (b8) shown below can also be used.

[Chemical Formula 50]

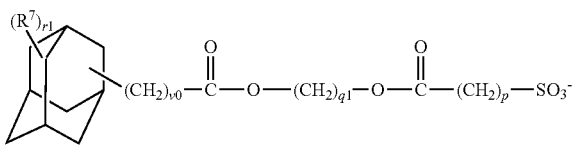
(b1)

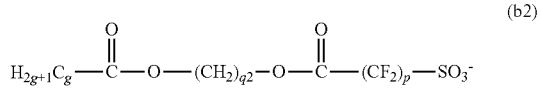
(b2)

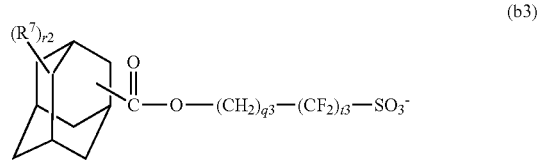
(b3)

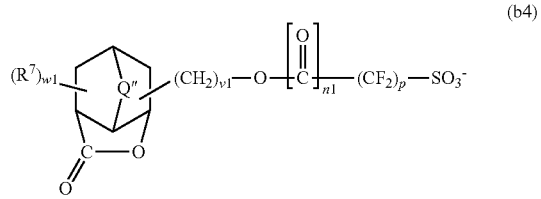
(b4)

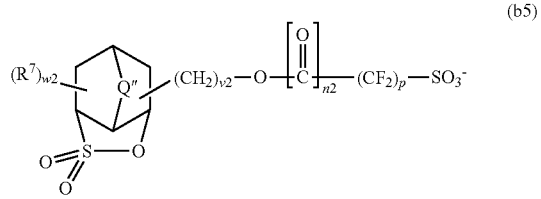
(b5)

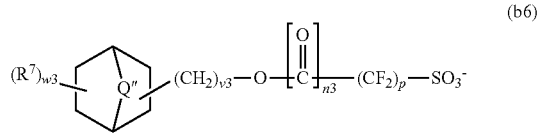
(b6)

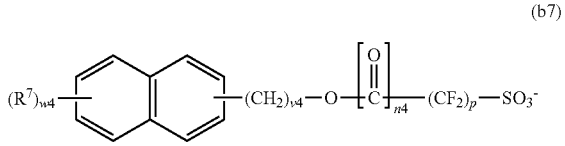
(b7)

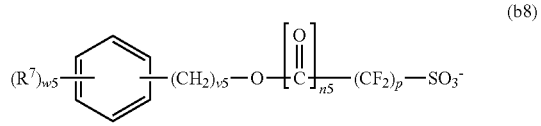
(b8)

[In the formulas, p represents an integer of 1 to 3; each of q1 and q2 independently represents an integer of 1 to 5; q3 represents an integer of 1 to 12; t3 represents an integer of 1 to 3; each of r1 and r2 independently represents an integer of 0 to 3; g represents an integer of 1 to 20; $R^7$ represents a substituent; each of n1 to n5 independently represents 0 or 1; each of v0 to v5 independently represents an integer of 0 to 3; each of w1 to w5 independently represents an integer of 0 to 3; and Q" is the same as defined above.]

Examples of the substituent for $R^7$ include the same groups as those which the aforementioned aliphatic hydrocarbon group or aromatic hydrocarbon group for X may have as a substituent.

If there are two or more of the $R^7$ group, as indicated by the values r1 and r2, and w1 to w5, then the two or more of the $R^7$ groups may be the same or different from each other.

Further, as the onium salt-based acid generators, onium salt-based acid generators in which the anion moiety in general formula (b-1) or (b-2) has been replaced by an anion moiety represented by general formula (b-3) or (b-4) shown below (the cation moiety is the same as (b-1) or (b-2)) can also be used.

[Chemical Formula 51]

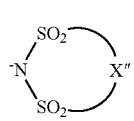
(b-3)

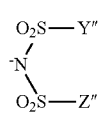
(b-4)

[In the formulas, X" represents an alkylene group of 2 to 6 carbon atoms in which at least one hydrogen atom has been substituted with a fluorine atom; and each of Y" and Z" independently represents an alkyl group of 1 to 10 carbon atoms in which at least one hydrogen atom has been substituted with a fluorine atom.]

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Each of Y" and Z" independently represents a linear or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

The smaller the number of carbon atoms of the alkylene group for X" or those of the alkyl group for Y" and Z" within the above-mentioned range of the number of carbon atoms, the more the solubility in a resist solvent is improved.

Further, in the alkylene group for X" or the alkyl group for Y" and Z", it is preferable that the number of hydrogen atoms substituted with fluorine atoms is as large as possible because the acid strength increases and the transparency to high energy radiation of 200 nm or less or electron beam is improved. The fluorination ratio of the alkylene group or alkyl group is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Furthermore, as an onium salt-based acid generator, a sulfonium salt having a cation moiety represented by general formula (b-5) or (b-6) shown below may also be used.

[Chemical Formula 52]

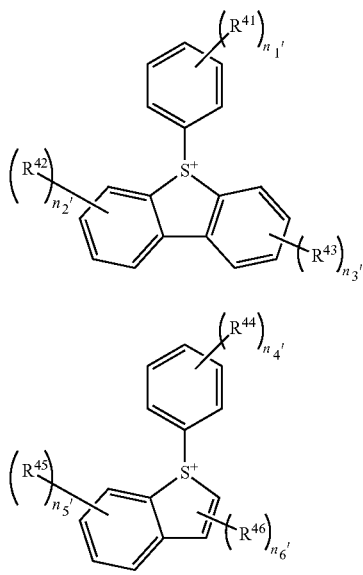

[In the formulas, each of $R^{41}$ to $R^{46}$ independently represents an alkyl group, an acetyl group, an alkoxy group, a carboxy group, a hydroxyl group or a hydroxyalkyl group; each of $n_1'$ to $n_5'$ independently represents an integer of 0 to 3; and $n_6'$ represents an integer of 0 to 2.]

With respect to $R^{41}$ to $R^{46}$, the alkyl group is preferably an alkyl group of 1 to 5 carbon atoms, more preferably a linear or branched alkyl group, and most preferably a methyl group, an ethyl group, a propyl group, an isopropyl group, an n-butyl group or a tert-butyl group.

The alkoxy group is preferably an alkoxy group of 1 to 5 carbon atoms, more preferably a linear or branched alkoxy group, and most preferably a methoxy group or an ethoxy group.

The hydroxyalkyl group is preferably the aforementioned alkyl group in which one or more hydrogen atoms have been substituted with hydroxy groups, and examples thereof include a hydroxymethyl group, a hydroxyethyl group and a hydroxypropyl group.

If there are two or more of an individual $R^{41}$ to $R^{46}$ group, as indicated by the corresponding value of $n_1'$ to $n_6'$, then the two or more of the individual $R^{41}$ to $R^{46}$ group may be the same or different from each other.

$n_1'$ is preferably 0 to 2, more preferably 0 or 1, and still more preferably 0.

It is preferable that $n_2'$ and $n_3'$ each independently represent 0 or 1, and more preferably 0.

$n_4'$ is preferably 0 to 2, and more preferably 0 or 1.

$n_5'$ is preferably 0 or 1, and more preferably 0.

$n_6'$ is preferably 0 or 1, and more preferably 1.

The anion moiety of the sulfonium salt having a cation moiety represented by general formula (b-5) or (b-6) is not particularly limited, and the same anion moieties for onium salt-based acid generators which have been proposed may be used. Examples of such anion moieties include fluorinated alkylsulfonic acid ions such as anion moieties ($R^{4'''}SO_3^-$) for onium salt-based acid generators represented by general formula (b-1) or (b-2) shown above; and anion moieties represented by general formula (b-3) or (b-4) shown above. $R^{4'''}$ is the same as defined above.

In the present description, an oxime sulfonate-based acid generator is a compound having at least one group represented by general formula (B-1) shown below, and has a feature of generating acid by irradiation. Such oxime sulfonate-based acid generators are widely used for a chemically amplified resist composition, and can be appropriately selected.

[Chemical Formula 53]

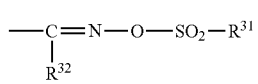

(B-1)

[In formula (B-1), each of $R^{31}$ and $R^{32}$ independently represents an organic group.]

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, or a halogen atom (such as a fluorine atom and a chlorine atom) and the like).

As the organic group for $R^{31}$, a linear, branched, or cyclic alkyl group or aryl group is preferable. The alkyl group or the aryl group may have a substituent. The substituent is not particularly limited, and examples thereof include a fluorine atom and a linear, branched or cyclic alkyl group having 1 to 6 carbon atoms. The alkyl group or the aryl group "has a substituent" means that part or all of the hydrogen atoms of the alkyl group or the aryl group is substituted with a substituent.

The alkyl group preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which part of the hydrogen atoms are substituted with halogen atoms and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, aryl group, or cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 54]

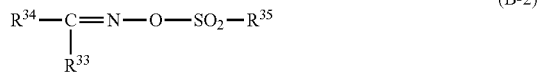

(B-2)

[In formula (B-2), $R^{33}$ represents a cyano group, an alkyl group having no substituent or a halogenated alkyl group; $R^{34}$ represents an aryl group; and $R^{35}$ represents an alkyl group having no substituent or a halogenated alkyl group.]

[Chemical Formula 55]

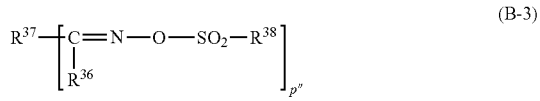

(B-3)

[In formula (B-3), $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.]

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more, and most preferably 90% or more.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group, and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the sub stituent preferably has 1 to 8 carbon atoms, and more preferably 1 to 4 carbon atoms. Further, the halogenated alkyl group is preferably a fluorinated alkyl group.

The alkyl group having no sub stituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more, still more preferably 90% or more. A completely fluorinated alkyl group in which 100% of the hydrogen atoms are substituted with fluorine atoms is particularly desirable.

In general formula (B-3), as the alkyl group having no substituent and the halogenated alkyl group for $R^{36}$, the same alkyl group having no substituent and the halogenated alkyl group as those described above for $R^{33}$ can be used.

Examples of the divalent or trivalent aromatic hydrocarbon group for $R^{37}$ include groups in which one or two hydrogen atoms have been removed from the aryl group for $R^{34}$.

As the alkyl group having no substituent or the halogenated alkyl group for $R^{38}$, the same alkyl group having no substituent and the halogenated alkyl group as those described above for $R^{35}$ can be used.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in International Patent Publication 04/074242 pamphlet (Examples 1 to 40 described at pages 65 to 85) may also be used favorably.

Furthermore, the following compounds may also be used as preferred examples.

[Chemical Formula 56]

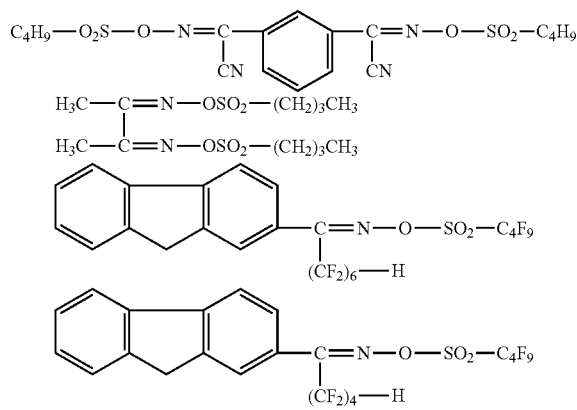

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may also be used favorably.

Furthermore, examples of poly(bis-sulfonyl)diazomethanes include those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane and 1,10-bis(cyclohexylsulfonyldiazomethylsulfonyl)decane.

As the component (B), one type of acid generator described above may be used alone, or two or more types of acid generators may be used in combination.

In the present invention, as the component (B), it is preferable to use an onium salt-based acid generator having a fluorinated alkylsulfonic acid ion as the anion moiety. In the positive resist composition of the present invention, the amount of the component (B) relative to 100 parts by weight of the component (A) is preferably within a range from 0.5 to 50 parts by weight, and more preferably from 1 to 40 parts by weight. By ensuring that the amount of the component (B) is within the above-mentioned range, formation of a resist pattern can be performed satisfactorily. Further, by virtue of the above-mentioned range, a uniform solution can be obtained and the storage stability tends to improve.

<Component (D)>

In the resist composition of the present invention, the component (D) includes a compound represented by general formula (d1) shown below (hereafter, referred to as "compound (d1)"). By including the compound (d1) within the component (D), in the formation of a resist pattern, various lithography properties such as the LWR and CDU are improved, and the shape of the resist pattern becomes satisfactory.

[Chemical Formula 57]

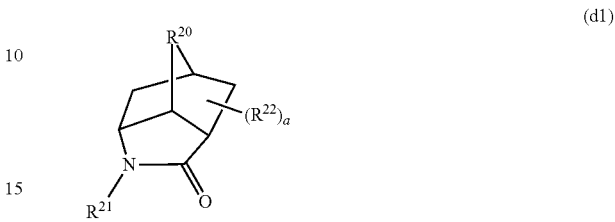

[In the formula, $R^{20}$ represents a methylene group, an ethylene group, an oxygen atom or —C(CH$_3$)$_2$—; $R^{21}$ represents a hydrogen atom or an organic group; and $R^{22}$ represents an alkoxy group, an alkoxycarbonyloxy group, a hydroxyl group, a halogen atom, —C(=O)—O—$R^{23}$, —C(=O)—NH—$R^{23}$ or a carboxyl group, wherein $R^{23}$ represents a linear or branched alkyl group of 1 to 15 carbon atoms, an unsaturated hydrocarbon group, an aliphatic cyclic group, or an aromatic hydrocarbon group, and a represents an integer of 0 to 2.]

In formula (d1), $R^{20}$ represents a methylene group, an ethylene group, an oxygen atom or —C(CH$_3$)$_2$—, and is preferably a methylene group.

In formula (d1), $R^{22}$ represents an alkoxy group, an alkoxycarbonyloxy group, a hydroxyl group, a halogen atom, —C(=O)—O—$R^{23}$, —C(=O)—NH—$R^{23}$ or a carboxyl group.

The alkoxy group for $R^{22}$ is preferably an alkoxy group having 1 to 10 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the alkoxycarbonyloxy group for $R^{22}$ include groups represented by general formula —O—C(=O)—O—$R^{220}$ [in the formula, $R^{220}$ represents a linear, branched or cyclic alkyl group of 1 to 10 carbon atoms], and specific examples thereof include a tert-butyloxycarbonyloxy group.

Examples of the halogen atom for $R^{22}$ include a fluorine atom, a chlorine atom, a bromine atom and an iodine atom.

$R^{23}$ represents a linear or branched alkyl group of 1 to 15 carbon atoms, an unsaturated hydrocarbon group, an aliphatic cyclic group, or an aromatic hydrocarbon group.

The linear alkyl group for $R^{23}$ preferably has 1 to 15 carbon atoms, more preferably 1 to 10 carbon atoms, and still more preferably 1 to 8 carbon atoms. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group and a tetradecyl group.

The branched alkyl group for $R^{23}$ preferably has 3 to 15 carbon atoms, more preferably 3 to 10 carbon atoms, and still more preferably 3 to 8 carbon atoms. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

Examples of the unsaturated hydrocarbon group for $R^{23}$ include an alkenyl group of 2 to 10 carbon atoms and an alkynyl group of 2 to 10 carbon atoms.

The aliphatic cyclic group for $R^{23}$ may be either a monocyclic group or a polycyclic group, and preferably has 3 to 20 carbon atoms, more preferably 3 to 18 carbon atoms, and still more preferably 5 to 10 carbon atoms.

Examples thereof include groups in which one or more hydrogen atoms have been removed from a monocycloalkane; and groups in which one or more hydrogen atoms have been removed from a polycycloalkane such as a bicycloalkane, a tricycloalkane, or a tetracycloalkane. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

The aromatic hydrocarbon group for $R^{23}$ preferably has 6 to 16 carbon atoms, more preferably 6 to 14 carbon atoms, and still more preferably 6 to 10 carbon atoms. Here, the number of carbon atoms within a sub stituent(s) is not included in the number of carbon atoms of the aromatic hydrocarbon group. Specific examples thereof include an aryl group which is an aromatic hydrocarbon ring having one hydrogen atom removed therefrom, such as a phenyl group, a biphenyl group, a fluorenyl group, a naphthyl group, an anthryl group or a phenanthryl group; and an alkylaryl group such as a benzyl group, a phenethyl group, a 1-naphthylmethyl group, a 2-naphthylmethyl group, a 1-naphthylethyl group, or a 2-naphthylethyl group.

In formula (d1), $R^{22}$ is preferably a hydroxyl group.

In formula (d1), a represents an integer of 0 to 2, preferably 0 or 1, and more preferably 1.

In formula (d1), $R^{21}$ represents a hydrogen atom or an organic group.

As the organic group for $R^{21}$, a linear, branched or cyclic alkyl group which may have a substituent; an aromatic hydrocarbon group which may have a substituent; a vinyl group; an allyl group; a combination thereof; or a combination of one or more of these groups and an ether bond is preferable.

The linear alkyl group which may have a substituent for $R^{21}$ preferably has 1 to 21 carbon atoms, more preferably 1 to 15 carbon atoms, and still more preferably 1 to 10 carbon atoms. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group which may have a substituent for $R^{21}$ preferably has 3 to 21 carbon atoms, more preferably 3 to 15 carbon atoms, and still more preferably 3 to 10 carbon atoms. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, a 4-methylpentyl group and a tert-butyl group.

The linear or branched (chain-like) alkyl group may or may not have a substituent. Examples of the substituent include a fluorine atom, an oxygen atom (=O), —$SO_2$— and —C(=O)—O—.

The cyclic alkyl group which may have a substituent for $R^{21}$ may be either a monocyclic group or a polycyclic group, and preferably has 3 to 20 carbon atoms, more preferably 3 to 18 carbon atoms, and still more preferably 5 to 10 carbon atoms. Examples thereof include groups in which one hydrogen atom has been removed from a monocycloalkane; and groups in which one hydrogen atom has been removed from a polycycloalkane such as a bicycloalkane, a tricycloalkane, or a tetracycloalkane. Specific examples include groups in which one hydrogen atom has been removed from a monocycloalkane such as cyclopropyl, cyclobutane, cyclopentane or cyclohexane; and groups in which one hydrogen atom has been removed from a polycycloalkane such as adamantane, norbornane, isobornane, tricyclodecane or tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms which is substituted by a fluorine atom, and an oxygen atom (=O).

The alkyl group as the substituent for the cyclic aliphatic hydrocarbon group is preferably an alkyl group of 1 to 5 carbon atoms, and a methyl group, an ethyl group, a propyl group, an n-butyl group or a tert-butyl group is particularly desirable.

Examples of the fluorinated alkyl group as the substituent for the cyclic aliphatic hydrocarbon group include groups in which some or all of the hydrogen atoms of an aforementioned alkyl group have been substituted with fluorine atoms.

The aromatic hydrocarbon group which may have a sub stituent for $R^{21}$ preferably has 6 to 16 carbon atoms, more preferably 6 to 14 carbon atoms, and still more preferably 6 to 10 carbon atoms. Here, the number of carbon atoms within a sub stituent(s) is not included in the number of carbon atoms of the aromatic hydrocarbon group. Specific examples thereof include an aryl group which is an aromatic hydrocarbon ring having one hydrogen atom removed therefrom, such as a phenyl group, a biphenyl group, a fluorenyl group, a naphthyl group, an anthryl group or a phenanthryl group.

The aromatic hydrocarbon group may or may not have a substituent. For example, part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which a part of the carbon atoms constituting the ring within the aforementioned aryl group has been substituted with a hetero atom such as an oxygen atom, a sulfur atom or a nitrogen atom, and a heteroarylalkyl group in which a part of the carbon atoms constituting the aromatic hydrocarbon ring within the aforementioned arylalkyl group has been substituted with the aforementioned hetero atom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the sub stituent for the aromatic hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the aromatic hydrocarbon group include a fluorine atom, a chlorine atom, a bromine atom and an iodine atom.

Examples of the halogenated alkyl group as the substituent for the aromatic hydrocarbon group includes a group in which part or all of the hydrogen atoms within the aforementioned alkyl group have been substituted with the aforementioned halogen atoms.

In formula (d1), it is particularly desirable that $R^{21}$ be a group represented by general formula $—(R^{24})_b—(R^{25})_c—R^{26}$ [wherein $R^{24}$ represents an alkylene group of 1 to 5 carbon atoms which may have a substituent; b represents 0 or 1; $R^{25}$ represents $—(C=O)—$, $—SO_2—$, $—SO_3—$ or $—C(=O)—O—$; c represents 0 or 1; $R^{26}$ represents a hydrogen atom, a linear or branched alkyl group of 1 to 15 carbon atoms which may have a substituent, an aliphatic cyclic group which may have a substituent, an aromatic hydrocarbon group which may have a substituent, or a vinyl group or allyl group which may contain an ether bond].

That is, it is particularly desirable that the compound (d1) be a compound represented by general formula (d1-1) shown below.

[Chemical Formula 58]

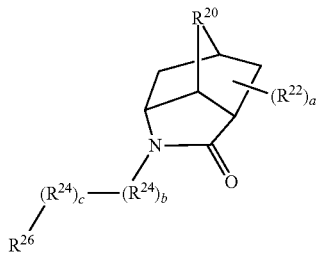

(d1-1)

[In the formula, $R^{20}$, $R^{22}$ and a are the same as defined above; $R^{24}$ represents an alkylene group of 1 to 5 carbon atoms which may have a substituent; b represents 0 or 1; $R^{25}$ represents $—(C=O)—$, $—SO_2—$, $—SO_3—$ or $—C(=O)—O—$; c represents 0 or 1; $R^{26}$ represents a hydrogen atom, a linear or branched alkyl group of 1 to 15 carbon atoms which may have a substituent, an aliphatic cyclic group which may have a substituent, an aromatic hydrocarbon group which may have a substituent, or a vinyl group or allyl group which may contain an ether bond.]

In formula (d1-1), $R^{24}$ represents an alkylene group of 1 to 5 carbon atoms which may have a substituent. The alkylene group may be any of linear, branched or cyclic, but is preferably linear or branched, and more preferably linear.

Specific examples of the linear alkylene group include a methylene group, an ethylene group, a trimethylene group, a tetramethylene group and a pentamethylene group.

Specific examples of the branched alkylene group include various alkylalkylene groups, including alkylmethylene groups such as $—CH(CH_3)—$, $—CH(CH_2CH_3)—$, $—C(CH_3)_2—$, $—C(CH_3)(CH_2CH_3)—$, $—C(CH_3)(CH_2CH_2CH_3)—$ and $—C(CH_2CH_3)_2—$; alkylethylene groups such as $—CH(CH_3)CH_2—$, $—CH(CH_3)CH(CH_3)—$, $—C(CH_3)_2CH_2—$, $—CH(CH_2CH_3)CH_2—$ and $—C(CH_2CH_3)CH_2—CH_2$; alkyltrimethylene groups such as $—CH(CH_3)CH_2CH_2—$ and $—CH_2CH(CH_3)CH_2—$; and alkyltetramethylene groups such as $—CH(CH_3)CH_2CH_2CH_2—$ and $—CH_2CH(CH_3)CH_2CH_2—$.

The alkylene group is preferably a linear alkylene group.

In formula (d1-1), b is either 0 or 1, and is preferably 0.

In formula (d1-1), $R^{25}$ represents $—(C=O)—$, $—SO_2—$, $—SO_3—$ or $—C(=O)—O—$, and is preferably $—C(=O)—O—$.

In formula (d1-1), c is either 0 or 1, and is preferably 0.

In formula (d1-1), $R^{26}$ represents a hydrogen atom, a linear or branched alkyl group of 1 to 15 carbon atoms which may have a substituent, an aliphatic cyclic group which may have a substituent, an aromatic hydrocarbon group which may have a substituent, or a vinyl group or allyl group which may contain an ether bond.

The linear or branched alkyl group of 1 to 15 carbon atoms which may have a substituent for $R^{26}$ preferably has 1 to 12 carbon atoms, more preferably 1 to 10 carbon atoms, and still more preferably 1 to 4 carbon atoms. Specific examples thereof include the same linear or branched alkyl groups which may have a substituent as those described above for $R^{21}$ in which the number of carbon atoms is from 1 to 15.

The aliphatic cyclic group which may have a substituent for $R^{26}$ may be either a monocyclic group or a polycyclic group, and preferably has 3 to 20 carbon atoms, more preferably 3 to 18 carbon atoms, and still more preferably 5 to 10 carbon atoms. Specific examples thereof include the same cyclic alkyl groups which may have a substituent as those described above for $R^{21}$.

The aromatic hydrocarbon group which may have a substituent for $R^{26}$ preferably has 6 to 16 carbon atoms, more preferably 6 to 14 carbon atoms, and still more preferably 6 to 10 carbon atoms. Specific examples thereof include the same aromatic hydrocarbon groups which may have a substituent as those described above for $R^{21}$.

In formula (d1-1), $R^{26}$ is preferably a linear or branched alkyl group or an aliphatic cyclic group, more preferably a linear or branched alkyl group of 1 to 4 carbon atoms or an aliphatic cyclic group of 3 to 10 carbon atoms, and still more preferably a methyl group, an ethyl group, an n-propyl group, an isopropyl group, an n-butyl group, an isobutyl group, a sec-butyl group, a tert-butyl group, an n-pentyl group, an n-hexyl group, a cyclopropyl group, a cyclobutyl group, a cyclopentyl group, a cyclohexyl group or an adamantyl group.

Specific examples of the compound (d1) are shown below.

[Chemical Formula 59]

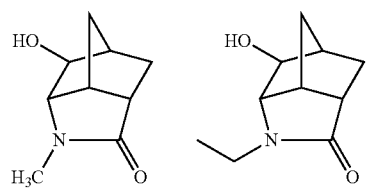

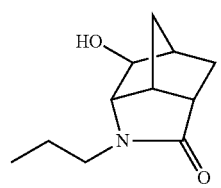 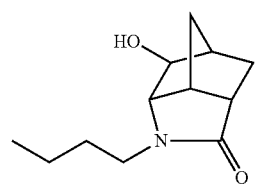

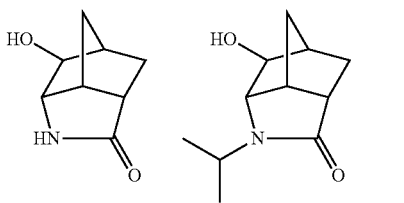
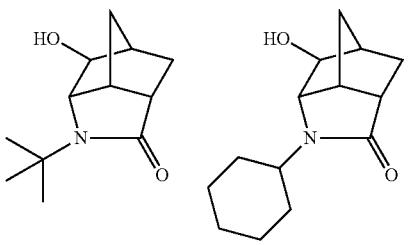

[Chemical Formula 60]

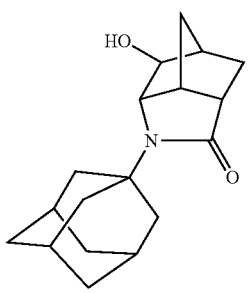

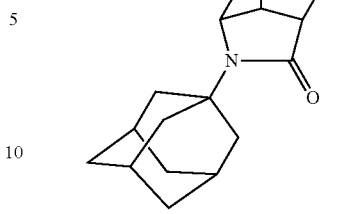

As the compound (d1), one type of compound may be used alone, or two or more types of compounds may be used in combination.

In the component (D), the amount of the compound (d1) based on the total weight of the component (D) is preferably 25% by weight or more, more preferably 50% by weight or more, still more preferably 75% by weight or more, and may be even 100% by weight.

(Other Nitrogen-Containing Organic Compounds (d2))

In the resist composition of the present invention, for improving the resist pattern shape and the post exposure stability of the latent image formed by the pattern-wise exposure of the resist layer, the component (D) may also include other nitrogen-containing organic compounds (d2) besides the compound (d1) (hereafter, referred to as "compound (d2)"), with the proviso that the effects of the present invention are not impaired.

There are no particular limitations on the compound (d2) as long as it is a different compound from the compound (d1) and also functions as an acid diffusion control agent, namely, a quencher which traps the acid generated from the component (B) upon exposure. A multitude of these compounds (d2) have already been proposed, and any of these known compounds may be used, although an aliphatic amine, and particularly a secondary aliphatic amine or tertiary aliphatic amine is preferable. An "aliphatic amine" is an amine having one or more aliphatic groups, and the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of not more than 20 carbon atoms (namely, alkylamines or alkyl alcohol amines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, tri-n-octanolamine, stearyldiethanolamine and lauryldiethanolamine.

Among these, trialkylamines and/or alkylalcoholamines are preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of aromatic amines include aniline, pyridine, 4-dimethylaminopyridine, pyrrole, indole, pyrazole, imidazole and derivatives thereof, as well as diphenylamine, triphenylamine and tribenzylamine.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine and tris[2-{2-(2-hydroxyethoxy)ethoxy}ethyl]amine.

As the compound (d2), one type of compound may be used alone, or two or more types of compounds may be used in combination.

In the resist composition of the present invention, as the component (D), one type of component may be used alone, or two or more types of components may be used in combination.

In the resist composition of the present invention, the amount of the component (D) relative to 100 parts by weight of the component (A) is preferably within a range from 0.01 to 10 parts by weight, more preferably from 0.05 to 10 parts by weight, and still more preferably from 0.1 to 5 parts by weight. By ensuring that the amount of the component (D) is within the above-mentioned range, in the formation of a resist pattern, various lithography properties such as the LWR and CDU are improved, and the shape of the resist pattern becomes satisfactory.

(Production Example for Component (D))

There are no particular limitations on the method for producing the compound (d1) according to the present invention, and the compound can be produced, for example, in the following manner. A diene derivative (5) is allowed to react with an acrylic acid halide derivative (6) [hereafter, this step is referred to as the "first step-1"]; the resultant is then subjected to a treatment using an amine compound (7) to yield a cyclohexene derivative (3) [hereafter, this step is referred to as the "first step-2"]; the resulting cyclohexene derivative is then allowed to react with an organic peroxide in the presence of a basic compound to yield an epoxy derivative (4) [hereafter, this step is referred to as the "second step"]; and the resulting epoxy derivative is then allowed to react with an basic substance to produce a compound (d0) represented by formula shown below which is included within the definition of the aforementioned compound (d1) [hereafter, this step is referred to as the "third step"].

[Chemical Formula 61]

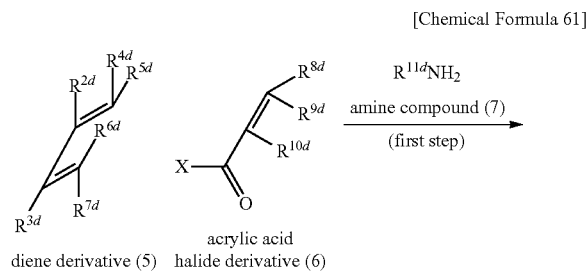

diene derivative (5)    acrylic acid halide derivative (6)

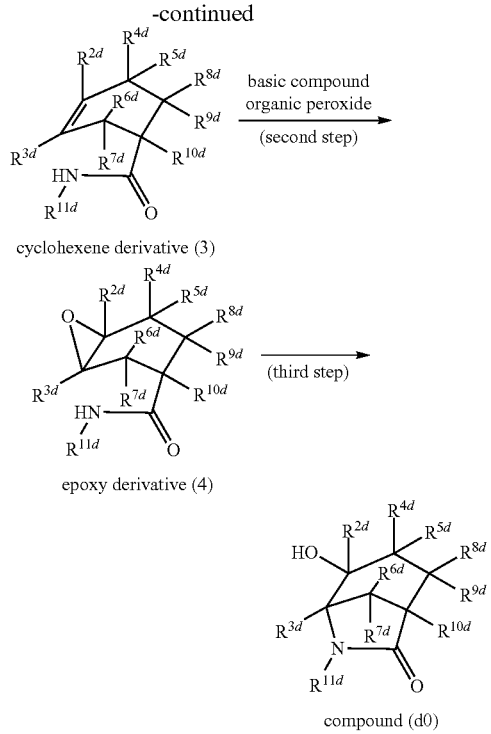

cyclohexene derivative (3)

epoxy derivative (4)

compound (d0)

(In the formulas, each of $R^{2d}$, $R^{3d}$, $R^{5d}$, $R^{7d}$, $R^{8d}$, $R^{9d}$ and $R^{10d}$ independently represents a hydrogen atom, an alkoxy group, an alkoxycarbonyloxy group, a hydroxyl group, a halogen atom, —C(=O)—O—$R^{23}$, —C(=O)—NH—$R^{23}$ or a carboxyl group, wherein $R^{23}$ is the same as defined above; $R^{4d}$ and $R^{6d}$ are bonded together to form a methylene group, an ethylene group, an oxygen atom or —C(CH$_3$)$_2$—; $R^{11d}$ represents a hydrogen atom or an organic group; and X represents a chlorine atom, a bromine atom or an iodine atom.)

The first step-1 regarding the method for producing the cyclohexene derivative (3) will be described below.

Specific examples of the diene derivative (5) used in the first step-1 include butadiene, isoprene, 2,3-dimethylbutadiene, cyclopentadiene and furan, and the amount thereof used is preferably within a range from 1 to 50 times the molar amount of the acrylic acid halide derivative (6), and more preferably from 1 to 10 times the molar amount of the acrylic acid halide derivative (6) in view of easy post treatment.

Specific examples of the acrylic acid halide derivative (6) used in the first step-1 include acrylic acid chloride, methacrylic acid chloride, acrylic acid bromide, methacrylic acid bromide, crotonic acid chloride, crotonic acid bromide, and 3-methyl-2-butenoic acid chloride.

The reaction in the first step-1 can be conducted in the presence or absence of a solvent. There are no particular limitations on the solvent to be used as long as the solvent does not inhibit the reaction. Examples of the solvent include a saturated hydrocarbon solvent such as hexane, heptane and cyclohexane; an aromatic hydrocarbon solvent such as benzene, toluene and xylene; a chlorinated hydrocarbon solvent such as methylene chloride, dichloroethane, chloroform and benzene chloride; an ether solvent such as diethyl ether, diisopropyl ether, tetrahydrofuran and furan; and an ester solvent such as methyl acetate, ethyl acetate and propyl acetate, and the amount thereof used when conducting the reaction in the presence of a solvent is preferably within a range from 0.5 to 100 times the diene derivative (5) in terms of weight, and more preferably from 0.5 to 20 times the diene derivative (5) in terms of weight, in view of easy post treatment. The solvent can be used individually, or two or more solvents can be mixed and used.

The reaction temperature in the first step-1 differs depending on the types of the diene derivative (5) and acrylic acid halide derivative (6) to be used, but is preferably within a range from −30 to 100° C., and more preferably within a range from −10 to 50° C.

The reaction time in the first step-1 differs depending on the types of the diene derivative (5) and acrylic acid halide derivative (6) to be used and the reaction temperature, but is generally within a range from 1 hour to 50 hours.

The reaction of the first step-1 can be terminated by lowering the temperature, and the resultant can be used as the source material in the first step-2 without performing any purification operation.

Specific examples of the amine compound (7) used in the first step-2 include ammonia, methylamine, ethylamine, n-propylamine, i-propylamine, n-butylamine, i-butylamine, s-butylamine, t-butylamine, cyclopropylamine, cyclohexylamine and 1-adamantylamine, and the amount thereof used is preferably within a range from 1 to 10 times the molar amount of the acrylic acid halide derivative (6), and more preferably from 1 to 5 times the molar amount of the acrylic acid halide derivative (6) in view of easy post treatment. In terms of the mode of use, the amine compound (7) can be used directly in an available form, either in the form of an aqueous solution or a purified product.

The reaction in the first step-2 can be conducted in the presence or absence of a solvent. There are no particular limitations on the solvent to be used as long as the solvent does not inhibit the reaction. Examples of the solvent include a saturated hydrocarbon solvent such as hexane, heptane and cyclohexane; an aromatic hydrocarbon solvent such as benzene, toluene and xylene; a chlorinated hydrocarbon solvent such as methylene chloride, dichloroethane and benzene chloride; an ether solvent such as diethyl ether, diisopropyl ether, tetrahydrofuran and furan; and an ester solvent such as methyl acetate, ethyl acetate and propyl acetate, and the amount of the solvent used when conducting the reaction in the presence of a solvent is preferably within a range from 0.5 to 100 times the diene derivative (5) in terms of weight, and more preferably from 0.5 to 20 times the diene derivative (5) in terms of weight, in view of easy post treatment. It is more preferable to use the solvent used in the first step-1 as it is. The solvent can be used individually, or two or more solvents can be mixed and used.

The reaction temperature in the first step-2 differs depending on the type of the amine compound (7) and acrylic acid halide derivative (6) to be used, but is preferably within a range from −30 to 100° C., and more preferably within a range from −10 to 50° C.

The reaction time in the first step-2 differs depending on the type of the amine compound (7) and acrylic acid halide derivative (6) to be used and the reaction temperature, but is generally within a range from 1 hour to 50 hours.

The second step regarding the method for producing the epoxy derivative (4) will be described below.

Specific examples of the organic peroxide used in the second step include m-chloroperbenzoic acid and dimethyldioxirane, and the amount thereof used is preferably within a range from 1 to 10 times the molar amount of the cyclohexene derivative (3), and more preferably from 1 to 5 times the molar amount of the cyclohexene derivative (3) in view of easy post treatment.

Specific examples of the basic compound used in the second step include an alkali metal hydroxide such as sodium hydroxide and potassium hydroxide; an alkali metal carbonate such as sodium carbonate and potassium carbonate; an alkaline earth metal hydroxide such as calcium hydroxide and barium hydroxide; and an alkaline earth metal carbonate such as calcium carbonate and barium carbonate, and an alkali metal carbonate is preferable. The amount thereof used is preferably within a range from 1 to 20 times the molar amount of the organic peroxide used, and more preferably from 1 to 10 times the molar amount of the organic peroxide used in view of easy post treatment.

There are no particular limitations on the solvent to be used in the reaction of the second step as long as the solvent does not inhibit the reaction. Examples of the solvent include water; a saturated hydrocarbon solvent such as hexane, heptane and cyclohexane; an aromatic hydrocarbon solvent such as benzene, toluene and xylene; a chlorinated hydrocarbon solvent such as methylene chloride, dichloroethane and benzene chloride; and an ester solvent such as methyl acetate, ethyl acetate and isopropyl acetate, and the amount of the solvent used is preferably within a range from 0.5 to 100 times the cyclohexene derivative (3) in terms of weight, and more preferably from 0.5 to 20 times the cyclohexene derivative (3) in terms of weight, in view of easy post treatment. The solvent can be used individually, or two or more solvents can be mixed and used.

The reaction temperature in the second step differs depending on the types of the organic peroxide and cyclohexene derivative (3) to be used, but is preferably within a range from −80 to 100° C., and more preferably within a range from −30 to 50° C.

The reaction time in the second step differs depending on the types of the organic peroxide and cyclohexene derivative (3) to be used and the reaction temperature, but is generally within a range from 1 hour to 50 hours.

The reaction of the second step can be terminated by adding a reducing agent. Specific examples of the reducing agent used include sodium sulfite, sodium thiosulfate and sodium hydrogen sulfite, and the amount thereof used is preferably within a range from 1 to 5 times the molar amount of the excess portion of the organic peroxide used, and more preferably from 1 to 3 times the molar amount of the excess portion of the organic peroxide used in view of easy post treatment.

The epoxy derivative (4) obtained in the second step can be separated by a common technique used in the field of organic chemistry such as solvent extraction and distillation. When a further purification is required, a common technique used in the field of organic chemistry such as recrystallization, distillation and sublimation can be employed for improving the purity.

The third step regarding the method for producing the compound (d0) will be described below.

A basic substance is used in the third step. Specific examples thereof include an alkali metal alkoxide such as sodium methoxide, sodium ethoxide, potassium methoxide, potassium ethoxide, sodium tert-butoxide and potassium tert-butoxide; and an alkali metal hydride such as lithium hydride, sodium hydride and potassium hydride; and sodium tert-butoxide, potassium tert-butoxide or sodium hydride is preferable. The amount thereof used is preferably within a range from 1 to 5 times the molar amount of the epoxy derivative (4), and more preferably from 1 to 3 times the molar amount of the epoxy derivative (4) in view of easy post treatment.

A solvent is used in the third step. There are no particular limitations on the solvent to be used as long as the solvent does not inhibit the reaction. Examples of the solvent include a saturated hydrocarbon solvent such as hexane, heptane and cyclohexane; an aromatic hydrocarbon solvent such as benzene, toluene and xylene; and an ether solvent such as diethyl ether, diisopropyl ether and tetrahydrofuran, and the amount of the solvent used is preferably within a range from 0.5 to 100 times the epoxy derivative (4) in terms of weight, and more preferably from 0.5 to 20 times the epoxy derivative (4) in terms of weight, in view of easy post treatment. The solvent can be used individually, or two or more solvents can be mixed and used.

The reaction temperature in the third step differs depending on the types of the basic substance and epoxy derivative (4) to be used, but is preferably within a range from −80 to 100° C., and more preferably within a range from −30 to 50° C.

The reaction time in the third step differs depending on the types of the basic substance and epoxy derivative (4) to be used and the reaction temperature, but is generally within a range from 1 hour to 50 hours.

The reaction of the third step can be terminated by adding water. The amount thereof used is preferably within a range from 1 to 100 times the molar amount of the basic substance used, and more preferably from 1 to 50 times the molar amount of the basic substance used in view of easy post treatment.

<Optional Component—Component (E)>

Furthermore, in the resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added as an optional component.

Examples of suitable organic carboxylic acids include acetic acid, malonic acid, citric acid, malic acid, succinic acid, benzoic acid, and salicylic acid.

Examples of phosphorus oxo acids or derivatives thereof include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters and phenylphosphinic acid.

As the component (E), one type of component may be used alone, or two or more types of components may be used in combination.

The component (E) is typically used in an amount within a range from 0.01 to 5.0 parts by weight, relative to 100 parts by weight of the component (A).

<Optional Component—Component (C)>

The resist composition of the present invention preferably includes a fluorine-containing polymeric compound (C) (hereafter, referred to as "component (C)"). By including the fluorine-containing polymeric compound (C), the hydrophobicity of a resist film in the immersion exposure is enhanced, yielding a level of hydrophobicity that is ideal for immersion exposure.

In the present descriptions and the claims, the expression "decomposable in an alkali developing solution" means that the group is decomposable by the action of an alkali developing solution (preferably decomposable by the action of a 2.38% by weight aqueous solution of tetramethylammonium hydroxide (TMAH) at 23° C.), and exhibits increased alkali solubility in the alkali developing solution.

In the present invention, the component (C) preferably includes a structural unit (c1) represented by general formula (c1-1) shown below.

[Chemical Formula 62]

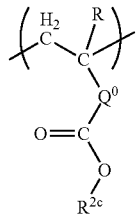

(c1-1)

[In formula (c1-1), R represents a hydrogen atom, a lower alkyl group of 1 to 5 carbon atoms or a halogenated alkyl group of 1 to 5 carbon atoms; $Q^0$ represents a single bond or a divalent linking group; and $R^{2c}$ represents an organic group which may have a fluorine atom, with the proviso that when $R^{2c}$ has no fluorine atom, $Q^0$ has a fluorine atom.]

[Structural Unit (c1)]

In general formula (c1-1) above, R represents a hydrogen atom, an alkyl group of 1 to 5 carbon atoms or a halogenated alkyl group of 1 to 5 carbon atoms; and a hydrogen atom or a methyl group is preferable.

In the above general formula (c1-1), $Q^0$ represents a single bond or a divalent linking group.

Preferred examples of the divalent linking group for $Q^0$ include a hydrocarbon group which may have a substituent, and a group containing a hetero atom. The divalent linking group for $Q^0$ is preferably an organic group which does not have an acid dissociable portion.

(Hydrocarbon Group which May have a Substituent)

With respect to $Q^0$, the description that the hydrocarbon group "may have a substituent" means that some or all of the hydrogen atoms within the hydrocarbon group may be substituted with an atom other than a hydrogen atom or with a group.

The hydrocarbon group may be either an aliphatic hydrocarbon group or an aromatic hydrocarbon group.

An aliphatic hydrocarbon group refers to a hydrocarbon group that has no aromaticity. The aliphatic hydrocarbon group may be either saturated or unsaturated, but in general, the aliphatic hydrocarbon group is preferably saturated.

More specific examples of the aliphatic hydrocarbon group include a linear or branched aliphatic hydrocarbon group, and an aliphatic hydrocarbon group containing a ring in the structure thereof.

The linear or branched aliphatic hydrocarbon group preferably has 1 to 10 carbon atoms, more preferably 1 to 8 carbon atoms, still more preferably 1 to 5 carbon atoms, still more preferably 1 to 3 carbon atoms, and most preferably 1 carbon atom.

As the linear aliphatic hydrocarbon group, a linear alkylene group is preferable. Specific examples thereof include a methylene group, an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, a branched alkylene group is preferable, and specific examples thereof include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$— and —$CH(CH_2CH_3)CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched (chain-like) aliphatic hydrocarbon group may or may not have a substituent. Examples of the substituent include a fluorine atom, a fluorinated lower alkyl group of 1 to 5 carbon atoms which is substituted by a fluorine atom, and an oxygen atom (=O).

Examples of the aliphatic hydrocarbon group which is substituted with a fluorine atom or a fluorinated alkyl group include —$CH(CH_3)CF_2$— and —$CH(CH_2CH_3)CF_2$—.

Examples of aliphatic hydrocarbon groups containing a ring include a cyclic aliphatic hydrocarbon group (an aliphatic hydrocarbon ring having 2 hydrogen atoms removed therefrom), a group in which the cyclic aliphatic hydrocarbon group is bonded to the terminal of the aforementioned chain-like aliphatic hydrocarbon group, and a group in which the cyclic aliphatic hydrocarbon group is positioned partway along the chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Specific examples of the monocycloalkane include cyclopentane and cyclohexane. As the polycyclic group, a group in which two hydrogen atoms have been removed from a polycycloalkane of 7 to 12 carbon atoms is preferable. Specific examples of the polycycloalkane include adamantane, norbornane, isobornane, tricyclodecane and tetracyclododecane.

The cyclic aliphatic hydrocarbon groups may or may not have a substituent. Examples of the substituent include an alkyl group of 1 to 5 carbon atoms, a fluorine atom, a fluorinated lower alkyl group of 1 to 5 carbon atoms which is substituted by a fluorine atom, and an oxygen atom (=O).

Examples of aromatic hydrocarbon groups include a divalent aromatic hydrocarbon group in which one hydrogen atom has been removed from a benzene ring of a monovalent aromatic hydrocarbon group such as a phenyl group, a biphenyl group, a fluorenyl group, a naphthyl group, an anthryl group or a phenanthryl group;

an aromatic hydrocarbon group in which a part of the carbon atoms constituting the ring of the aforementioned divalent aromatic hydrocarbon group has been substituted with a hetero atom such as an oxygen atom, a sulfur atom or a nitrogen atom;

and an aromatic hydrocarbon group in which one hydrogen atom has been removed from a benzene ring of an arylalkyl group such as a benzyl group, a phenethyl group, a 1-naphthylmethyl group, a 2-naphthylmethyl group, a 1-naphthylethyl group or a 2-naphthylethyl group.

Among these examples, the aforementioned divalent aromatic hydrocarbon group is preferable, and an aromatic hydrocarbon group in which one hydrogen atom has been removed from a phenyl group, or an aromatic hydrocarbon group in which one hydrogen atom has been removed from a naphthyl group is particularly desirable.

The alkyl chain within the arylalkyl group preferably has 1 to 4 carbon atoms, more preferably 1 or 2 carbon atoms, and most preferably 1 carbon atom.

The aromatic hydrocarbon group may or may not have a substituent. Examples of the substituent include a lower alkyl group of 1 to 5 carbon atoms, a fluorine atom, a fluorinated lower alkyl group of 1 to 5 carbon atoms which is substituted by a fluorine atom, and an oxygen atom (=O).

Among the above-mentioned examples, as the hydrocarbon group which may have a substituent, a linear, branched or cyclic aliphatic hydrocarbon group or a divalent aromatic hydrocarbon group is preferable, and a methylene group, an ethylene group, —$CH(CH_3)$—, a group in which one hydrogen atom has been removed from a tetracyclododecanyl group, or an aromatic hydrocarbon group in which one hydrogen atom has been removed from a phenyl group is particularly desirable.

(Group Containing a Hetero Atom)

A hetero atom refers to an atom other than a carbon atom and a hydrogen atom, and examples thereof include an oxygen atom, a nitrogen atom, a sulfur atom and a halogen atom.

Examples of groups containing a hetero atom include —O—, —C(=O)—, —C(=O)—O—, a carbonate bond (—O—C(=O)—O—), —NH—, —$NR^{04}$— (wherein $R^{04}$ represents an alkyl group), —NH—C(=O)—, =N—, and a combination of at least one of these "groups" with a divalent hydrocarbon group.

As the divalent hydrocarbon group, the same groups as those described above for the hydrocarbon group which may have a substituent can be used, and a linear or branched aliphatic hydrocarbon group is preferable.

Among the above-mentioned examples, as the group containing a hetero atom, a combination of at least one of the aforementioned "groups" with a divalent hydrocarbon group is preferable. More specifically, it is particularly desirable to use a combination of at least one of the aforementioned "groups" with the aforementioned aliphatic hydrocarbon group, or a combination of the aforementioned aliphatic hydrocarbon group, at least one of the aforementioned "groups" and the aforementioned aliphatic hydrocarbon group.

Among the above-mentioned examples, as $Q^0$, a single bond or a group containing a hetero atom is more preferable, and a combination of at least one of the aforementioned "groups" with the aforementioned aliphatic hydrocarbon group is particularly desirable.

In general formula (c1-1) above, $R^{2c}$ represents an organic group which may have a fluorine atom. However, when $R^{2c}$ has no fluorine atom, $Q^0$ has a fluorine atom.

Here, an "organic group having a fluorine atom" refers to an organic group in which part or all of the hydrogen atoms have been substituted with a fluorine atom.

As a preferred example of an organic group represented by $R^{2c}$ which may have a fluorine atom, a hydrocarbon group which may have a fluorine atom can be given.

The hydrocarbon group which may have a fluorine atom may be any of linear, branched or cyclic.

$R^{2c}$ preferably has 1 to 20 carbon atoms, more preferably 1 to 15 carbon atoms, and most preferably 1 to 10 carbon atoms.

Further, it is preferable that the organic group having a fluorine atom represented by $R^{2c}$ has 25% or more of the hydrogen atoms within the organic group fluorinated, more preferably 50% or more, and most preferably 60% or more, as the hydrophobicity of the resist film during immersion exposure is enhanced.

Preferable examples of $R^{2c}$ include an acid dissociable group, a base dissociable group, and a group other than base dissociable groups and acid dissociable groups.

An acid dissociable group is a group that is dissociated by an acid to increase solubility in an alkali developing solution. When the acid dissociable group contains no fluorine atom, $Q^0$ has a fluorine atom.

A base dissociable group refers to a group that is decomposable (—O—$R^{2c}$ is dissociated) by the action of an alkali developing solution. The expression "decomposable in an alkali developing solution" means that the group is decomposable by the action of an alkali developing solution (preferably decomposable by action of a 2.38% by weight aqueous solution of tetramethylammonium hydroxide (TMAH) at 23° C.), and exhibits increased alkali solubility in the alkali developing solution. The reason for this is that the ester bond [—C(=O)—O—$R^{2c}$] is decomposed (hydrolyzed) by the action of a base (alkali developing solution), thereby forming a hydrophilic group [—C(=O)—OH] (—O—$R^{2c}$ is dissociated).

Preferable examples of the base dissociable group include fluorinated hydrocarbon groups which may or may not have a substituent. Among fluorinated hydrocarbon groups, a fluorinated, saturated hydrocarbon group or a fluorinated, unsaturated hydrocarbon group is preferable, and a fluorinated, saturated hydrocarbon group is particularly desirable.

$R^{2c}$ may be any of linear, branched or cyclic, and is preferably linear or branched.

Further, $R^{2c}$ preferably has 1 to 20 carbon atoms, more preferably 1 to 15 carbon atoms, still more preferably 1 to 10 carbon atoms, and most preferably 1 to 5 carbon atoms.

Furthermore, it is preferable that the organic group having a fluorine atom represented by $R^{2c}$ has 25% or more of the hydrogen atoms within the organic group fluorinated, more preferably 50% or more, and most preferably 60% or more, as the hydrophobicity of the resist film during immersion exposure is enhanced.

Examples of the group other than acid dissociable groups and base dissociable groups include linear, branched or cyclic alkyl groups of 3 to 15 carbon atoms (excluding groups containing a tertiary carbon atom). In such a case, $Q^0$ has a fluorine atom.

(Acid Dissociable Group)

The acid dissociable group for $R^{2c}$ is not particularly limited as long as it is an organic group that is dissociable by the action of an acid, and examples thereof include a cyclic or chain-like tertiary alkyl ester-type acid dissociable group; and an acetal-type acid dissociable group, such as an alkoxyalkyl group. Among these, $R^{2c}$ is preferably a tertiary alkyl ester-type acid dissociable group, and more preferably a structural unit represented by general formula (IV-1) shown below.

[Chemical Formula 63]

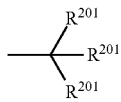

(IV-1)

[In formula (IV-1), the plurality of $R^{201}$ may be the same or different from each other, and at least one of $R^{201}$ represents a linear or branched alkyl group of 1 to 4 carbon atoms; and the or each remaining $R^{201}$ independently represents a linear or branched alkyl group of 1 to 4 carbon atoms or a monovalent aliphatic cyclic group of 4 to 20 carbon atoms, or the or each remaining $R^{201}$ may be mutually bonded to form a divalent aliphatic cyclic group of 4 to 20 carbon atoms together with the carbon atoms bonding each other.]

As the aliphatic cyclic group for $R^{201}$ in general formula (IV-1) above, for example, a group in which one or more hydrogen atoms have been removed from a monocycloalkane or a polycycloalkane such as a bicycloalkane, a tricycloalkane or a tetracycloalkane can be used. Examples of such groups include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane. Specific examples of such groups include a cyclopentyl group, a cyclohexyl group, a norbornyl group and an adamantyl group.

Examples of linear or branched alkyl groups of 1 to 4 carbon atoms include a methyl group, an ethyl group, a propyl group, an isopropyl group, an n-butyl group, an isobutyl group and a tert-butyl group.

Examples of the acid dissociable group represented by general formula (IV-1) in which a plurality of $R^{201}$ each independently represents a linear or branched alkyl group of 1 to 4 carbon atoms include a tert-butyl group, a tert-pentyl group and a tert-hexyl group.

Examples of the acid dissociable group represented by general formula (IV-1) in which at least one of $R^{201}$ represents a linear or branched alkyl group of 1 to 4 carbon atoms, and the or each remaining $R^{201}$ independently represents a linear or branched alkyl group of 1 to 4 carbon atoms or a monovalent aliphatic cyclic group of 4 to 20 carbon atoms include a 1-(1-adamantyl)-1-methylethyl group, a 1-(1-adamantyl)-1-methylpropyl group, a 1-(1-adamantyl)-1-methylbutyl group, a 1-(1-adamantyl)-1-methylpentyl group, a 1-(1-cyclopentyl)-1-methylethyl group, a 1-(1-cyclopentyl)-1-methylpropyl group, a 1-(1-cyclopentyl)-1-methylbutyl group, a 1-(1-cyclopentyl)-1-methylpentyl group, a 1-(1-cyclohexyl)-1-methylethyl group, a 1-(1-cyclohexyl)-1-methylpropyl group, a 1-(1-cyclohexyl)-1-methylbutyl group, and a 1-(1-cyclohexyl)-1-methylpentyl group.

Examples of the acid dissociable group represented by general formula (IV-1) in which one $R^{201}$ group among the plurality of $R^{201}$ groups represents a linear or branched alkyl group of 1 to 4 carbon atoms, and the remaining two $R^{201}$ groups are mutually bonded to form a divalent aliphatic cyclic group of 4 to 20 carbon atoms together with the carbon atoms bonding each other include a 2-alkyl-2-adamantyl group such as a 2-methyl-2-adamantyl group or a 2-ethyl-2-adamantyl group, and a 1-alkyl-1-cycloalkyl group such as a 1-methyl-1-cyclopentyl group, a 1-ethyl-1-cyclopentyl group, a 1-methyl-1-cyclohexyl group, or a 1-ethyl-1-cyclohexyl group.

Among these examples, as the acid dissociable group represented by general formula (IV-1), a group in which one $R^{201}$ group among the plurality of $R^{201}$ groups represents a linear or branched alkyl group of 1 to 4 carbon atoms, and two of the $R^{201}$ groups are mutually bonded to form a divalent aliphatic cyclic group of 4 to 20 carbon atoms together with the carbon atoms bonding each other is preferable, and a 2-methyl-2-adamantyl group is particularly desirable.

Further, each $R^{201}$ group may have a substituent as long as the group represented by general formula (IV-1) functions as an acid dissociable group. As an example of the substituent, a halogen atom such as a fluorine atom can be given.

Specific examples of preferable units for the structural unit (c1) are shown below.

Hereinbelow, a structural unit in which $R^{2c}$ in general formula (c1-1) above represents a "base dissociable group" is referred to as a structural unit (c11), and a structural unit in which $R^{2c}$ represents an "acid dissociable group" is referred to as a structural unit (c12).

(Structural Unit (c11))

Specific examples of preferable structural units for the structural unit (c11) include structural units represented by general formula (c11-1) or (c11-2) shown below.

[Chemical Formula 64]

(c11-1)

(c11-2)

[In the formulas, each R independently represents a hydrogen atom, an alkyl group of 1 to 5 carbon atoms or a halogenated alkyl group of 1 to 5 carbon atoms; $X^c$ represents a divalent organic group; $A_{aryl}$ represents an aromatic cyclic group which may have a substituent; $X_{01}$ represents a single bond or a divalent linking group; and each $R^{21c}$ independently represents a base dissociable group, with the proviso that when $R^{21c}$ has no fluorine atom, $X^c$ has a fluorine atom in formula (c11-1), and $A_{aryl}$ or $X_{01}$ has a fluorine atom in formula (c11-2).]

In the above general formula (c11-1) or (c11-2), R is the same as defined above, and is preferably a hydrogen atom or a methyl group.

The base dissociable group for $R^{21c}$ is the same as defined in the explanation above, more preferably an alkyl group of 1 or 2 carbon atoms or a fluorinated hydrocarbon group of 1 to 5 carbon atoms, and a methyl group, —CH$_2$—CF$_3$, —CH$_2$—CF$_2$—CF$_3$, —CH(CF$_3$)$_2$, or —CH$_2$—CH$_2$—CF$_2$—CF$_2$—CF$_2$—CF$_3$ is particularly desirable. When $R^{21c}$ represents a methyl group, an ethyl group or a fluorinated hydrocarbon group, the —O—$R^{21c}$ group in the formula is a base dissociable group which is dissociable by the action of an alkali developing solution.

In the above general formula (c11-1), $X^c$ represents a divalent organic group.

Preferable examples of $X^c$ include the same hydrocarbon groups which may have a substituent and the groups containing a hetero atom as those described above for $Q^0$.

In general formula (c11-2) above, $A_{aryl}$ represents an aromatic cyclic group which may have a substituent. A specific example of $A_{aryl}$ includes an aromatic hydrocarbon ring (which may have a substituent) having two hydrogen atoms removed therefrom.

The ring skeleton of the aromatic cyclic group for $A_{aryl}$ preferably has 6 to 15 carbon atoms. Examples of the ring skeleton include a benzene ring, a naphthalene ring, a phenanthrene ring and an anthracene ring. Among these, a benzene ring or a naphthalene ring is particularly desirable.

Examples of substituents which an aromatic cyclic group for $A_{aryl}$ may have include a halogen atom, an alkyl group, an alkoxy group, a halogenated alkyl group of 1 to 5 carbon atoms, and an oxygen atom (=O). Examples of the halogen atom include a fluorine atom, a chlorine atom, an iodine atom and a bromine atom. As the substituent which an aromatic cyclic group for $A_{aryl}$ may have, a fluorine atom is preferable.

$A_{aryl}$ may be either an aromatic cyclic group having no substituent, or an aromatic cyclic group having a substituent, although an aromatic cyclic group having no substituent is preferable.

When $A_{aryl}$ is an aromatic cyclic group having a substituent, the number of the substituent may be either 1 or at least 2, preferably 1 or 2, and more preferably 1.

In the above general formula (c11-2), $X_{01}$ represents a single bond or a divalent linking group. Examples of divalent linking groups include an alkylene group of 1 to 10 carbon atoms, —O—, —C(=O)—, —C(=O)—O—, a carbonate bond (—O—C(=O)—O—), —NH—C(=O)—, and a combination of these groups, and a combination of —O— with an alkylene group of 1 to 12 carbon atoms is particularly desirable.

Examples of alkylene groups of 1 to 12 carbon atoms include linear, branched or cyclic alkylene groups, and a linear or branched alkylene group of 1 to 5 carbon atoms and a cyclic alkylene group of 4 to 12 carbon atoms are preferable.

$X_{01}$ is preferably a single bond, —(R$^{7c}$)$_{a0}$—O—[C(=O)]$_{b0}$—R$^{8c}$—, or —C(=O)—O—R$^{9c}$—.

Each of $R^{7c}$, $R^{8c}$ and $R^{9c}$ independently represents a linear, branched or cyclic alkylene group of 1 to 10 carbon atoms, and preferably a linear or branched alkylene group of 1 to 5 carbon atoms or a cyclic alkylene group of 4 to 10 carbon atoms.

a0 represents 0 or an integer of 1 to 5.

b0 represents 0 or 1.

Preferable examples of the structural unit (c11) include structural units represented by general formulas (c11-1-1) to (c11-1-5) or (c11-2-1) to (c11-2-4) shown below.

[Chemical Formula 65]

(c11-1-1)

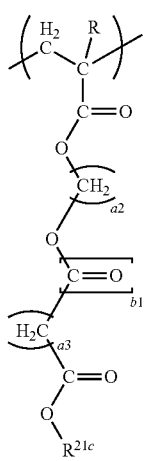 (c11-1-2)
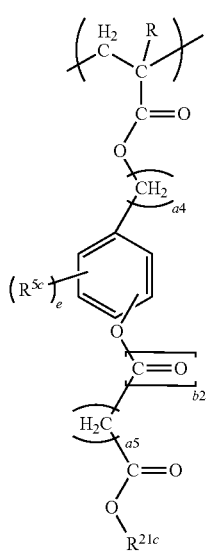 (c11-1-3)
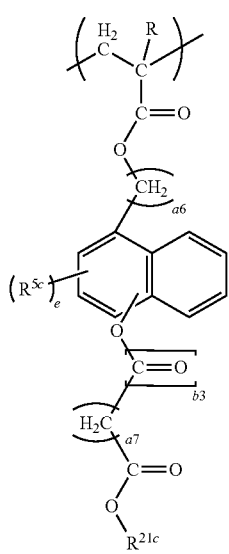 (c11-1-4)
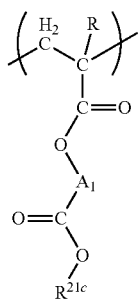 (c11-1-5)
[Chemical Formula 66]
 (c11-2-1)
 (c11-2-2)

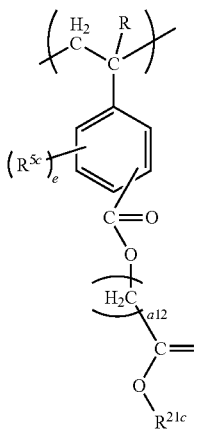

(c11-2-3)

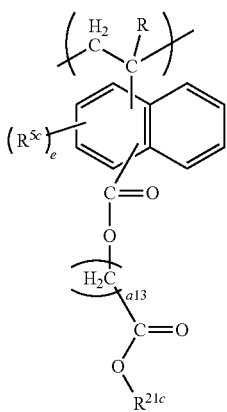

(c11-2-4)

In general formulas (c11-1-1) to (c11-1-5) and (c11-2-1) to (c11-2-4), R and $R^{21c}$ are the same as defined above; each of $R^{51c}$ and $R^{52c}$ independently represents a hydrogen atom, a fluorine atom, an alkyl group of 1 to 5 carbon atoms or a fluorinated alkyl group of 1 to 5 carbon atoms; when a1 is 2 or more, the plurality of $R^{51c}$ and $R^{52c}$ may be the same or different from each other; each of a1 to a3, a5, a7, a9 and a11 to a13 independently represents an integer of 1 to 5; each of a4, a6, a8 and a11) independently represents 0 or an integer of 1 to 5; each of b1 to b5 independently represents 0 or 1; $R^{5c}$ represents a substituent; e represents an integer of 0 to 2; and $A_1$ represents a cyclic alkylene group of 4 to 20 carbon atoms.

In general formula (c11-1-1) above, a1 is preferably 1 to 3, and more preferably 1 or 2.

In general formula (c11-1-2) above, it is preferable that each of a2 and a3 independently represent 1 to 3, more preferably 1 or 2. b1 represents 0 or 1.

In general formula (c11-1-3), a4 is preferably 0 or 1 to 3, more preferably 0, 1 or 2, and most preferably 0 or 1. a5 is preferably 1 to 3, more preferably 1 or 2. As the substituent for $R^{5c}$, for example, a halogen atom, a lower alkyl group, an alkoxy group of 1 to 5 carbon atoms, a halogenated lower alkyl group, or an oxygen atom (=O) can be used. Examples of the halogen atom include a fluorine atom, a chlorine atom, an iodine atom and a bromine atom. e is preferably 0 or 1, and most preferably 0 from an industrial viewpoint. b2 is preferably 0.

In general formula (c11-1-4) above, a6 is preferably 0 or 1 to 3, more preferably 0, 1 or 2, and most preferably 0 or 1. a7 is preferably 1 to 3, more preferably 1 or 2. b3 is preferably 0. $R^5$ and e are the same as defined above.

In general formula (c11-1-5) above, $A_1$ represents a cyclic alkylene group of 4 to 20 carbon atoms, preferably a cyclic alkylene group of 5 to 15 carbon atoms, and more preferably a cyclic alkylene group of 6 to 12 carbon atoms. Specific examples include the aforementioned "cyclic aliphatic hydrocarbon groups" described above in relation to the aforementioned hydrocarbon group which may have a substituent.

In general formula (c11-2-1) above, a8 is preferably 0 or 1 to 3, more preferably 0, 1 or 2, and most preferably 0 or 1. a9 is preferably 1 to 3, more preferably 1 or 2. b4 is preferably 0. $R^{5c}$ and e are the same as defined above.

In general formula (c11-2-2) above, a10 is preferably 0 or 1 to 3, more preferably 0, 1 or 2, and most preferably 0 or 1. a11 is preferably 1 to 3, more preferably 1 or 2. b5 is preferably 0. $R^{5c}$ and e are the same as defined above.

In general formula (c11-2-3) above, a12 is preferably 1 to 3, more preferably 1 or 2. $R^{5c}$ and e are the same as defined above.

In general formula (c11-2-4) above, a13 is preferably 1 to 3, more preferably 1 or 2. $R^{5c}$ and e are the same as defined above.

Specific examples of structural units represented by the above general formulas (c11-1-1) to (c11-1-5) and (c11-2-1) to (c11-2-4) as well as other examples are shown below.

[Chemical Formula 67]

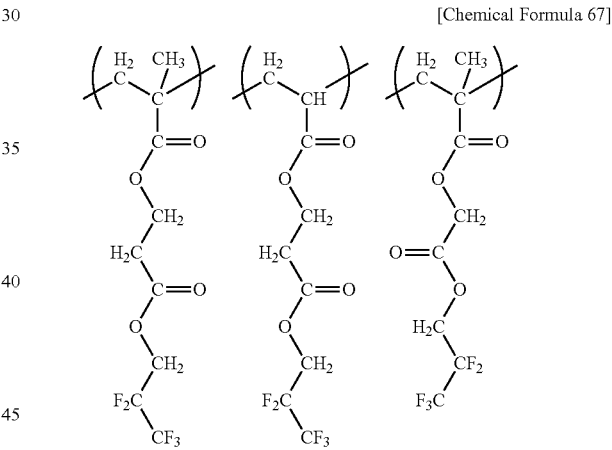

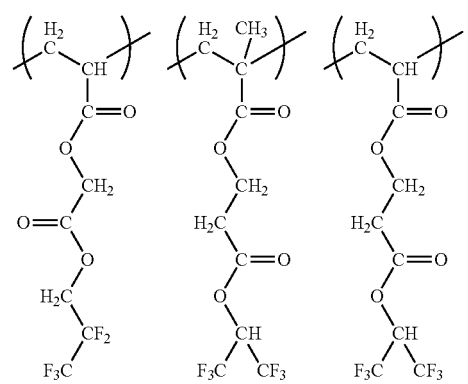

-continued
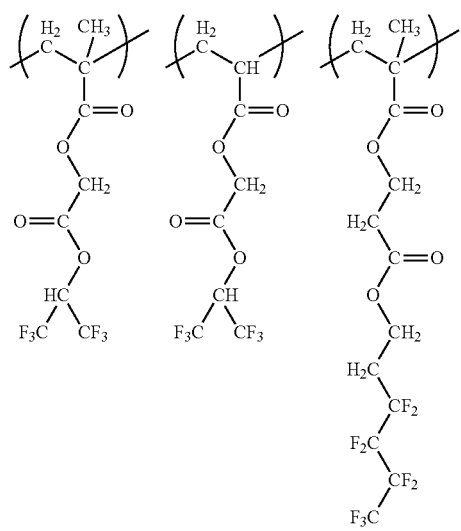
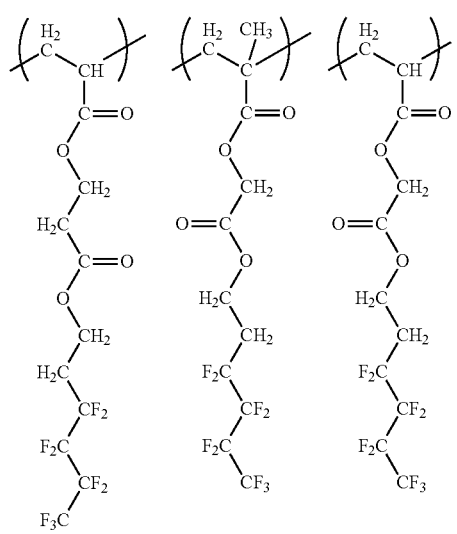
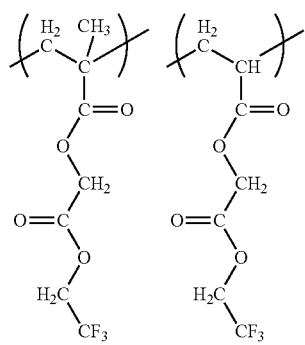
-continued
[Chemical Formula 68]
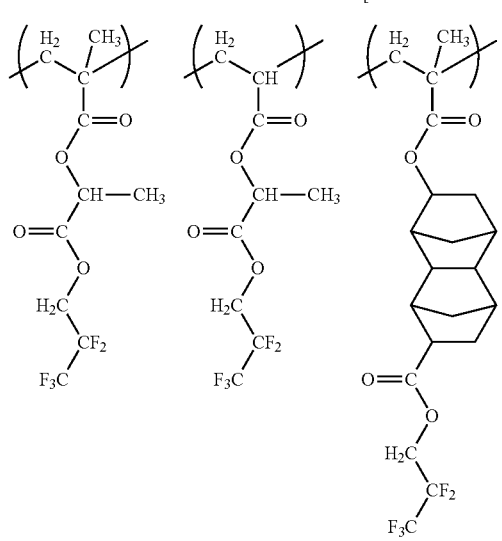
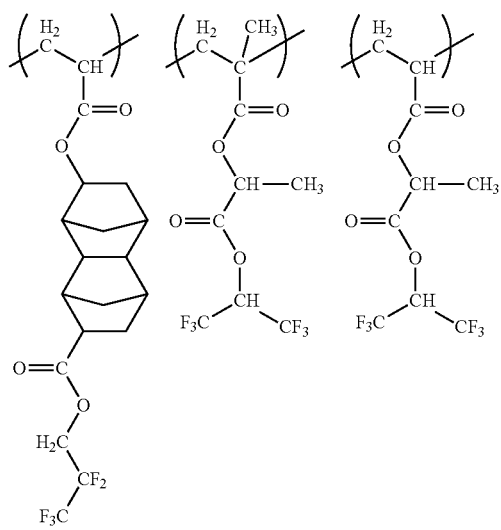
[Chemical Formula 69]
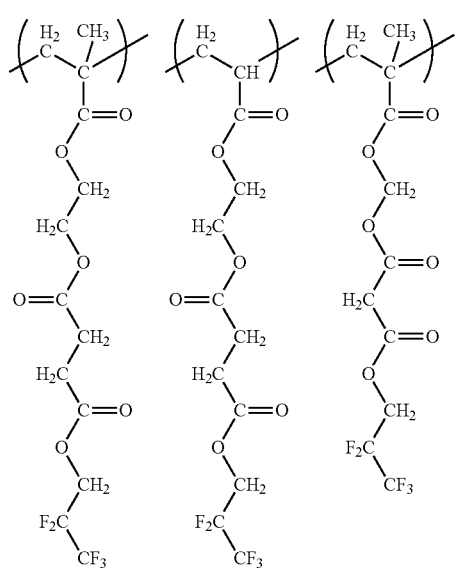

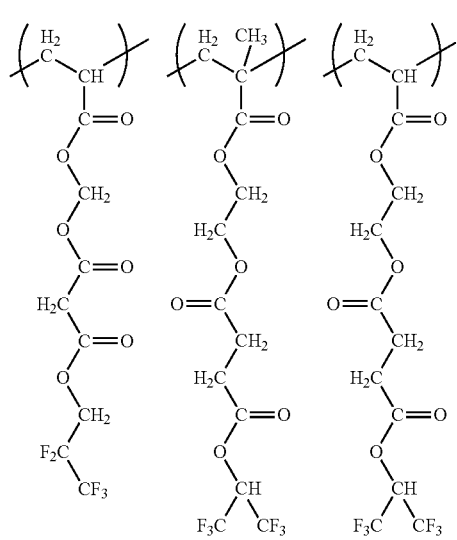
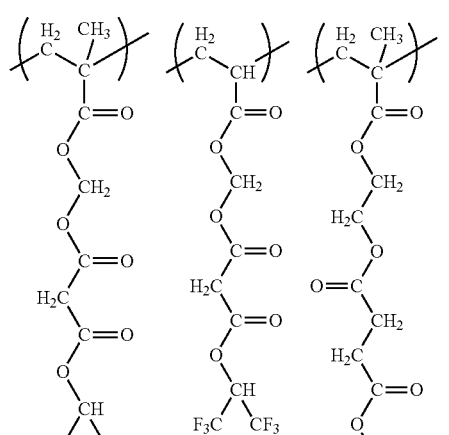
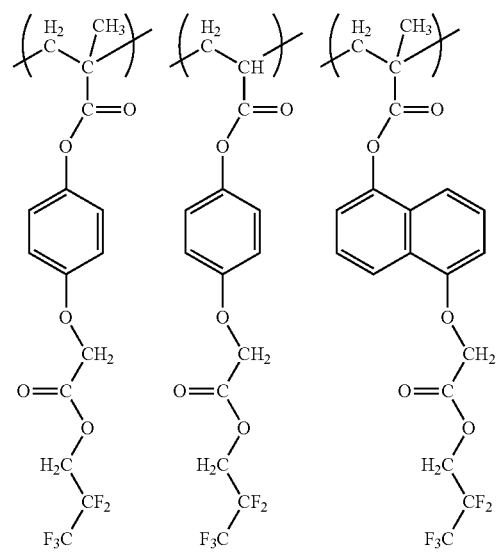
[Chemical Formula 70]

-continued
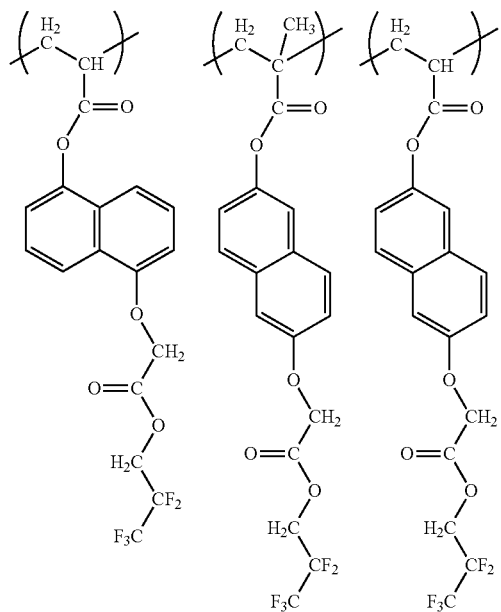
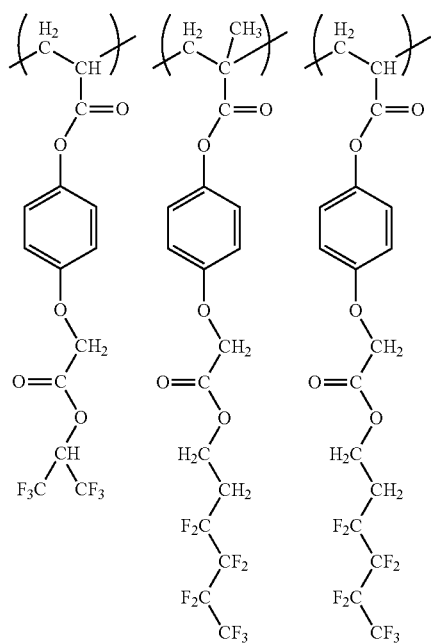
[Chemical Formula 71]
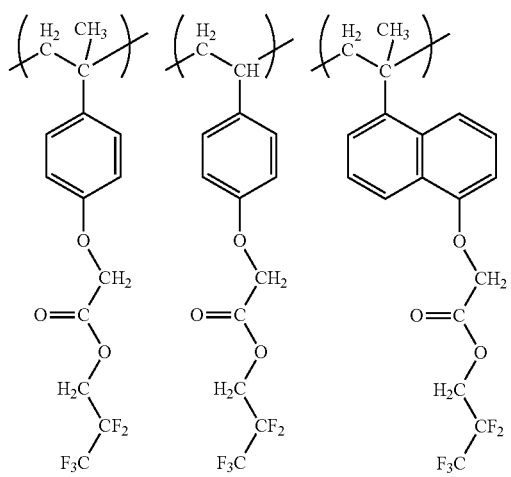
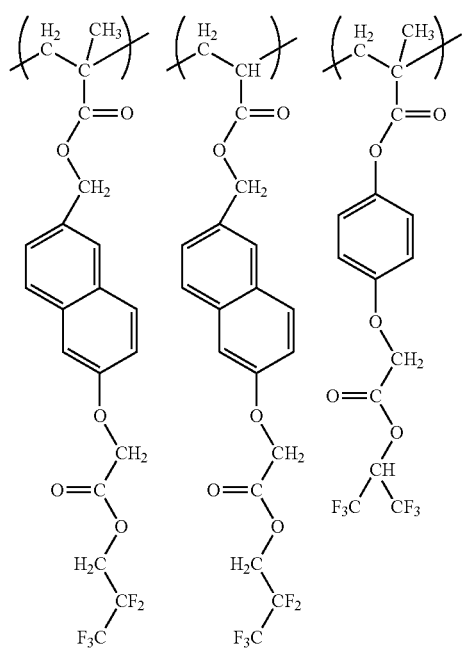
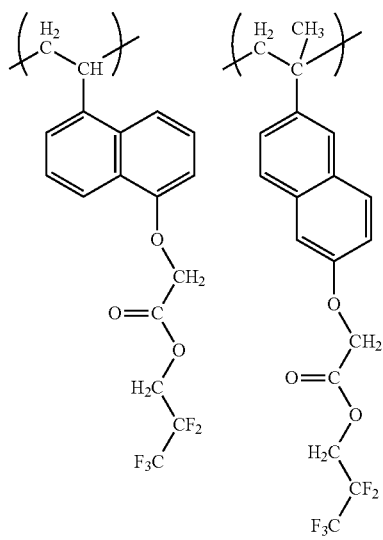

-continued

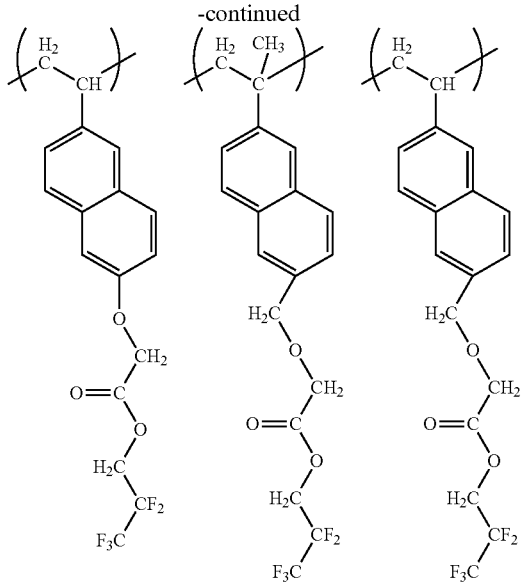

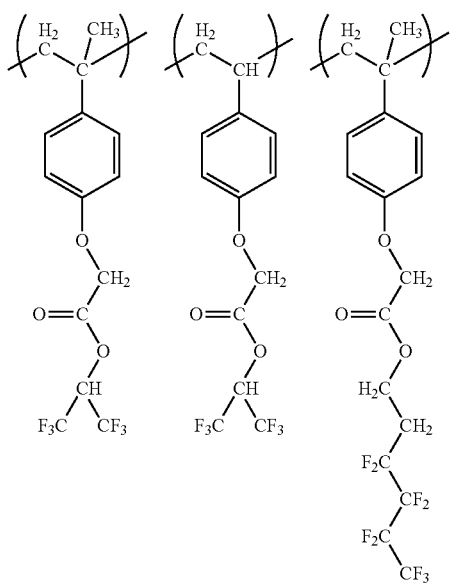

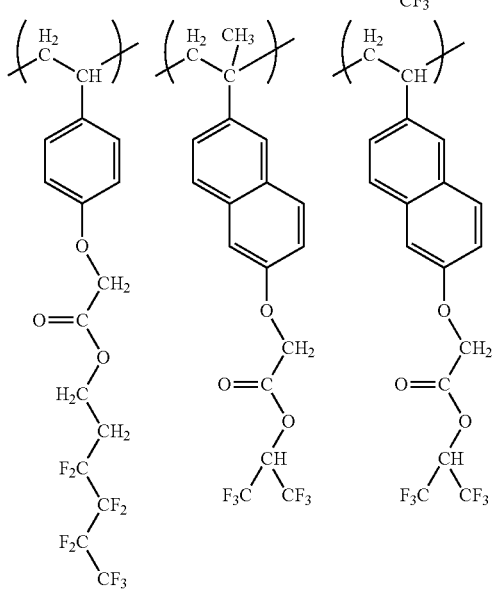

-continued

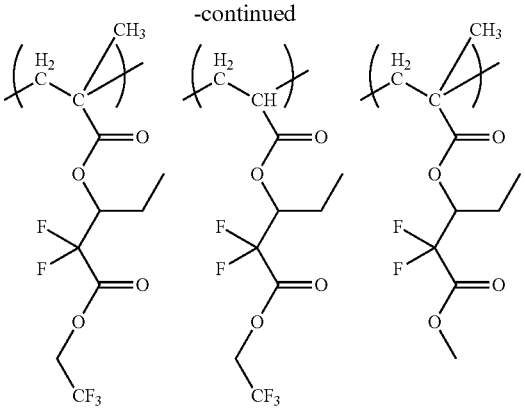

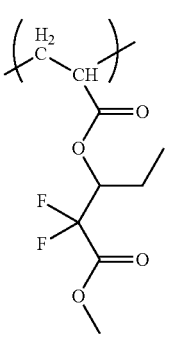

As the structural unit (c11), at least one structural unit selected from the group consisting of structural units represented by the aforementioned general formulas (c11-1-1) to (c11-1-5) and (c11-2-1) to (c11-2-4) is preferable, more preferably at least one structural unit selected from the group consisting of structural units represented by the aforementioned general formulas (c 11-1-1) to (c 11-1-5), (c 11-2-1) and (c 11-2-2), and most preferably at least one structural unit selected from the group consisting of structural units represented by the aforementioned general formulas (c11-1-1), (c11-1-5) and (c11-2-2).

As the structural unit (c11), one type of structural unit may be used alone, or two or more structural units may be used in combination.

In those cases where the structural unit (c11) is included within the component (C), the amount of the structural unit (c11) based on the combined total of all structural units constituting the component (C) is preferably 10 to 90 mol %, more preferably 20 to 90 mol %, and most preferably 30 to 90 mol %. When the amount of the structural unit (c11) is at least as large as the lower limit of the above-mentioned range, in the formation of a resist pattern, the hydrophobicity during immersion exposure is enhanced. On the other hand, by ensuring that the amount is not more than the upper limit of the above range, a good balance can be achieved with the other structural units.

(Structural Unit (c12))

Specific examples of preferable structural units for the structural unit (c12) include structural units represented by general formula (c12-1) shown below.

[Chemical Formula 72]

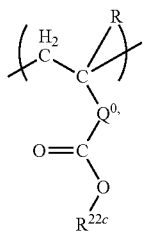
(c12-1)

[In formula (c12-1), R represents a hydrogen atom, an alkyl group of 1 to 5 carbon atoms or a halogenated alkyl group of 1 to 5 carbon atoms; $Q^{0'}$ represents a single bond or a divalent linking group; and $R^{22c}$ represents an acid dissociable group.]

In the above general formula (c12-1), R is the same as defined above, and is preferably a hydrogen atom or a methyl group.

Examples of the acid dissociable group for $R^{22c}$ include the same groups as those described above in the explanation of the acid dissociable group for $R^{2c}$.

Preferable examples of a structural unit represented by the above general formula (c12-1) in which $Q^{0'}$ is a single bond include structural units represented by general formulas (c12-1-1) to (c12-1-4) shown below.

In general formula (c12-1) above, when $Q^{0'}$ represents a divalent linking group, examples of the divalent linking group include the same groups as those described above for $X_{01}$ in general formula (c11-2), and a divalent aromatic hydrocarbon group. Examples of divalent aromatic hydrocarbon groups include aromatic hydrocarbon groups of 6 to 20 carbon atoms such as groups in which two hydrogen atoms have been removed from a benzene ring, a naphthalene ring or an anthracene ring.

In a structural unit (c12), $Q^{0'}$ is preferably a single bond or —C(=O)—O—$R^{c'}$— [wherein $R^{c'}$ represents a linear or branched alkylene group of 1 to 10 carbon atoms which may contain an oxygen atom, and the alkylene group may be fluorinated], and more preferably a single bond.

Preferable examples of a structural unit represented by the above general formula (c12-1) in which $Q^{0'}$ is —C(=O)—O—$R^{c'}$— include structural units represented by general formulas (c12-1-5) to (c12-1-11) shown below.

In the formulas shown below, R is the same as defined above, and is preferably a hydrogen atom or a methyl group.

[Chemical Formula 73]

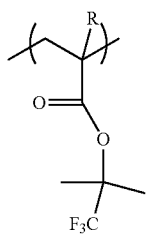
(c12-1-1)

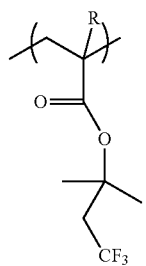
(c12-1-2)

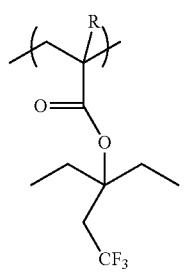
(c12-1-3)

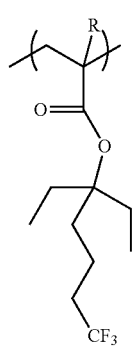
(c12-1-4)

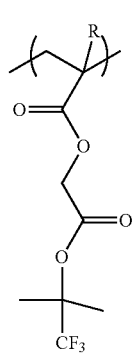
(c12-1-5)

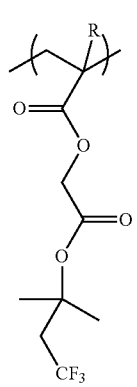
(c12-1-6)

(c12-1-7) 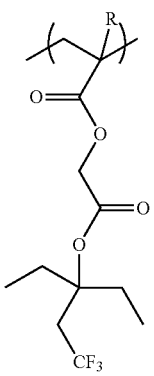

(c12-1-8) 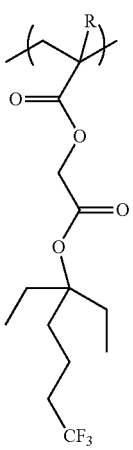

(c12-1-9) 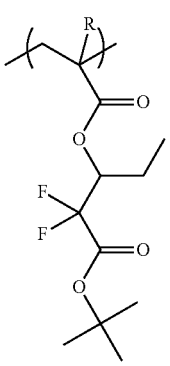

(c12-1-10) 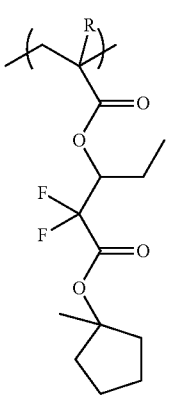

(c12-1-11) 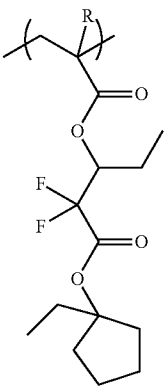

As the structural unit (c12), at least one structural unit selected from the group consisting of structural units represented by the above general formulas (c12-1-1) to (c12-1-11) is preferable, at least one structural unit selected from the group consisting of structural units represented by the above general formulas (c12-1-1) to (c12-1-8) is more preferable, and at least one structural unit selected from the group consisting of structural units represented by the above general formulas (c12-1-1) to (c12-1-4) is particularly desirable.

In the component (C), as the structural unit (c12), one type of structural unit may be used alone, or two or more types of structural units may be used in combination.

When the component (C) includes the structural unit (c12), the amount of the structural unit (c12) based on the combined total of all structural units constituting the component (C) is preferably 10 to 100 mol %, more preferably 30 to 90 mol %, and most preferably 50 to 90 mol %. When the amount of the structural unit (c12) is at least as large as the lower limit of the above-mentioned range, in the formation of a resist pattern, the hydrophobicity during immersion exposure is enhanced. Further, the lithographic properties are also improved. On the other hand, by ensuring that the amount is not more than the upper limit of the above-mentioned range, a good balance can be achieved with the other structural units. Further, the structural unit (c12) can also be used as a homopolymer.

[Structural Unit (c2)]

The component (C) may contain a structural unit (c2) other than the aforementioned structural unit (c1), as long as the effects of the present invention are not impaired.

The structural unit (c2) is represented by general formula (c2-1) shown below.

[Chemical Formula 74]

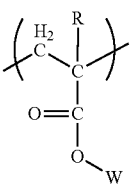

(c2-1)

[In the formula, R represents a hydrogen atom, an alkyl group of 1 to 5 carbon atoms or a halogenated lower alkyl group of 1 to 5 carbon atoms; and W is a group represented by any one of general formulas (w-1) to (w-4) shown below.]

[Chemical Formula 75]

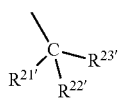  (w-1)

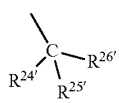  (w-2)

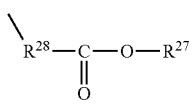  (w-3)

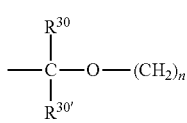  (w-4)

[In general formula (w-1), $R^{21'}$ represents an alkyl group of 2 or more carbon atoms, and $R^{22'}$ and $R^{23'}$ are bonded to each other to form an aliphatic monocyclic group of 7 or more carbon atoms; in general formula (w-2), $R^{24'}$ represents a branched alkyl group of 3 or more carbon atoms, and $R^{25'}$ and $R^{26'}$ are bonded to each other to form an aliphatic cyclic group; in general formula (w-3), $R^{27}$ represents an acid dissociable, dissolution inhibiting group, and $R^{28}$ represents a divalent linking group; in general formula (w-4), $R^{29'}$ represents a linear or branched alkyl group or an aliphatic cyclic group, n represents an integer of 0 to 3, $R^{30}$ and $R^{30'}$ each independently represents a linear or branched alkyl group or a hydrogen atom, and $R^{29'}$ and $R^{30}$ may be bonded to each other to form an aliphatic cyclic group.]

In general formula (c2-1) above, R is the same as defined above, and is preferably a hydrogen atom or a methyl group.

W is a group represented by any one of the above general formulas (w-1) to (w-4).

In general formula (w-1), $R^{21'}$ represents an alkyl group of 2 or more carbon atoms, and $R^{22'}$ and $R^{23'}$ are bonded to each other to form an aliphatic monocyclic group of 7 or more carbon atoms.

The alkyl group for $R^{21'}$ may be any of linear, branched or cyclic.

When the alkyl group is linear or branched, the alkyl group preferably has 2 to 5 carbon atoms, and examples thereof include an ethyl group, a propyl group, an isopropyl group, an n-butyl group, an isobutyl group, a tert-butyl group, a pentyl group, an isopentyl group and a neopentyl group. Among these, an ethyl group or a propyl group is more preferable, and an ethyl group is particularly desirable.

When the alkyl group is a cyclic alkyl group, the alkyl group preferably has 4 to 15 carbon atoms, more preferably 4 to 12 carbon atoms, and most preferably 5 to 10 carbon atoms. Examples thereof include groups in which one hydrogen atom has been removed from a monocycloalkane; and groups in which one hydrogen atom has been removed from a polycycloalkane such as a bicycloalkane, a tricycloalkane, or a tetracycloalkane. Specific examples include groups in which one hydrogen atom has been removed from a monocycloalkane such as cyclopentane or cyclohexane; and groups in which one hydrogen atom has been removed from a polycycloalkane such as adamantane, norbornane, isobornane, tricyclodecane or tetracyclododecane.

$R^{21'}$ is preferably a linear or branched alkyl group.

In general formula (w-1), $R^{22'}$ and $R^{23'}$ re bonded to each other and, together with the carbon atoms to which the $R^{22'}$ and $R^{23'}$ groups are bonded, form an aliphatic monocyclic group of 7 or more carbon atoms.

The number of carbon atoms within the aliphatic monocyclic group is preferably no less than 8. Further, the number of carbon atoms within the aliphatic monocyclic group is preferably no more than 12, more preferably no more than 10, and still more preferably no more than 9.

The aliphatic cyclic group may be either saturated or unsaturated, but is preferably saturated. Furthermore, the aliphatic cyclic group may also be a hydrocarbon group composed solely of carbon and hydrogen atoms, or may include other atoms (hetero atoms such as an oxygen atom, a nitrogen atom and a sulfur atom), but is preferably a hydrocarbon group.

A substituent may be bonded to the aliphatic cyclic group. Examples of the substituent include an alkyl group of 1 to 5 carbon atoms, a fluorine atom, a fluorinated alkyl group of 1 to 5 carbon atoms which is substituted by a fluorine atom, and an oxygen atom (=O).

Specific examples of preferred groups represented by general formula (w-1) include the groups shown below.

[Chemical Formula 76]

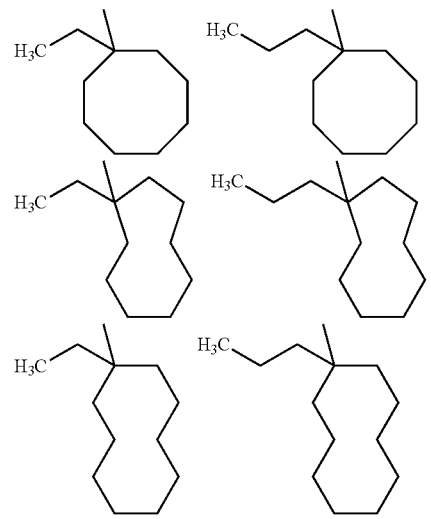

In general formula (w-2), $R^{24'}$ represents a branched alkyl group of 3 or more carbon atoms, and $R^{25'}$ and $R^{26'}$ are bonded to each other to form an aliphatic cyclic group. The alkyl group for $R^{24'}$ preferably has 3 to 10 carbon atoms, and more preferably 3 to 5 carbon atoms. Specific examples of alkyl groups include an isopropyl group, an isobutyl group, a tert-butyl group, an isopentyl group and a neopentyl group, and an isopropyl group is particularly desirable.

In general formula (w-2), $R^{25'}$ and $R^{26'}$ are bonded to each other and, together with the carbon atoms to which $R^{25'}$ and $R^{26'}$ are bonded, form an aliphatic cyclic group.

The aliphatic cyclic group may be either a monocyclic group or a polycyclic group.

The aliphatic cyclic group may be either saturated or unsaturated, but is preferably saturated. Furthermore, the aliphatic cyclic group may also be a hydrocarbon group composed solely of carbon and hydrogen atoms, or may include other atoms (hetero atoms such as an oxygen atom, a nitrogen atom and a sulfur atom), but is preferably a hydrocarbon group.

The number of carbon atoms within the aliphatic cyclic group is preferably within a range from 4 to 15, more preferably from 4 to 12, and most preferably from 5 to 10.

Specific examples of the aliphatic cyclic group include groups in which one hydrogen atom has been removed from a monocycloalkane; and groups in which one hydrogen atom has been removed from a polycycloalkane such as a bicycloalkane, a tricycloalkane, or a tetracycloalkane. Specific examples include groups in which one hydrogen atom has been removed from a monocycloalkane such as cyclopentane and cyclohexane; and groups in which one hydrogen atom has been removed from a polycycloalkane such as adamantane, norbornane, isobornane, tricyclodecane or tetracyclododecane.

A substituent may be bonded to the aliphatic cyclic group. Examples of the substituent include an alkyl group of 1 to 5 carbon atoms, a fluorine atom, a fluorinated alkyl group of 1 to 5 carbon atoms which is substituted by a fluorine atom, and an oxygen atom (=O).

Specific examples of preferred groups represented by general formula (w-2) include the groups shown below.

[Chemical Formula 77]

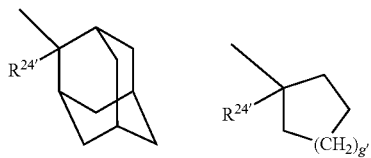

[In the formulas, $R^{24'}$ is the same as defined above, and g' is an integer of 0 to 3.]

g' is preferably an integer of 1 to 3, and more preferably 1 or 2.

In general formula (w-3), $R^{27}$ represents an acid dissociable, dissolution inhibiting group, and $R^{28}$ represents a divalent linking group.

When the component (C) is blended with the component (B) into a resist composition, the acid dissociable, dissolution inhibiting group for $R^{27}$ exhibits acid dissociability so as to be dissociated by the action of acid generated from the component (B) upon exposure, and also an alkali dissolution-inhibiting effect that renders the component (C) insoluble in an alkali developing solution prior to dissociation.

As the acid dissociable, dissolution inhibiting group for $R^{27}$, there is no particular limitation, and any of the groups that have been proposed as acid dissociable, dissolution inhibiting groups for the base resins of chemically amplified resists can be used. Specifically, the same acid dissociable, dissolution inhibiting groups as those included in the structural unit (a1) in the component (A) described earlier can be mentioned.

In the present invention, as the divalent linkage group for $R^{28}$, an alkylene group, a divalent aliphatic cyclic group, or a divalent linking group containing a hetero atom is preferable.

When $R^{28}$ represents an alkylene group, the group preferably has 1 to 10 carbon atoms, more preferably 1 to 6 carbon atoms, still more preferably 1 to 4 carbon atoms, and most preferably 1 to 3 carbon atoms.

When $R^{28}$ represents a divalent aliphatic cyclic group, as the aliphatic cyclic group, the same groups as those mentioned above in connection with the explanation of "aliphatic cyclic group" in general formula (w-2) above can be used, with the exception that two or more hydrogen atoms have been removed therefrom. It is particularly desirable that the aliphatic cyclic group be a group in which two or more hydrogen atoms have been removed from cyclopentane, cyclohexane, norbornane, isobornane, adamantane, tricyclodecane or tetracyclododecane.

When $R^{28}$ represents a divalent linking group containing a hetero atom, examples of the divalent linking groups containing a hetero atom include —O—, —C(=O)—O—, —C(=O)—, —O—C(=O)—O—, —C(=O)—NH—, —NH— (in the formula, the H may be replaced with a substituent such as an alkyl group or an acyl group), —S—, —S(=O)$_2$—, —S(=O)$_2$—O—, a group represented by formula -$A^{01}$-O-$B^{01}$-, and a group represented by formula -[$A^{01}$-C(=O)—O]$_{m'}$-$B^{01}$-. Here, each of $A^{01}$ and $B^{01}$ independently represents a divalent hydrocarbon group which may have a substituent, and m' represents an integer of 0 to 3.

When $R^{28}$ represents —NH— (and when the H in the formula is replaced with a substituent such as an alkyl group or an acyl group), the substituent preferably has 1 to 10 carbon atoms, more preferably 1 to 8 carbon atoms, and most preferably 1 to 5 carbon atoms.

When $R^{28}$ is a group represented by formula -$A^{01}$-O-$B^{01}$- or a group represented by formula -[$A^{01}$-C(=O)—O]$_{m'}$-$B^{01}$-, each of $A^{01}$ and $B^{01}$ independently represents a divalent hydrocarbon group which may have a substituent.

m' is an integer of 0 to 3, preferably an integer of 0 to 2, more preferably 0 or 1, and most preferably 1.

The hydrocarbon group represented by $A^{01}$ may be either an aliphatic hydrocarbon group or an aromatic hydrocarbon group. An aliphatic hydrocarbon group refers to a hydrocarbon group that has no aromaticity.

The aliphatic hydrocarbon group represented by $A^{01}$ may be either saturated or unsaturated, but in general, the aliphatic hydrocarbon group is preferably saturated.

More specific examples of the aliphatic hydrocarbon group represented by $A^{01}$ include a linear or branched aliphatic hydrocarbon group, and an aliphatic hydrocarbon group that contains a ring within the structure thereof.

The "linear or branched aliphatic hydrocarbon group" represented by $A^{01}$ preferably has 1 to 10 carbon atoms, more preferably 1 to 8 carbon atoms, still more preferably 1 to 5 carbon atoms, and most preferably 1 or 2 carbon atoms.

As the linear aliphatic hydrocarbon group, a linear alkylene group is preferred, and specific examples thereof include a methylene group, an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, a branched alkylene group is preferred, and specific examples thereof include various alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$— and —C(CH$_2$CH$_3$)$_2$—CH$_2$—; alkyltrimethylene groups such as —CH(CH$_3$)CH$_2$CH$_2$— and —CH$_2$CH(CH$_3$)CH$_2$—; and alkyltetramethylene groups such as —CH(CH$_3$)CH$_2$CH$_2$CH$_2$— and —CH$_2$CH(CH$_3$)CH$_2$CH$_2$—. As the alkyl group within the alkylalkylene group, a linear alkyl group of 1 to 5 carbon atoms is preferable.

The linear or branched aliphatic hydrocarbon group (chain-like aliphatic hydrocarbon group) may or may not have a substituent. Examples of the substituent include a fluorine atom, a fluorinated alkyl group of 1 to 5 carbon atoms which is substituted by a fluorine atom, and an oxygen atom (=O).

Examples of the "aliphatic hydrocarbon group that contains a ring within the structure thereof" represented by $A^{01}$ include cyclic aliphatic hydrocarbon groups (groups in which two hydrogen atoms have been removed from an aliphatic hydrocarbon ring), and groups in which this type of cyclic aliphatic hydrocarbon group is either bonded to the terminal of an aforementioned linear aliphatic hydrocarbon group or interposed within the linear aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Specific examples of the polycycloalkane include adamantane, norbornane, isobornane, tricyclodecane and tetracyclododecane.

The cyclic aliphatic hydrocarbon groups may or may not have a substituent. Examples of the substituent include an alkyl group of 1 to 5 carbon atoms, a fluorine atom, a fluorinated alkyl group of 1 to 5 carbon atoms which is substituted by a fluorine atom, and an oxygen atom (=O).

The group $A^{01}$ is preferably a linear aliphatic hydrocarbon group, more preferably a linear alkylene group, still more preferably a linear alkylene group of 1 to 5 carbon atoms, still more preferably a methylene group or an ethylene group, and most preferably an ethylene group.

Examples of the hydrocarbon group represented by $B^{01}$ include the same divalent hydrocarbon groups as those mentioned above for $A^{01}$.

As the group $B^{01}$, a linear or branched aliphatic hydrocarbon group is preferred, and a methylene group, an ethylene group or an alkylmethylene group is particularly desirable.

The alkyl group within the alkylmethylene group is preferably a linear alkyl group of 1 to 5 carbon atoms, is more preferably a linear alkyl group of 1 to 3 carbon atoms, and is most preferably a methyl group.

Further, in the group represented by formula $-[A^{01}-C(=O)-O]_{m'}-B^{01}-$, m' is an integer of 0 to 3, preferably an integer of 0 to 2, more preferably 0 or 1, and most preferably 1.

In the present invention, as the divalent linking group for $R^{28}$, a divalent linking group containing a hetero atom is preferable, and a linear group having an oxygen atom as a hetero atom, for example, a group that includes an ester bond is particularly desirable.

Of these divalent linking groups, groups represented by the aforementioned formula $-A^{01}-O-B^{01}-$ or formula $-A^{01}-C(=O)-O-B^{01}-$ are preferable, and a group represented by formula $-(CH2)_{a''}-C(=O)-O-(CH2)_{b''}-$ is particularly desirable.

a" represents an integer of 1 to 5, is preferably 1 or 2, and is most preferably 2.

b" represents an integer of 1 to 5, is preferably 1 or 2, and is most preferably 1.

In general formula (w-4), $R^{29'}$ represents a linear or branched alkyl group or an aliphatic cyclic group.

When $R^{29'}$ represents a linear or branched alkyl group, it is preferably an alkyl group of 1 to 15 carbon atoms, more preferably an alkyl group of 1 to 5 carbon atoms, still more preferably an ethyl group or a methyl group, and most preferably an ethyl group.

When $R^{29'}$ represents an aliphatic cyclic group, as the aliphatic cyclic group, any of the aliphatic monocyclic/polycyclic groups which have been proposed for conventional ArF resists and the like can be appropriately selected for use. For example, the same groups described above in connection with the "aliphatic cyclic group" can be mentioned.

The aliphatic cyclic group for $R^{29'}$ preferably has 4 to 15 carbon atoms, more preferably 4 to 12 carbon atoms, and most preferably 5 to 10 carbon atoms. Specific examples thereof include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane and cyclohexane; and groups in which one or more hydrogen atoms have been removed from a polycycloalkane such as adamantane, norbornane, isobornane, tricyclodecane or tetracyclododecane. Of these, a group in which one or more hydrogen atoms have been removed from adamantane is preferable.

In general formula (w-4), n is an integer of 0 to 3, preferably an integer of 0 to 2, more preferably 0 or 1, and most preferably 0.

$R^{30}$ and $R^{30'}$ each independently represents a linear or branched alkyl group or a hydrogen atom.

As the linear or branched alkyl group for $R^{30}$ and $R^{30'}$, an alkyl group of 1 to 5 carbon atoms is preferable. As the alkyl group of 1 to 5 carbon atoms, the same alkyl groups of 1 to 5 carbon atoms as those described above for R can be used, although a methyl group or an ethyl group is preferable, and a methyl group is particularly desirable.

In the present invention, it is preferable that at least one of $R^{30}$ and $R^{30'}$ be a hydrogen atom.

Further, in general formula (w-4) above, $R^{29'}$ and $R^{30}$ may be bonded to each other to form an aliphatic cyclic group.

In such a case, an aliphatic cyclic group is formed by $R^{29'}$, $R^{30}$, $-O-(CH_2)_n-$ and the carbon atom having $R^{30}$ bonded thereto. Such an aliphatic cyclic group is preferably a 4- to 7-membered ring, and more preferably a 4- to 6-membered ring. Specific examples of the aliphatic cyclic group include a tetrahydropyranyl group and a tetrahydrofuranyl group.

Specific examples of preferred groups represented by general formula (w-4) include the groups represented by formulas (w-4-1) to (w-4-12) shown below.

[Chemical Formula 78]

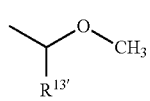

(w-4-1)

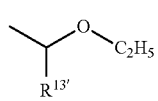

(w-4-2)

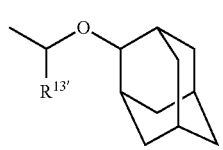

(w-4-3)

-continued (w-4-4) 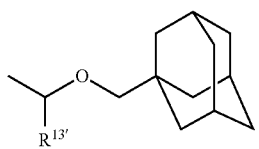

(w-4-5) 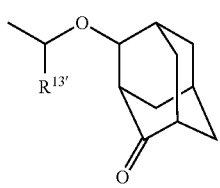

(w-4-6) 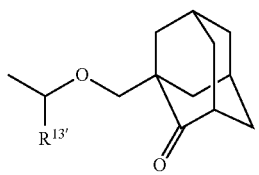

(w-4-7) 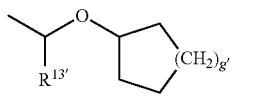

(w-4-8) 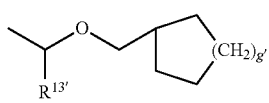

(w-4-9) 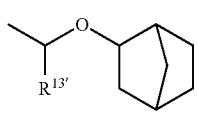

(w-4-10) 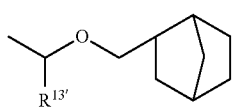

(w-4-11) 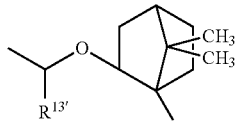

(w-4-12) 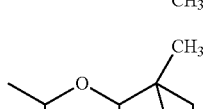

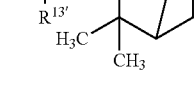

[In the formulas, $R^{13'}$ represents a hydrogen atom or a methyl group, and g' is the same as defined above.]

In the component (C), as the structural unit (c2), one type of structural unit may be used alone, or two or more types of structural units may be used in combination.

When the component (C) includes the structural unit (c2), the amount of the structural unit (c2) based on the combined total of all structural units constituting the component (C) is preferably 5 to 80 mol %, more preferably 10 to 60 mol %, still more preferably 15 to 50 mol %, and most preferably 20 to 40 mol %. When the amount of the structural unit (c2) is at least as large as the lower limit of the above-mentioned range, the characteristic feature of exhibiting hydrophobicity during immersion exposure, but then exhibiting increased hydrophilicity during exposure and post exposure baking (PEB) is improved. Moreover, formation of bridge-type defects in a line and space pattern or formation of "Not Open" defects in which a portion of, or all of, a contact hole pattern is not open can be suppressed. Furthermore, the proportion of hydrocarbon groups within the component (C) increases and the water tracking ability during immersion exposure using a scanning-type immersion exposure apparatus is improved. On the other hand, when the amount of the structural unit (c2) is not more than the upper limit of the above-mentioned range, a good balance can be achieved with the structural unit (c1), and the effects of the water repellency are improved.

[Other Structural Units]

The component (C) may include a structural unit other than the aforementioned structural unit (c1) and the structural unit (c2) (hereafter, referred to as "structural unit (c3)"), as long as the effects of the present invention are not impaired.

There are no particular limitations on the structural unit (c3), provided the structural unit is derived from a compound that is copolymerizable with the compound that gives rise to the structural unit (c1) and the compound that gives rise to the structural unit (c2). Examples of such structural units include structural units which have been proposed for the base resin of a conventional chemically amplified resist (such as the aforementioned structural units (a1) to (a4)) which do not fall under the category of the structural units (c1) and (c2)).

In the component (C), as the structural unit (c3), one type of structural unit may be used alone, or two or more types of structural units may be used in combination.

When the component (C) includes the structural unit (c3), the amount of the structural unit (c3) based on the combined total of all structural units constituting the component (C) is preferably 1 to 25 mol %, more preferably 5 to 20 mol %, and most preferably 10 to 20 mol %.

In the present invention, the component (C) is preferably a polymer including the structural unit (c11), a polymer including the structural unit (c12), or a polymer including the structural unit (c2).

Preferable examples of such polymers include a polymer consisting of at least one type of structural unit (c11), a copolymer consisting solely of one type of structural unit (c12), and a copolymer consisting of a structural unit (c11) and a structural unit (c2).

The weight average molecular weight (Mw) (the polystyrene equivalent value determined by gel permeation chromatography) of the component (C) is not particularly limited, but is preferably 2,000 to 50,000, more preferably 3,000 to 30,000, and most preferably 4,000 to 25,000. When the weight average molecular weight is no more than the upper limit of the above-mentioned range, the resist composition exhibits a satisfactory solubility in a resist solvent when used as a resist. On the other hand, when the weight average molecular weight is at least as large as the lower limit of the above-mentioned range, dry etching resistance and the cross-sectional shape of the resist pattern becomes satisfactory.

Further, the dispersity (Mw/Mn) is preferably 1.0 to 5.0, more preferably 1.0 to 3.0, and most preferably 1.2 to 2.5. Here, Mn is the number average molecular weight.

The component (C) described above can be used favorably as an additive for a resist composition for immersion exposure.

As the component (C), one type of the above-mentioned fluorinated polymeric compound may be used alone, or two or more types of the compounds may be used in combination.

In the resist composition for immersion exposure of the present invention, the amount of the component (C) relative to 100 parts by weight of the component (A) is preferably 0.1 to 50 parts by weight, more preferably 0.1 to 40 parts by weight, still more preferably 0.5 to 30 parts by weight, and most preferably 0.5 to 15 parts by weight.

By making the amount of the component (C) at least as large as the lower limit of the above-mentioned range, the hydrophobicity of the resist film formed using the resist composition for immersion exposure improves, yielding a level of hydrophobicity that is ideal for immersion exposure. Further, improvement in hydrophilicity of the resist film when the resist film comes into contact with an alkali developing solution becomes significant. On the other hand, by ensuring that the amount of the component (C) is no more than the upper limit of the above-mentioned range, the lithography properties are improved.

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

<Optional Component—Component (S)>

The positive resist composition of the present invention can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate, depending on the thickness of the coating film. In general, the organic solvent is used in an amount such that the solid content of the resist composition becomes within the range from 1 to 20% by weight, and preferably from 2 to 15% by weight.

According to the positive resist composition of the present invention, excellent lithography properties, such as line width roughness (LWR) and critical dimension uniformity (CDU), as well as a favorable pattern shape (for example, a favorable rectangularity in the case of a line pattern and a favorable circularity in the case of a hole pattern) can be achieved. LWR refers to the phenomenon in which the line widths of a line pattern formed using a resist composition becomes heterogeneous.

Although the reason why the above effects are achieved has not been elucidated yet, the following factors are thought to be responsible: that is, the nucleophilicity or basicity of an amine is suppressed due to the use of the compound (d1), so as to prevent the amine from reacting with, and promoting the degradation of, an ester bond portion within the acid generator or base material component contained in the resist composition. Therefore, the resist composition of the present invention exhibits superior storage stability, and various lithography properties described above and the shape of the pattern become satisfactory.

Further, since the nitrogen-containing organic compound component (D) of the present invention has a bulky structure (d1) with high hydrophobicity compared to that of a commonly used tertiary amine or the like, it is thought that when conducting immersion exposure, the degree of elution into water or the like which is serving as an immersion medium can be reduced, the level of contamination of the lens can be lowered, and the lithography properties are improved.

<<Method of Forming a Resist Pattern>>

The method of forming a resist pattern according to the present invention includes: applying a positive resist composition of the present invention to a substrate to form a resist film on the substrate; conducting exposure of the resist film; and developing the resist film to form a resist pattern.

More specifically, the method for forming a resist pattern according to the present invention can be performed, for example, as follows.

Firstly, a positive resist composition of the present invention is applied onto a substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus, an electron beam exposure apparatus, an EUV exposure apparatus or the like, the resist film is selectively exposed either through a mask pattern or directly irradiated with electron beam without a mask pattern, followed by post exposure bake (PEB) under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water, and drying. If desired, a bake treatment (post bake) can be conducted following the developing.

In this manner, a resist pattern that is faithful to the mask pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) can be used.

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The positive resist composition of the present invention is effective to KrF excimer laser, ArF excimer laser, EB and EUV, and particularly effective to ArF excimer laser.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

EXAMPLES

As follows is a more detailed description of the present invention based on a series of examples, although the scope of the present invention is in no way limited by these examples.

In the present example, a unit represented by chemical formula (1) will be described as "compound (1)", and the same applies to the compounds represented by other formulas.

Synthesis Example for Component (D)

Synthesis of Compound (D)-1

(i) First step

A 2 L three-necked flask fitted with a thermometer, a stirrer, a nitrogen inlet tube and a dropping funnel was charged with 217.2 g (2.400 mol) of acryloyl chloride and 520 g of toluene, and the internal temperature was cooled to 0° C. 190.4 g (2.880 mol) of cyclopentadiene was then added dropwise from the dropping funnel over a period of 1 hour. Following completion of the dropwise addition, the resulting mixture was stirred for 1 hour at 0° C., thereby preparing a reaction intermediate solution. A 2 L three-necked flask fitted with a thermometer, a stirrer, a nitrogen inlet tube and a dropping funnel was charged with 201.1 g (2.750 mol) of tert-butylamine and 513 g of toluene, and the internal temperature was cooled to 0° C. The reaction intermediate solution prepared previously was added dropwise thereto from the dropping funnel over a period of 1.5 hours, and the internal temperature was then raised to 25° C. To the reaction mixture were added 1.800 ml of ethyl acetate and 300 ml of water, and following 30 minutes of stirring, the resulting mixture was allowed to stand to obtain an organic layer. The resulting organic layer was concentrated under reduced pressure. To the obtained concentrate were added 750 ml of ethyl acetate and 250 ml of hexane, and the resulting mixture was heated to 40° C. Following cooling of the resultant to 2° C. with stirring, the precipitated crystals were collected by filtration. The obtained crystals were dried under reduced pressure, thereby obtaining 124.3 g (0.643 mol; yield: 26.8%) of N-tert-butyl-bicyclo[2.2.1]hept-5-ene-2-carboxamide having the following physical properties.

$^1$H-NMR (270 MHz, CDCl$_3$, TMS, ppm) δ: 6.24 (1H, m), 5.97 (1H, m), 5.20 (1H, br), 3.09 (1H, s), 2.90 (1H, s), 2.77 (1H, m), 1.86 (1H, m), 1.42 (1H, m), 1.35 (9H, s), 1.39-1.30 (2H, m).

[Chemical Formula 79]

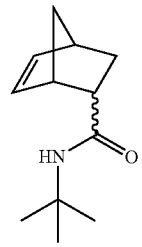

(ii) Second Step

A 2 L three-necked flask fitted with a thermometer, a stirrer, a nitrogen inlet tube and a dropping funnel was charged with 50.0 g (0.259 mol) of N-tert-butylbicyclo[2.2.1]hept-5-ene-2-carboxamide, 250 g of methylene chloride, 121.6 g (0.880 mol) of potassium carbonate and 550 g of water, and the internal temperature was cooled to 0° C. 75.9 g (0.440 mol) of m-chloroperbenzoic acid and 1.559 g of methylene chloride were then added dropwise from the dropping funnel over a period of 20 minutes. Following stirring for 4 hours at a temperature from 0 to 7° C., 22 g of a saturated aqueous solution of sodium sulfite was added thereto, and the resulting mixture was stirred for 30 minutes. The resultant was allowed to stand and then separated, and the resulting organic layer was then washed twice with 400 ml of water. Following concentration of the resulting organic layer under reduced pressure, 554 g of diisopropyl ether and 222 g of hexane were added thereto. Subsequently, the internal temperature was raised to 50° C. to dissolve solids, and then the temperature was cooled to 2° C. to conduct a crystallization operation. Following collection of the precipitated crystals by filtration, the obtained crystals were dried under reduced pressure, thereby obtaining 26.4 g (0.126 mol; yield: 48.6%) of N-tert-butyl-5,6-epoxybicyclo[2.2.1]hept-2-carboxamide having the following physical properties.

$^1$H-NMR (270 MHz, CDCl$_3$, TMS, ppm) δ: 5.31 (1H, br), 3.12 (2H, m), 2.60 (1H, s), 2.52 (1H, s), 2.04 (1H, m), 1.92 (1H, m), 1.59 (1H, m), 1.35 (9H, s), 1.39-1.30 (2H, m).

[Chemical Formula 80]

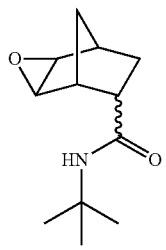

(iii) Third Step

A 2 L three-necked flask fitted with a thermometer, a stirrer, a nitrogen inlet tube and a dropping funnel was charged with 61.0 g (0.544 mol) of potassium tert-butoxide and 1.045 g of tert-butanol, and the internal temperature was raised to 50° C. 56.9 g (0.272 mol) of N-tert-butyl-5,6-epoxybicyclo[2.2.1]hept-2-carboxamide was then added thereto over a period of 1 hour. Subsequently, the internal temperature was cooled to 25° C., and 620 g of a 3.9% by weight hydrochloric acid and 1,900 ml of ethyl acetate were then added thereto, and the resulting mixture was stirred for 30 minutes. The resultant was allowed to stand and then separated, and the resulting organic layer was then washed twice with 400 ml of water. Following concentration of the resulting organic layer under reduced pressure, 30 g of methanol and 820 g of diisopropyl ether were added thereto, and the internal temperature was then raised to 50° C. to dissolve solids. Subsequently, the temperature was cooled to 0° C., and the precipitated crude crystals were collected by filtration. To the obtained crude crystals were added 200 g of ethyl acetate and 200 g of diisopropyl ether, and the internal temperature was then raised to 50° C. to dissolve solids. Subsequently, the temperature was cooled to 0° C., and the precipitated crystals were collected by filtration. The obtained crystals were dried under reduced pressure, thereby obtaining 24.9 g (0.119 mol; yield: 43.8%) of N-tert-butyl-6-hydroxyhexahydro-2-oxo-3,5-methano-4H-cyclopenta[2.3-b]pyrrole having the following physical properties.

$^1$H-NMR (270 MHz, CDCl$_3$, TMS, ppm) δ: 3.63 (1H, s), 3.55 (1H, m), 2.85 (1H, m), 2.44 (1H, br), 2.35 (1H, m), 2.25 (1H, m), 2.00-1.78 (2H, m), 1.42 (9H, s), 1.50-1.35 (2H, m).

[Chemical Formula 81]

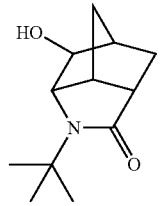

(D)-1

Synthesis Example 1 for Component (A) Monomer

Synthesis of Compound (2)

A compound (2) used in the synthesis examples 1 and 2 for component (A) described later was synthesized as follows.

300 ml of a THF solution containing 20 g (105.14 mmol) of an alcohol (2), 30.23 g (157.71 mmol) of ethyldiisopropylaminocarbodiimide (EDCI) hydrochloride and 0.6 g (5 mmol) of dimethylaminopyridine (DMAP) was added to a 500 ml three-necked flask in nitrogen atmosphere, and 16.67 g (115.66 mmol) of a precursor (2) was added thereto while cooling with ice (0° C.), followed by stirring at room temperature for 12 hours.

After conducting thin-layer chromatography (TLC) to confirm that the raw materials had been consumed, 50 ml of water was added to stop the reaction. Then, the reaction solvent was concentrated under reduced pressure, and extraction was conducted three times with ethyl acetate. The obtained organic layer was washed with water, saturated sodium bicarbonate solution and 1N—HCl aq., in this order. Thereafter, the solvent was distilled off under reduced pressure, and the resulting product was dried, thereby obtaining the compound (2).

The results of instrumental analysis of the obtained compound (2) were as follows.

$^1$H-NMR (CDCl$_3$, 400 MHz): δ (ppm)=6.22 (s, 1H, H$^a$), 5.70 (s, 1H, H$^b$), 4.71-4.85 (m, 2H, H$^{c,d}$), 4.67 (s, 2H, H$^k$), 3.40-3.60 (m, 2H, H$^{e,f}$), 2.58-2.70 (m, 1H, H$^g$), 2.11-2.21 (m, 2H, H$^h$), 2.00 (s, 3H, H$^i$), 1.76-2.09 (m, 2H, H$^j$)

[Chemical Formula 82]

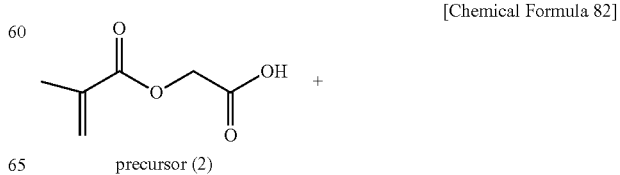

precursor (2)

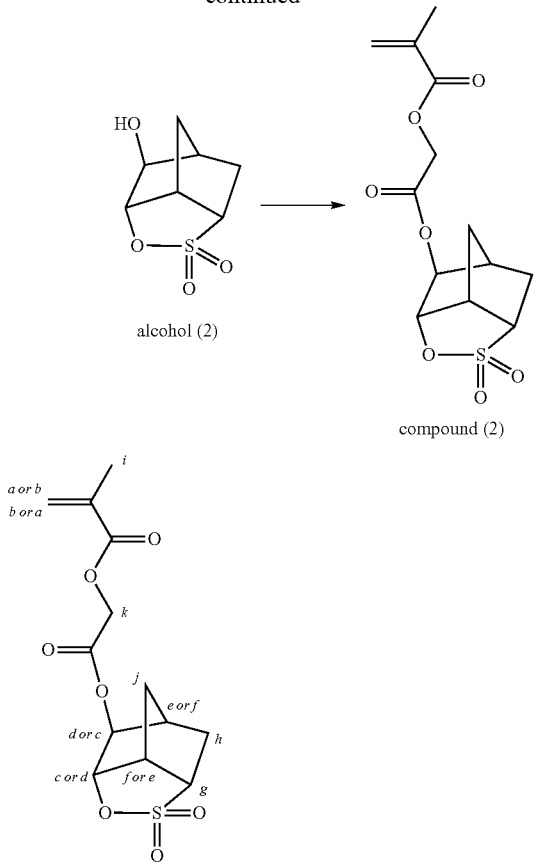

alcohol (2)

compound (2)

Synthesis Example 2 for Component (A) Monomer

Synthesis of Compound (6)

A compound (6) used in the synthesis example 2 for component (A) described later was synthesized as follows.

37.6 g (494 mmol) of glycolic acid, 700 mL of DMF, 86.5 g (626 mmol) of potassium carbonate, and 28.3 g (170 mmol) of potassium iodide were added to a 2 L three-necked flask equipped with a thermometer, a cooling pipe, and a stirrer, followed by stirring at room temperature for 30 minutes. Then, 300 ml of a dimethylformamide solution containing 100 g (412 mmol) of 2-methyl-2-adamantyl chloroacetate was gradually added thereto. The resultant was heated to 40° C., and stirred for 4 hours. Following completion of the reaction, 2,000 ml of diethyl ether was added to the reaction mixture, followed by filtration. The resulting solution was washed with 500 ml of distilled water three times. Then, crystallization was conducted using a mixed solution containing 300 ml of toluene and 200 ml of heptane, thereby obtaining 78 g of an objective compound (2-(2-(2-methyl-2-adamantyloxy)-2-oxoethoxy)-2-oxoethanol) in the form of a colorless solid (yield: 67%, GC purity: 99%).

The results of instrumental analysis of the obtained compound were as follows.

$^1$H-NMR: 1.59 (d, 2H, J=12.5 Hz), 1.64 (s, 3H), 1.71-1.99 (m, 10H), 2.29 (m, 2H), 2.63 (t, 1H, J=5.2 Hz), 4.29 (d, 2H, J=5.2 Hz), 4.67 (s, 2H)

$^{13}$C-NMR: 22.35, 26.56, 27.26, 32.97, 34.54, 36.29, 38.05, 60.54, 61.50, 89.87, 165.97, 172.81

GC-MS: 282 (M+, 0.02%), 165 (0.09%), 149 (40%), 148 (100%), 133 (22%), 117 (2.57%), 89 (0.40%)

From the results above, it was confirmed that the obtained compound was 2-(2-(2-methyl-2-adamantyloxy)-2-oxoethoxy)-2-oxoethanol.

Subsequently, 165 g (584 mmol) of 2-(2-(2-methyl-2-adamantyloxy)-2-oxoethoxy)-2-oxoethanol, 2,000 ml of THF, 105 ml (754 mmol) of triethylamine, and 0.165 g (1,000 ppm) of p-methoxyphenol were added to and dissolved in a 2 L three-necked flask equipped with a thermometer, a cooling pipe, and a stirrer. Following completion of the dissolution, 62.7 ml (648 mmol) of methacryloyl chloride was gradually added thereto while cooling in an ice bath. The temperature of the resultant was elevated to room temperature, and the resultant was stirred for 3 hours. Following completion of the reaction, 1,000 ml of diethyl ether was added thereto, followed by washing with 200 ml of distilled water 5 times. Thereafter, the extraction liquid was concentrated, thereby obtaining 198 g of an objective compound (compound (6)) in the form of a colorless liquid (yield: 97%, GC purity: 99%).

The results of instrumental analysis of the obtained compound (6) were as follows.

$^1$H-NMR: 1.58 (d, J=12.5 Hz, 2H), 1.63 (s, 3H), 1.71-1.89 (m, 8H), 1.98 (s, 3H), 2.00 (m, 2H), 2.30 (m, 2H), 4.62 (s, 2H), 4.80 (s, 2H), 5.66 (m, 1H), 6.23 (m, 1 H)

$^{13}$C-NMR: 18.04, 22.15, 26.42, 27.14, 32.82, 34.38, 36.11, 37.92, 60.44, 61.28, 89.42, 126.79, 135.18, 165.61, 166.30, 167.20

GC-MS: 350 (M+, 1.4%), 206 (0.13%), 149 (47%), 148 (100%), 133 (20%), 69 (37%)

Synthesis Example 1 for Component (A)

Synthesis of Polymeric Compound (A)-1

In a three-necked flask equipped with a thermometer and a reflux tube, 11.77 g (69.23 mmol) of a compound (1), 15.00 g (47.47 mmol) of a compound (2), 16.58 g (63.29 mmol) of a compound (3), 4.65 g (27.69 mmol) of a compound (4) and 3.27 g (13.85 mmol) of a compound (5) were dissolved in 76.91 g of methyl ethyl ketone (MEK) to obtain a solution. Then, 22.1 mmol of dimethyl azobis(isobutyrate) (product name: V-601) was added and dissolved in the obtained solution. The resultant was dropwise added to 42.72 g of MEK heated to 78° C. in a nitrogen atmosphere over a period of 3 hours. Following completion of the dropwise addition, the reaction solution was heated for 4 hours while stirring, and then cooled to room temperature. The obtained reaction polymer solution was dropwise added to an excess amount of normal (n-) heptane, and an operation to deposit a polymer was conducted. Thereafter, the precipitated white powder was separated by filtration, followed by washing with an n-heptane/isopropylalcohol mixed solvent and drying, thereby obtaining 41 g of a polymeric compound (A)-1 as an objective compound.

With respect to the obtained polymeric compound (A)-1, the weight average molecular weight (Mw) and the dispersity (Mw/Mn) were determined by the polystyrene equivalent value as measured by gel permeation chromatography (GPC). As a result, it was found that the weight average molecular weight was 6.600, and the dispersity was 1.69. Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was l/m/n/o/p=35/22/18/13/12.

[Chemical Formula 83]

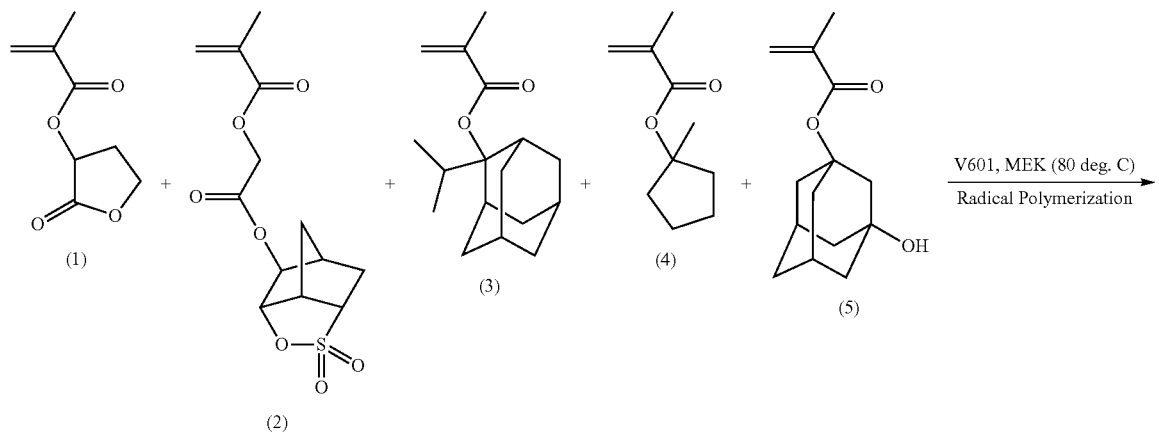

polymeric compound (A)-1

Synthesis Example 2 for Component (A)

Synthesis of Polymeric Compound (A)-2

A polymeric compound (A)-2 was synthesized in the same manner as in the above-mentioned section [Synthesis Example 1 for Component (A): (synthesis of polymeric compound (A)-1)], except that the following monomer for deriving a structural unit that constitutes the polymeric compound (A)-2 was used with the predetermined molar ratio. With respect to the obtained polymeric compound (A)-2, the weight average molecular weight (Mw) and the dispersity (Mw/Mn) were determined by the polystyrene equivalent value as measured by gel permeation chromatography (GPC). As a result, it was found that the weight average molecular weight was 8.300, and the dispersity was 1.66. Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was l/m/n/o=35/11/43/11.

[Chemical Formula 84]

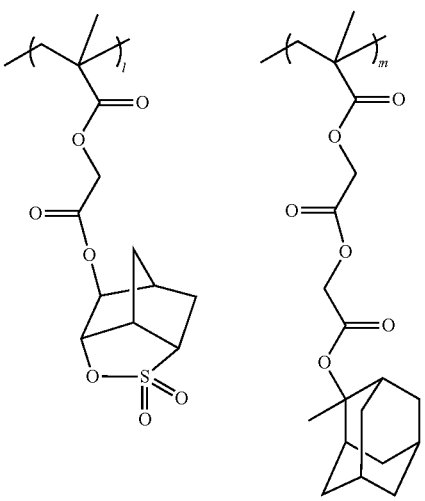

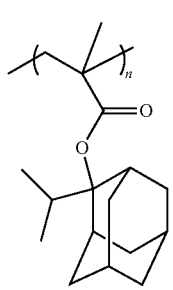

polymeric compound (A)-2

Synthesis Example 1 for Component (C)

Synthesis of Polymeric Compound (C)-1

15.00 g (54.32 mmol) of a compound (c1) and 5.21 g (23.28 mmol) of a compound (c2) were added to a three-necked flask equipped with a thermometer and a reflux tube and were dissolved by adding 114.52 g of THF thereto. Then, 4.66 mmol of dimethyl azobis(isobutyrate) (V-601) was added as a polymerization initiator and dissolved in the obtained solution. The obtained reaction solution was stirred while heating at 80° C. for 6 hours in a nitrogen atmosphere, and was then cooled to room temperature. The resulting polymer solution was concentrated under reduced pressure, and dropwise added to an excess amount of n-heptane to thereby precipitate a polymer. Then, the precipitated polymer was separated by filtration, followed by washing and drying, thereby obtaining 5.6 g of a fluorine-containing polymeric compound (C)-1 as an objective compound.

With respect to the obtained fluorine-containing polymeric compound (C)-1, the weight average molecular weight (Mw) and the dispersity (Mw/Mn) were determined by the polystyrene equivalent value as measured by gel permeation chromatography (GPC). As a result, it was found that the weight average molecular weight (Mw) was 25.000, and the dispersity (Mw/Mn) was 1.5. Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was l/m=80/20.

[Chemical Formula 85]

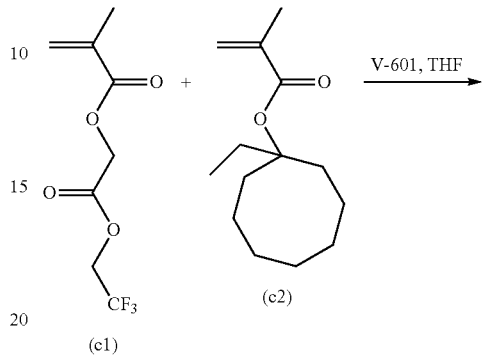

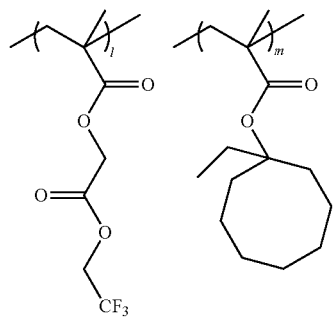

polymeric compound (C)-1

Examples 1 to 5, Comparative Examples 1 to 4

The components shown in Table 1 were mixed together and dissolved to prepare a series of positive resist compositions.

TABLE 1

|  | Component (A) | Component (B) | | Component (D) | Component (C) | Component (E) | Component (S) | |
| --- | --- | --- | --- | --- | --- | --- | --- | --- |
| Ex. 1 | (A)-1 | (B)-1 | (B)-2 | (D)-1 | (C)-1 | (E)-1 | (S)-1 | (S)-2 |
|  | [100] | [6.7] | [2.6] | [0.55] | [3.0] | [0.75] | [10.0] | [2,800] |
| Ex. 2 | (A)-1 | (B)-3 | (B)-2 | (D)-1 | (C)-1 | (E)-1 | (S)-1 | (S)-2 |
|  | [100] | [6.4] | [2.6] | [0.55] | [3.0] | [0.75] | [10.0] | [2,800] |
| Ex. 3 | (A)-1 | (B)-4 | (B)-2 | (D)-1 | (C)-1 | (E)-1 | (S)-1 | (S)-2 |
|  | [100] | [11.0] | [2.6] | [0.55] | [3.0] | [0.75] | [10.0] | [2,800] |
| Ex. 4 | (A)-1 | (B)-1 | (B)-2 | (D)-1 | (C)-2 | (E)-1 | (S)-1 | (S)-2 |
|  | [100] | [6.7] | [2.6] | [0.55] | [1.5] | [0.75] | [10.0] | [2,800] |
| Ex. 5 | (A)-1 | (B)-1 | (B)-2 | (D)-1 | (C)-3 | (E)-1 | (S)-1 | (S)-2 |
|  | [100] | [6.7] | [2.6] | [0.55] | [3.0] | [0.75] | [10.0] | [2,800] |
| Comp. Ex. 1 | (A)-1 | (B)-1 | (B)-2 | — | (C)-1 | (E)-1 | (S)-1 | (S)-2 |
|  | [100] | [6.7] | [2.6] |  | [3.0] | [0.75] | [10.0] | [2,800] |
| Comp. Ex. 2 | (A)-1 | (B)-1 | (B)-2 | (D)-2 | (C)-1 | (E)-1 | (S)-1 | (S)-2 |
|  | [100] | [6.7] | [2.6] | [0.60] | [3.0] | [0.75] | [10.0] | [2,800] |
| Comp. Ex. 3 | (A)-1 | (B)-1 | (B)-2 | (D)-3 | (C)-1 | (E)-1 | (S)-1 | (S)-2 |
|  | [100] | [6.7] | [2.6] | [0.39] | [3.0] | [0.75] | [10.0] | [2,800] |
| Comp. Ex. 4 | (A)-1 | (B)-1 | (B)-2 | (D)-4 | (C)-1 | (E)-1 | (S)-1 | (S)-2 |
|  | [100] | [6.7] | [2.6] | [0.53] | [3.0] | [0.75] | [10.0] | [2,800] |

In Table 1, the numerical values in brackets [ ] indicate the amount (in parts by weight) of the component added. Further, the reference symbols in Table 1 have the meanings shown below.

(A)-1: the aforementioned polymeric compound (A)-1

(B)-1: a compound represented by chemical formula (B)-1 shown below (B)-2: a compound represented by chemical formula (B)-2 shown below (B)-3: a compound represented by chemical formula (B)-3 shown below (B)-4: a compound represented by chemical formula (B)-4 shown below (D)-1: the aforementioned compound (D)-1

(D)-2: tri-n-pentylamine (D)-3: triethanolamine (D)-4: a compound represented by chemical formula (D)-4 shown below (C)-1: the aforementioned polymeric compound (C)-1

(C)-2: a polymeric compound represented by chemical formula (C)-2 shown below (synthesized by a method described in Japanese Unexamined Patent Application, First Publication No. 2008-134607; Mw=8,000; Mw/Mn=1.47)

(C)-3: a polymeric compound represented by chemical formula (C)-3 shown below (Mw=8,600; Mw/Mn=1.39; compositional ratio f1:f2=54.2:45.8 (molar ratio))

(E)-1: salicylic acid (S)-1: γ-butyrolactone (S)-2: a mixed solvent of PGMEA/PGME/cyclohexanone=45/30/25 (weight ratio)

[Chemical Formula 86]

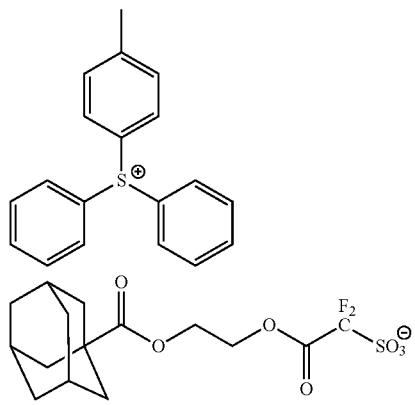

(B)-1

[Chemical Formula 87]

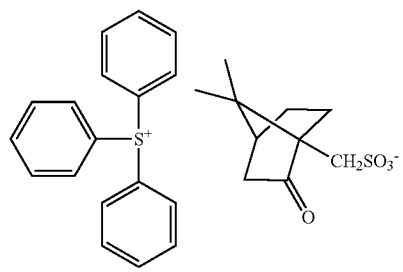

(B)-2

[Chemical Formula 88]

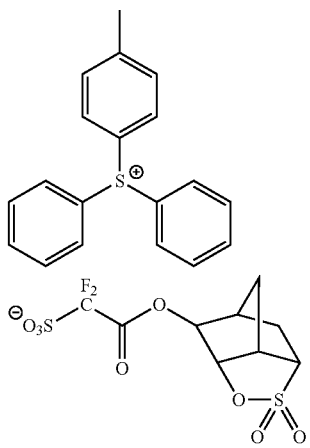

(B)-3

[Chemical Formula 89]

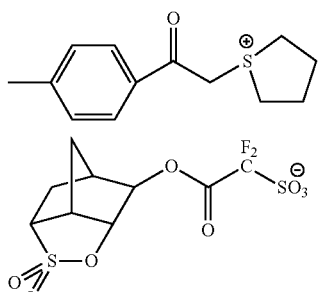

(B)-4

[Chemical Formula 90]

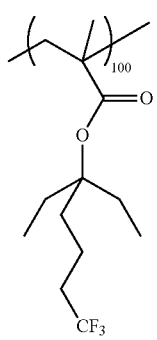

(C)-2

[Chemical Formula 91]

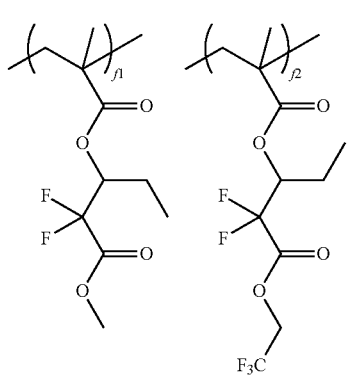

(C)-3

[Chemical Formula 92]

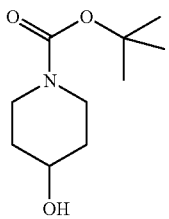

(D)-4

<Formation of Resist Pattern 1>[Sensitivity]

An organic anti-reflection film composition (product name: ARC95, manufactured by Brewer Science Ltd.) was applied onto an 12-inch silicon wafer using a spinner, and the composition was then baked and dried on a hotplate at 205° C. for 60 seconds, thereby forming an organic anti-reflection film having a film thickness of 90 nm.

Then, each of the resist compositions prepared in Examples 1 to 5 and Comparative Examples 1 to 4 and described above in Table 1 was applied onto the anti-reflection film using a spinner, and was then prebaked (PAB) on a hotplate at 120° C. for 60 seconds and dried, thereby forming a resist film having a film thickness of 100 nm.

Subsequently, using an ArF exposure apparatus for immersion lithography (product name: NSR-S609B, manufactured by Nikon Corporation, NA (numerical aperture)=1.07, Cross pole, immersion medium: water), the resist film was selectively irradiated with an ArF excimer laser (193 nm) through a mask pattern. Thereafter, a post exposure bake (PEB) treatment was conducted at 95° C. for 60 seconds, followed by development for 10 seconds at 23° C. in a 2.38% by weight aqueous solution of tetramethylammonium hydroxide (TMAH). Then, the resist film was rinsed for 30 seconds with pure water, followed by drying by shaking.

As a result, in each of the examples, a 1:1 line and space (L/S) pattern with a line width of 50 nm was obtained. The optimum exposure dose Eop (mJ/cm$^2$; sensitivity) for forming the L/S pattern was determined. The results are shown in Table 2.

[Evaluation of Line Width Roughness (LWR)]

For each of the 1:1 L/S patterns formed at the Eop value described above, the line width was measured at 50 points along the lengthwise direction of the line using a measuring scanning electron microscope (SEM) (acceleration voltage: 300V, product name: S-9380, manufactured by Hitachi, Ltd.), and from these results, the value of 3 times the standard deviation (s) (namely, 3s) was calculated as an indicator of the LWR. The smaller the value of 3s, the lower the level of roughness in the line width, indicating an L/S pattern of more uniform width. The results are shown in Table 2.

[Evaluation of Shape]

The cross-sectional shape of each of the 1:1 L/S patterns formed at the Eop value described above was observed using a scanning electron microscope (product name: S-4700, manufactured by Hitachi, Ltd.) and evaluated with the following criteria. The results are shown in Table 2.

○: The line side walls were perpendicular with respect to the substrate surface at the interfacial portion with the substrate, thereby exhibiting a high level of rectangularity Δ: The pattern had a T-top shape, thereby exhibiting a low level of rectangularity

TABLE 2

|   | Eop (mJ/cm$^2$) | LWR (nm) | Shape |
| --- | --- | --- | --- |
| Example 1 | 31 | 5.56 | ○ |
| Example 2 | 39 | 6.02 | ○ |
| Example 3 | 44 | 5.45 | ○ |
| Example 4 | 32 | 5.60 | ○ |
| Example 5 | 32 | 5.51 | ○ |
| Comparative Example 1 | 12 | 8.76 | Δ |
| Comparative Example 2 | 38 | 5.62 | Δ |
| Comparative Example 3 | 42 | 6.90 | Δ |
| Comparative Example 4 | 56 | 6.71 | ○ |

From the results shown above, it was confirmed that the resist compositions according to the present invention from Examples 1 to 5, as compared to those obtained in Comparative Examples 1 to 4, exhibited a more favorable pattern shape, with superior LWR and a high degree of rectangularity.

Examples 6 to 11, Comparative Examples 5 to 8

The components shown in Table 3 were mixed together and dissolved to prepare a series of positive resist compositions.

TABLE 3

|   | Component (A) | Component (B) |   | Component (D) | Component (C) | Component (E) | Component (S) |   |
| --- | --- | --- | --- | --- | --- | --- | --- | --- |
| Ex. 6 | (A)-2 | (B)-3 | (B)-2 | (D)-1 | (C)-1 | (E)-1 | (S)-1 | (S)-3 |
|   | [100] | [8.3] | [1.3] | [0.23] | [3.0] | [0.5] | [10.0] | [2,900] |
| Ex. 7 | (A)-2 | (B)-5 | (B)-2 | (D)-1 | (C)-1 | (E)-1 | (S)-1 | (S)-3 |
|   | [100] | [8.0] | [2.6] | [0.23] | [3.0] | [0.5] | [10.0] | [2,900] |
| Ex. 8 | (A)-2 | (B)-6 | (B)-2 | (D)-1 | (C)-1 | (E)-1 | (S)-1 | (S)-3 |
|   | [100] | [7.8] | [1.3] | [0.23] | [3.0] | [0.5] | [10.0] | [2,900] |
| Ex. 9 | (A)-2 | (B)-4 | — | (D)-1 | (C)-1 | (E)-1 | (S)-1 | (S)-3 |
|   | [100] | [15.0] |   | [0.23] | [3.0] | [0.5] | [10.0] | [2,900] |
| Ex. 10 | (A)-2 | (B)-3 | (B)-2 | (D)-1 | (C)-2 | (E)-1 | (S)-1 | (S)-3 |
|   | [100] | [8.3] | [1.3] | [0.23] | [1.5] | [0.5] | [10.0] | [2,900] |
| Ex. 11 | (A)-2 | (B)-3 | (B)-2 | (D)-1 | (C)-3 | (E)-1 | (S)-1 | (S)-3 |
|   | [100] | [8.3] | [1.3] | [0.23] | [3.0] | [0.5] | [10.0] | [2,900] |
| Comp. Ex. 5 | (A)-2 | (B)-3 | (B)-2 | — | (C)-1 | (E)-1 | (S)-1 | (S)-3 |
|   | [100] | [8.3] | [1.3] |   | [3.0] | [0.5] | [10.0] | [2,900] |
| Comp. Ex. 6 | (A)-2 | (B)-3 | (B)-2 | (D)-2 | (C)-1 | (E)-1 | (S)-1 | (S)-3 |
|   | [100] | [8.3] | [1.3] | [0.25] | [3.0] | [0.5] | [10.0] | [2,900] |
| Comp. Ex. 7 | (A)-2 | (B)-3 | (B)-2 | (D)-3 | (C)-1 | (E)-1 | (S)-1 | (S)-3 |
|   | [100] | [8.3] | [1.3] | [0.16] | [3.0] | [0.5] | [10.0] | [2,900] |
| Comp. Ex. 8 | (A)-2 | (B)-3 | (B)-2 | (D)-4 | (C)-1 | (E)-1 | (S)-1 | (S)-3 |
|   | [100] | [8.3] | [1.3] | [0.22] | [3.0] | [0.5] | [10.0] | [2,900] |

In Table 3, the numerical values in brackets [ ] indicate the amount (in parts by weight) of the component added. Further, among the reference symbols in Table 3, (B)-2 to (B)-4, (D)-1 to (D)-4, (C)-1 to (C)-3, (E)-1 and (S)-1 are the same as defined above, and other symbols have the meanings shown below.

(A)-2: the aforementioned polymeric compound (A)-2
(B)-5: a compound represented by chemical formula (B)-5 shown below
(B)-6: a compound represented by chemical formula (B)-6 shown below
(S)-3: a mixed solvent of PGMEA/PGME=60/40 (weight ratio)

[Chemical Formula 93]

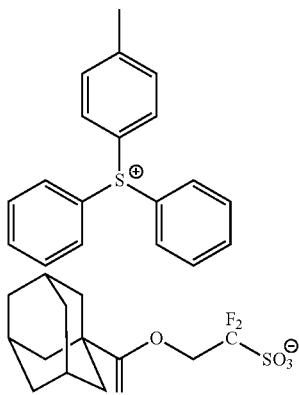

(B)-5

[Chemical Formula 94]

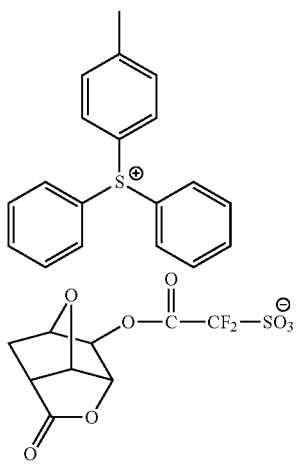

(B)-6

<Formation of Resist Pattern 2>
[Sensitivity]

An organic anti-reflection film composition (product name: ARC29A, manufactured by Brewer Science Ltd.) was applied onto an 12-inch silicon wafer using a spinner, and the composition was then baked and dried on a hotplate at 205° C. for 60 seconds, thereby forming an organic anti-reflection film having a film thickness of 89 nm.

Then, each of the resist compositions prepared in Examples 6 to 11 and Comparative Examples 5 to 8 and described above in Table 3 was applied onto the anti-reflection film using a spinner, and was then prebaked (PAB) on a hotplate at 90° C. for 60 seconds and dried, thereby forming a resist film having a film thickness of 100 nm.

Subsequently, using an ArF exposure apparatus for immersion lithography (product name: NSR-S609B, manufactured by Nikon Corporation, NA (numerical aperture)=1.07, Conventional (0.97) w/o POLANO, immersion medium: water), the resist film was selectively irradiated with an ArF excimer laser (193 nm) through a mask pattern. Thereafter, a post exposure bake (PEB) treatment was conducted at 80° C. for 60 seconds, followed by development for 20 seconds at 23° C. in a 2.38% by weight aqueous solution of tetramethylammonium hydroxide (TMAH). Then, the resist film was rinsed for 30 seconds with pure water, followed by drying by shaking.

As a result, in each of the examples, a dense contact hole pattern (CH pattern) in which holes having a hole diameter of 90 nm were equally spaced (pitch: 140 nm) was formed. The optimum exposure dose Eop (mJ/cm$^2$; sensitivity) for forming the CH pattern was determined. The results are shown in Table 4.

[Evaluation of CDU]

For each of the CH patterns formed at the Eop value described above, the contact-hole diameters (CD) of 100 holes were measured in each CH pattern, and from these results, the value of 3 times the standard deviation (s) (namely, 3s) was calculated as an indicator of the CD uniformity (CDU). The smaller the value of 3s, the higher the level of CD uniformity of the holes. The results are shown in Table 4.

[Evaluation of Circularity]

Each of the CH patterns formed at the Eop value described above was observed from the upper side thereof using a measuring SEM (product name: S-9380, manufactured by Hitachi, Ltd.), and with respect to 100 holes in each CH pattern, the distances from the center of the hole to the outer periphery thereof in 24 directions were measured. From the results, the value of 3 times the standard deviation (s) (namely, 3s) was calculated. The smaller the value of 3s, the higher the level of circularity of the holes. The results are shown in Table 4.

TABLE 4

|  | Eop (mJ/cm$^2$) | CDU (nm) | Circularity |
|---|---|---|---|
| Example 6 | 38 | 6.6 | 6.5 |
| Example 7 | 34 | 6.0 | 5.9 |
| Example 8 | 35 | 6.7 | 6.4 |
| Example 9 | 51 | 7.5 | 6.9 |
| Example 10 | 39 | 6.5 | 6.4 |
| Example 11 | 38 | 6.8 | 6.6 |
| Comparative Example 5 | 19 | 8.9 | 9.2 |
| Comparative Example 6 | 41 | 7.5 | 7.7 |
| Comparative Example 7 | 44 | 7.9 | 8.1 |
| Comparative Example 8 | 55 | 8.0 | 7.8 |

From the results shown above, it was confirmed that the resist compositions according to the present invention from Examples 6 to 11, as compared to those obtained in Comparative Examples 5 to 8, exhibited a more favorable pattern shape, with superior CDU and a high level of circularity.

What is claimed is:
1. A resist composition comprising:
a base material component (A) that exhibits changed solubility in an alkali developing solution under the action of acid;
an acid generator component (B) that generates acid upon exposure; and
an nitrogen-containing organic compound (D), wherein said nitrogen-containing organic compound (D) includes a compound represented by general formula (d1) shown below:

[Chemical Formula 1]

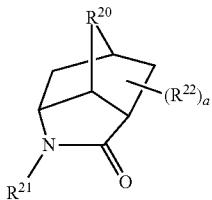

(d1)

wherein $R^{20}$ represents a methylene group, an ethylene group, an oxygen atom or $-C(CH_3)_2-$; $R^{21}$ represents a hydrogen atom or an organic group; and $R^{22}$ represents an alkoxy group, an alkoxycarbonyloxy group, a hydroxyl group, a halogen atom, $-C(=O)-O-R^{23}$, $-C(=O)-NH-R^{23}$ or a carboxyl group, wherein $R^{23}$ represents a linear or branched alkyl group of 1 to 15 carbon atoms, an unsaturated hydrocarbon group, an aliphatic cyclic group, or an aromatic hydrocarbon group, and a represents an integer of 0 to 2.

2. The resist composition according to claim 1, wherein said nitrogen-containing organic compound (D) is a compound represented by general formula (d1-1) shown below:

[Chemical Formula 2]

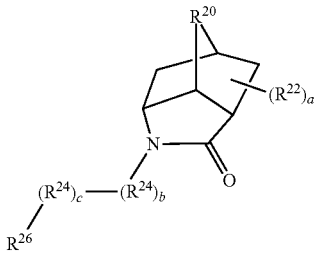

(d1-1)

wherein $R^{20}$, $R^{22}$ and a are the same as defined above; $R^{24}$ represents an alkylene group of 1 to 5 carbon atoms which may have a substituent; b represents either 0 or 1; $R^{25}$ represents $-(C=O)-$, $-SO_2-$, $-SO_3-$ or $-C(=O)-O-$; c represents either 0 or 1; $R^{26}$ represents a hydrogen atom, a linear or branched alkyl group of 1 to 15 carbon atoms which may have a substituent, an aliphatic cyclic group which may have a substituent, an aromatic hydrocarbon group which may have a substituent, or a vinyl group or allyl group which may contain an ether bond.

3. The resist composition according to claim 1, wherein said base material component (A) is a base material component that exhibits increased solubility in an alkali developing solution under action of acid.

4. The resist composition according to claim 3, wherein said base material component (A) includes a resin component (A1) having a structural unit (a1) derived from an acrylate ester containing an acid dissociable, dissolution inhibiting group.

5. The resist composition according to claim 4, wherein said resin component (A1) further has a structural unit (a2) derived from an acrylate ester containing a lactone-containing cyclic group.

6. The resist composition according to claim 4, wherein said resin component (A1) further has a structural unit (a3) derived from an acrylate ester containing a polar group-containing aliphatic hydrocarbon group.

7. A method of forming a resist pattern, comprising:

applying a resist composition of claim 1 onto a substrate to form a resist film;

subjecting said resist film to exposure; and subjecting said resist film to alkali developing to form a resist pattern.

\* \* \* \* \*

UNITED STATES PATENT AND TRADEMARK OFFICE
CERTIFICATE OF CORRECTION

PATENT NO.        : 8,252,509 B2
APPLICATION NO.   : 12/861474
DATED             : August 28, 2012
INVENTOR(S)       : Yoshiyuki Utsumi et al.

It is certified that error appears in the above-identified patent and that said Letters Patent is hereby corrected as shown below:

In Column 4, Lines 9-10, Change "sub stituent" to --substituent--.

In Column 8, Line 9, Change "sub stituent." to --substituent.--.

In Column 8, Line 9, Change "sub stituents" to --substituents--.

In Column 36, Line 25 (Approx.), Change "(31-3-31)" to --(a1-3-31)--.

In Column 39, Lines 1-20

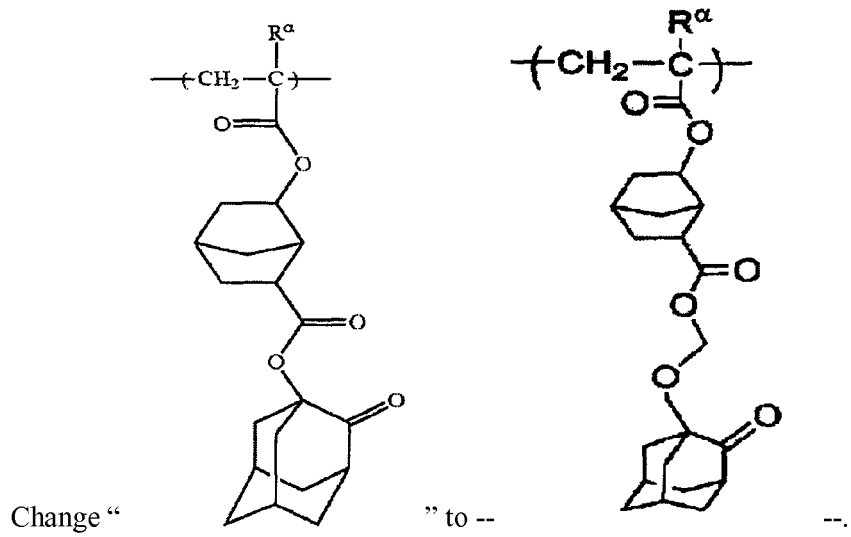

Change " " to -- --.

In Column 71, Line 57, Change "sub stituents" to --substituents--.

In Column 73, Line 53, Change "X0," to --$X^0$,--.

Signed and Sealed this
Nineteenth Day of February, 2013

Teresa Stanek Rea
*Acting Director of the United States Patent and Trademark Office*

In Column 84, Line 26, Change "(—C(=O)—O),"  to --(—C(=O)—O—),--.

In Column 85, Line 29, Change "sub stituent" to --substituent--.

In Column 85, Line 37, Change "sub stituent" to --substituent--.

In Column 85, Line 61, Change "sub stituent" to --substituent--.

In Column 87, Line 16, Change "sub stituent" to --substituent--.

In Column 87, Line 27, Change "cyclic" to --cyclic groups--.

In Column 88, Line 40, Change "sub stituent." to --substituent.--.

In Column 88, Lines 40-41, Change "sub stituent" to --substituent--.

In Column 89, Line 7, Change "sub stituent)." to --substituent).--.

In Column 89, Line 21, Change "—C(CF$_3$)CF$_2$CF$_3$)—;" to -- —C(CF$_3$)(CF$_2$CF$_3$)—;--.

In Column 89, Line 22, Change "—CH2CF$_2$CF$_2$—" to -- —CH$_2$CF$_2$CF$_2$—,--.

In Column 89, Line 27, Change "—CH(CH$_3$)CH$_2$—;" to -- —CH(CH$_3$)CH$_2$—,--.

In Column 95, Line 55, Change "sub stituent" to --substituent--.

In Column 95, Line 59, Change "sub stituent" to --substituent--.

In Column 99, Line 22, Change "sub stituent(s)" to --substituent(s)--.

In Column 100, Lines 29-30 (Approx.), Change "sub stituent" to --substituent--.

In Column 100, Line 33 (Approx.), Change "sub stituent(s)" to --substituent(s)--.

In Column 100, Line 62, Change "sub stituent" to --substituent--.

In Column 101, Line 41, Change "sub stituent;" to --substituent;--.

In Column 101, Line 45, Change "sub stituent," to --substituent,--.

In Column 101, Line 63, Change "—C(CH$_2$CH$_3$)CH$_2$—" to -- —C(CH$_2$CH$_3$)$_2$— --.

In Column 102, Line 10, Change "sub stituent," to --substituent,--.

In Column 102, Line 11, Change "sub stituent," to --substituent,--.

In Column 102, Line 21, Change "sub stituent" to --substituent--.

In Column 102, Lines 29-30, Change "sub stituent" to --substituent--.

CERTIFICATE OF CORRECTION (continued)
U.S. Pat. No. 8,252,509 B2

In Column 112, Line 13, Change "sub stituent" to --substituent--.

In Column 114, Line 4, Change "the or" to --or the--.

In Column 114, Line 6, Change "or the or" to --or the--.

In Column 114, Line 35, Change "the or" to --or the--.

In Column 128, Line 42, Change "(c 11-1-1)" to --(c11-1-1)--.

In Column 128, Line 42, Change "(c 11-1-5)," to --(c11-1-5),--.

In Column 128, Line 42, Change "(c 11-2-1)" to --(c11-2-1)--.

In Column 128, Line 43, Change "(c 11-2-2)," to --(c11-2-2),--.

In Column 134, Line 2, Change "re bonded" to --are bonded--.